US012748352B2

(12) United States Patent
Peter et al.

(10) Patent No.: US 12,748,352 B2
(45) Date of Patent: Sep. 29, 2026

(54) CONTROL OF METALLIC CONTAMINATION FROM METAL-CONTAINING PHOTORESIST

(71) Applicant: Lam Research Corporation, Fremont, CA (US)

(72) Inventors: Daniel Peter, Sunnyvale, CA (US); Samantha SiamHwa Tan, Newark, CA (US); Jengyi Yu, San Ramon, CA (US); Da Li, Newark, CA (US); Meng Xue, San Jose, CA (US); Wook Choi, San Jose, CA (US); Ji Yeon Kim, Fremont, CA (US); Alan J. Jensen, Mountain House, CA (US); Shahd Hassan Labib, San Jose, CA (US); Younghee Lee, Pleasanton, CA (US); Hongxiang Zhao, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/550,733

(22) PCT Filed: Mar. 31, 2022

(86) PCT No.: PCT/US2022/022790

§ 371 (c)(1),
(2) Date: Sep. 15, 2023

(87) PCT Pub. No.: WO2022/212681

PCT Pub. Date: Oct. 6, 2022

(65) Prior Publication Data

US 2024/0036474 A1 Feb. 1, 2024

Related U.S. Application Data

(60) Provisional application No. 63/200,921, filed on Apr. 2, 2021.

(51) Int. Cl.
*G03F 7/40* (2006.01)
*G03F 7/00* (2006.01)
*G03F 7/36* (2006.01)

(52) U.S. Cl.
CPC .............. *G03F 7/40* (2013.01); *G03F 7/0002* (2013.01); *G03F 7/36* (2013.01)

(58) Field of Classification Search
CPC . G03F 7/40; G03F 7/0002; G03F 7/36; G03F 7/423; G03F 7/0042; G03F 7/30;
(Continued)

(56) References Cited

U.S. PATENT DOCUMENTS 3,954,468 A 5/1976 Lewis et al.
3,961,961 A 6/1976 Rich
(Continued)

FOREIGN PATENT DOCUMENTS

CN 1495861 A 5/2004
CN 1841201 A 10/2006
(Continued)

OTHER PUBLICATIONS

International Search Report and Written Opinion mailed on Jul. 22, 2022, in PCT Application No. PCT/US2022/022790.
(Continued)

*Primary Examiner* — Alexander Markoff
(74) *Attorney, Agent, or Firm* — Weaver Austin Villeneuve & Sampson LLP

(57) ABSTRACT

Various techniques for controlling metal-containing contamination on a semiconductor substrate are provided herein. Such techniques may involve one or more of a post-development bake treatment, a chemical treatment, a plasma treatment, a light treatment, and a backside and bevel edge clean. The techniques may be combined as desired for a particular application. In many cases, the techniques are
(Continued)

used to address metal-containing contamination that is generated during a photoresist development operation.

49 Claims, 21 Drawing Sheets

(58) Field of Classification Search
CPC ... G03F 7/16; H01J 37/3244; H01J 37/32715; H01J 37/32853; H01J 37/32862; H01J 37/32357; H01J 37/32724; H01L 21/02087; H01L 21/0209; H01L 21/0274; H01L 21/6715
See application file for complete search history.

(56) References Cited

U.S. PATENT DOCUMENTS 4,314,022 A 2/1982 Fisch
4,806,456 A 2/1989 Katoh
4,814,243 A 3/1989 Ziger
4,842,989 A 6/1989 Taniguchi et al.
5,108,875 A 4/1992 Thackeray et al.
5,798,203 A 8/1998 Haraguchi et al.
5,925,494 A 7/1999 Horn
6,179,922 B1 1/2001 Ishikawa et al.
6,183,934 B1 2/2001 Kawamonzen
6,245,650 B1 6/2001 Watanabe
6,290,779 B1 * 9/2001 Saleh .................. C23C 16/4405 134/1.1
6,350,689 B1 2/2002 Ho et al.
6,566,276 B2 5/2003 Maloney et al.
6,573,030 B1 6/2003 Fairbairn et al.
6,759,351 B2 * 7/2004 Boulenger .............. H10P 50/73 430/311
6,764,946 B1 * 7/2004 Amblard ................. H10P 50/71 257/E21.026
6,841,341 B2 1/2005 Fairbairn et al.
7,223,526 B2 5/2007 Fairbairn et al.
7,232,742 B1 * 6/2007 Maekawa ........... H01L 27/1277 438/491
7,335,462 B2 2/2008 Fairbairn et al.
8,227,182 B2 7/2012 Lee et al.
8,367,303 B2 2/2013 Keller et al.
8,501,395 B2 * 8/2013 Dai ......................... H10P 50/73 430/323
8,518,634 B2 * 8/2013 Yeh ........................... G03F 7/40 430/311
8,826,926 B2 9/2014 Chalom et al.
9,996,004 B2 6/2018 Smith et al.
10,461,229 B1 10/2019 West et al.
11,988,965 B2 5/2024 Tan et al.
12,105,422 B2 10/2024 Tan et al.
12,346,035 B2 * 7/2025 Dictus ....................... G03F 7/36
12,436,464 B2 10/2025 Weidman et al.
12,586,765 B2 3/2026 Yu et al.
12,601,974 B2 4/2026 Weidman et al.
2003/0049571 A1 3/2003 Hallock et al.
2004/0121264 A1 6/2004 Liegl et al.
2004/0191423 A1 9/2004 Ruan et al.
2004/0209201 A1 10/2004 Nakano et al.
2004/0241561 A1 * 12/2004 Chen .................... G01K 11/125 374/E11.018
2005/0250052 A1 11/2005 Nguyen
2006/0001064 A1 1/2006 Hill et al.
2006/0166537 A1 7/2006 Thompson et al.
2007/0017386 A1 1/2007 Kamei
2007/0037357 A1 2/2007 Culp
2008/0004203 A1 1/2008 Scheuing et al.
2008/0145793 A1 6/2008 Patel et al.
2008/0236620 A1 10/2008 Shih et al.
2009/0041650 A1 2/2009 Watanabe et al.
2009/0134119 A1 5/2009 Matsumaru et al.
2009/0197086 A1 8/2009 Rathi et al.
2010/0051446 A1 3/2010 Wang et al.
2010/0075508 A1 3/2010 Seino et al.
2010/0209855 A1 8/2010 Tanaka
2011/0028000 A1 * 2/2011 Rogojina .......... H01L 21/30604 977/773
2011/0174606 A1 7/2011 Funk et al.
2011/0184139 A1 7/2011 Malik et al.
2011/0195362 A1 8/2011 Watanabe et al.
2011/0244402 A1 10/2011 Carcasi et al.
2011/0308942 A1 12/2011 Liu et al.
2012/0088369 A1 4/2012 Weidman et al.
2012/0090547 A1 4/2012 Wang et al.
2012/0208125 A1 8/2012 Hatakeyama
2013/0164691 A1 6/2013 Shiobara
2013/0183609 A1 7/2013 Seon et al.
2013/0224652 A1 8/2013 Bass et al.
2014/0206200 A1 * 7/2014 Nelson .............. H01L 21/02238 438/745
2014/0220495 A1 8/2014 Bozano et al.
2014/0263172 A1 9/2014 Xie et al.
2016/0086864 A1 3/2016 Fischer et al.
2016/0116839 A1 4/2016 Meyers et al.
2016/0216606 A1 7/2016 Meyers et al.
2016/0357103 A1 12/2016 Nagahara et al.
2017/0066225 A1 3/2017 Chen et al.
2017/0084475 A1 * 3/2017 Wagner ............... G03F 7/70775
2017/0092495 A1 3/2017 Chen et al.
2017/0097569 A1 4/2017 Yang et al.
2017/0097570 A1 4/2017 Tagawa
2017/0102612 A1 4/2017 Meyers et al.
2017/0146909 A1 5/2017 Smith et al.
2017/0176858 A1 6/2017 Hirano
2018/0039182 A1 2/2018 Zi et al.
2018/0046086 A1 2/2018 Waller et al.
2018/0096840 A1 4/2018 Jeong et al.
2018/0149976 A1 5/2018 Liu et al.
2018/0164689 A1 6/2018 Sano et al.
2018/0173096 A1 6/2018 Zi et al.
2018/0204727 A1 7/2018 Hee et al.
2018/0233362 A1 8/2018 Glodde et al.
2018/0308687 A1 10/2018 Smith et al.
2018/0314167 A1 11/2018 Chang et al.
2018/0356731 A1 12/2018 Tagawa
2019/0056914 A1 2/2019 Ma et al.
2019/0137870 A1 5/2019 Meyers et al.
2019/0146337 A1 5/2019 Zi et al.
2019/0163056 A1 5/2019 Maes et al.
2019/0163065 A1 5/2019 Hatakeyama et al.
2019/0187556 A1 6/2019 Park et al.
2019/0258160 A1 8/2019 Satoh et al.
2019/0352776 A1 11/2019 Parikh
2020/0041901 A1 2/2020 Namgung et al.
2020/0050109 A1 2/2020 Ho et al.
2020/0066536 A1 2/2020 Yaegashi
2020/0073238 A1 3/2020 Zi et al.
2020/0089104 A1 3/2020 Marks et al.
2020/0096870 A1 3/2020 Ma et al.
2020/0124970 A1 4/2020 Kocsis et al.
2020/0133131 A1 4/2020 Ouyang
2020/0174374 A1 6/2020 Liao et al.
2020/0326627 A1 10/2020 Jiang et al.
2021/0013037 A1 1/2021 Sun et al.
2021/0041784 A1 2/2021 Chen et al.
2021/0063871 A1 3/2021 Kobayashi et al.
2021/0111025 A1 4/2021 Zyulkov et al.
2021/0216016 A1 7/2021 Tagawa
2021/0271170 A1 9/2021 Telecky et al.
2021/0302833 A1 9/2021 Weng et al.
2021/0349390 A1 11/2021 De Schepper et al.
2022/0035247 A1 * 2/2022 Tan ......................... G03F 7/091
2022/0037152 A1 2/2022 Raley et al.
2022/0043334 A1 2/2022 Tan et al.
2022/0163889 A1 5/2022 Chen
2022/0299877 A1 * 9/2022 Weidman ................ G03F 7/168
2022/0308454 A1 9/2022 Weidman et al.
2022/0317572 A1 10/2022 Meijer et al.
2022/0365434 A1 * 11/2022 Nardi ...................... G03F 7/091
2023/0031955 A1 2/2023 Yu et al.
2023/0107357 A1 * 4/2023 Dictus ....................... G03F 7/36 355/30

(56) References Cited

U.S. PATENT DOCUMENTS

| | | | |
|---|---|---|---|
| 2023/0152705 | A1 | 5/2023 | Grzeskowiak et al. |
| 2023/0185196 | A1 | 6/2023 | Weidman et al. |
| 2023/0230811 | A1 | 7/2023 | Yu et al. |
| 2023/0266670 | A1 | 8/2023 | Hansen et al. |
| 2023/0341781 | A1 | 10/2023 | Han et al. |
| 2024/0045332 | A1 | 2/2024 | Tapily et al. |
| 2024/0126175 | A1 | 4/2024 | Nagahara et al. |
| 2024/0192590 | A1 | 6/2024 | Kanakasabapathy et al. |
| 2024/0329539 | A1 | 10/2024 | Tan et al. |
| 2025/0053084 | A1 | 2/2025 | Hansen et al. |
| 2025/0093781 | A1 | 3/2025 | Peter et al. |
| 2025/0244678 | A1 | 7/2025 | Lee et al. |
| 2025/0271766 | A1 | 8/2025 | Hansen et al. |

FOREIGN PATENT DOCUMENTS

| | | | | | |
|---|---|---|---|---|---|
| CN | 101828266 | A | | 9/2010 | |
| CN | 104637792 | A | | 5/2015 | |
| CN | 105489635 | A | | 4/2016 | |
| CN | 107153326 | A | | 9/2017 | |
| CN | 110609441 | A | | 12/2019 | |
| CN | 116009357 | A | | 4/2023 | |
| CN | 117111404 | A | | 11/2023 | |
| EP | 1253629 | A2 | | 10/2002 | |
| EP | 1123423 | B1 | | 8/2007 | |
| EP | 3596155 | B1 | | 8/2022 | |
| JP | S52144972 | A | | 12/1977 | |
| JP | S5883847 | A | | 5/1983 | |
| JP | H03228327 | A | | 10/1991 | |
| JP | H0572747 | A | | 3/1993 | |
| JP | H0745580 | A | | 2/1995 | |
| JP | H0757995 | A | | 3/1995 | |
| JP | H07106224 | A | | 4/1995 | |
| JP | H07244386 | A | | 9/1995 | |
| JP | H0831781 | A | | 2/1996 | |
| JP | H08330288 | A | | 12/1996 | |
| JP | H08339950 | A | | 12/1996 | |
| JP | H10172957 | A | | 6/1998 | |
| JP | H10301298 | A | | 11/1998 | |
| JP | 2000223461 | A | | 8/2000 | |
| JP | 2001250813 | A | | 9/2001 | |
| JP | 2005123651 | A | | 5/2005 | |
| JP | 2005317652 | A | | 11/2005 | |
| JP | 2010074065 | A | | 4/2010 | |
| JP | 2010245327 | A | | 10/2010 | |
| JP | 2011511476 | A | | 4/2011 | |
| JP | 2011099956 | A | | 5/2011 | |
| JP | 2012169638 | A | | 9/2012 | |
| JP | 2013135066 | A | | 7/2013 | |
| JP | 2013542944 | A | | 11/2013 | |
| JP | 2015513540 | A | | 5/2015 | |
| JP | 2016530565 | A | | 9/2016 | |
| JP | 2017045869 | A | | 3/2017 | |
| JP | 2017116923 | A | | 6/2017 | |
| JP | 2017532407 | A | | 11/2017 | |
| JP | 2018502173 | A | | 1/2018 | |
| JP | 2018017780 | A | | 2/2018 | |
| JP | 2018098229 | A | | 6/2018 | |
| JP | 2019500490 | A | | 1/2019 | |
| JP | 2019506730 | A | | 3/2019 | |
| JP | 2019095794 | A | | 6/2019 | |
| JP | 2019532182 | A | | 11/2019 | |
| JP | 2020129607 | A | | 8/2020 | |
| JP | 2021005737 | A | | 1/2021 | |
| JP | 2022502714 | A | | 1/2022 | |
| KR | 100398312 | B1 | | 9/2003 | |
| KR | 20120093781 | A | | 8/2012 | |
| KR | 20140121826 | A | | 10/2014 | |
| KR | 20150129781 | A | | 11/2015 | |
| KR | 20160082969 | A | | 7/2016 | |
| KR | 20170039289 | A | | 4/2017 | |
| KR | 20180054917 | A | | 5/2018 | |
| KR | 20190060678 | A | | 6/2019 | |
| KR | 20200014185 | A | | 2/2020 | |
| KR | 20200144580 | A | | 12/2020 | |
| KR | 20220155111 | A | | 11/2022 | |
| TW | 200947117 | A | | 11/2009 | |
| TW | 201140230 | A | | 11/2011 | |
| TW | 201224190 | A | | 6/2012 | |
| TW | 201327057 | A | | 7/2013 | |
| TW | 201502696 | A | | 1/2015 | |
| TW | 201539539 | A | | 10/2015 | |
| TW | 201631377 | A | | 9/2016 | |
| TW | 201729006 | A | | 8/2017 | |
| TW | 201734667 | A | | 10/2017 | |
| TW | 201826034 | A | | 7/2018 | |
| TW | 201903886 | A | | 1/2019 | |
| TW | 201907445 | A | | 2/2019 | |
| TW | 201931011 | A | | 8/2019 | |
| TW | 201937545 | A | | 9/2019 | |
| TW | 202001993 | A | | 1/2020 | |
| TW | 202006168 | A | | 2/2020 | |
| TW | 202117468 | A | | 5/2021 | |
| WO | WO-2008139621 | A1 | | 11/2008 | |
| WO | WO-2013119134 | A1 | | 8/2013 | |
| WO | WO-2013128313 | A1 | | 9/2013 | |
| WO | WO-2017002497 | A1 | | 1/2017 | |
| WO | WO-2017066319 | A2 | | 4/2017 | |
| WO | WO-2017207452 | A1 | | 12/2017 | |
| WO | WO-2018061670 | A1 | | 4/2018 | |
| WO | WO-2019059074 | A1 | | 3/2019 | |
| WO | WO-2019125952 | A1 | | 6/2019 | |
| WO | WO-2019217749 | A1 | | 11/2019 | |
| WO | WO-2020132281 | A1 | | 6/2020 | |
| WO | WO-2020190941 | A1 | | 9/2020 | |
| WO | WO-2020263750 | A1 | | 12/2020 | |
| WO | WO-2020264158 | A1 | | 12/2020 | |
| WO | WO-2020264556 | A1 | | 12/2020 | |
| WO | WO-2020264571 | A1 | * | 12/2020 | ........... G03F 7/0042 |
| WO | WO-2021067632 | A2 | * | 4/2021 | ............. G03F 7/091 |
| WO | WO-2021072042 | A1 | * | 4/2021 | ............. C23C 16/30 |
| WO | WO-2021202681 | A1 | | 10/2021 | |
| WO | WO-2021262529 | A1 | * | 12/2021 | ............... G03F 7/36 |
| WO | WO-2022006349 | A1 | | 1/2022 | |
| WO | WO-2022016128 | A1 | | 1/2022 | |

OTHER PUBLICATIONS

International Search Report and Written Opinion dated Jul. 22, 2022 in Application No. PCT/US2022/022790.

International Preliminary Report on Patentability dated Oct. 12, 2023, in PCT Application No. PCT/US2022/022790.

JP Office Action dated Mar. 26, 2024 in JP Application No. 2023-558732 with English translation.

TW Office Action dated Apr. 17, 2024 in TW Application No. 111112111 with English translation.

JP Office Action dated Oct. 22, 2024 in JP Application No. 2022-547251 with English translation.

TW Office Action dated Aug. 6, 2024 in TW Application No. 110122525, with English Translation.

TW Office Action dated Oct. 4, 2024 in TW Application No. 109121649 with English translation.

TW Office Action dated Sep. 25, 2024 in TW Application No. 110111136 with English translation.

U.S. Non-Final Office Action dated Sep. 17, 2024 in U.S. Appl. No. 17/995,355.

CN Office Action dated Jan. 22, 2024 in CN Application No. 202080047683.X, with English Translation.

CN Office Action dated Jul. 26, 2024 in CN Application No. 202080047683.X with English translation.

EP Extended European Search Report dated Jun. 26, 2023, in Application No. 20831343.7.

International Search Report and Written Opinion dated Jul. 13, 2021, in PCT Application No. PCT/US2021/023901.

International Preliminary Report on Patentability and Written Opinion dated Feb. 8, 2024 in PCT Application No. PCT/US2022/037393.

International Preliminary Report on Patentability and Written Opinion dated Feb. 8, 2024 in PCT Application No. PCT/US2022/037733.

(56) References Cited

OTHER PUBLICATIONS

International Preliminary Report on Patentability and Written Opinion dated Jun. 27, 2024 in PCT Application No. PCT/US2022/081376.
International Preliminary Report on Patentability and Written Opinion dated Nov. 14, 2024 in PCT Application No. PCT/US2023/019871.
International Preliminary Report on Patentability dated Jan. 26, 2023 in PCT Application No. PCT/US2021/042106.
International Preliminary Report on Patentability dated Oct. 13, 2022, in PCT Application No. PCT/US2021/023901.
International Search Report and Written Opinion dated Apr. 17, 2023 in PCT Application No. PCT/US2022/081376.
International Search Report and Written Opinion dated Aug. 17, 2023, in Application No. PCT/US2023/019871.
International Search Report and Written Opinion dated Aug. 28, 2024 in PCT Application No. PCT/US2024/028046.
International Search Report and Written Opinion dated Nov. 4, 2021 in PCT Application No. PCT/US2021/042106.
International Search Report and Written Opinion dated Nov. 7, 2022 in PCT Application No. PCT/US2022/037393.
JP Office Action dated Dec. 3, 2024 in JP Application No. 2023-558732 with English translation.
JP Office Action dated Dec. 26, 2023 in JP Application No. 20210576241, with English Translation.
JP Office Action dated May 14, 2024 in JP Application No. 2021-576241 with English translation.
KR Notice of Allowances dated Jul. 8, 2024, in KR Application No. 10-2024-7006338 with English Translation.
KR Office Action dated Nov. 28, 2024 in KR Application No. 10-2022-7014896, with English Translation.
SG Search Report and Written Opinion dated Jul. 3, 2024 in SG Application No. 11202114196U.
SG Search Report and Written Opinion dated May 14, 2024 in SG Application No. 11202251864Y.
SG Written Opinion dated Jul. 31, 2024 in SG Application No. 11202307119P.
TW Office Action and Search Report dated Dec. 25, 2024 in TW Application No. 111112111, with English Translation.
TW Office Action dated Jul. 2, 2024 in TW Application No. 109134940 with English translation.
TW Office Action dated Jul. 23, 2024 in TW Application No. 110111878, with English Translation.
TW Office Action dated Jun. 27, 2024 in TW Application No. 110103944, with English Translation.
TW Office Action dated Mar. 11, 2024 in TW Application No. 109121649, with English Translation.
TW Office Action dated Nov. 7, 2024 in TW Application No. 111112111, with English Translation.
TW Office Action dated Nov. 26, 2024 in TW Application No. 110126445, with English Translation.
U.S. Non-Final Office Action dated Nov. 21, 2024 in U.S. Appl. No. 17/596,858.
U.S. Appl. No. 18/855,026, inventors Lee Y, et al., filed Oct. 8, 2024.
U.S. Restriction Requirement dated Jun. 21, 2024 in U.S. Appl. No. 17/596,858.
JP Office Action dated Aug. 6, 2024 in JP Application No. 2023-558732, with English Translation.
TW Office Action dated Aug. 8, 2024 in TW Application No. 111112111, with English Translation.
Barret M C., et al., "Copper, Zinc and Tin Hydroxypyridinones," Transition Metal Chemistry, Jan. 2015, vol. 40, pp. 241-254.
Cilibrizzi A., et al., "Hydroxypyridinone Journey into Metal Chelation," Chemical Review, Jul. 2018, vol. 118, pp. 7657-7701.
EP Extended European Search report dated Apr. 15, 2025 in EP Application No. 22782195.6.
Fitzgerald A., et al., "Determination of Trace Metals in Positive Photoresist," Journal of the Electrochemical Society, May 1992, vol. 139 (5), pp. 1413-1414.
International Search Report and Written Opinion dated Feb. 20, 2025 in PCT Application No. PCT/US2024/054806.
JP Office Action dated Apr. 30, 2025 in JP Application No. 2022547251, with English Translation.
JP Office Action dated Feb. 18, 2025 in JP Application No. 2022-557680, with English Translation.
JP Office Action dated Jun. 24, 2025 in JP Application No. 2022577244, with English Translation.
JP Office Action dated Mar. 4, 2025 in JP Application No. 2022-577244, with English Translation.
JP Office Action dated May 13, 2025 in JP Application No. 2023-502906, with English Translation.
KR Office Action dated Apr. 14, 2025 in KR Application No. 10-2022-7030615, with English Translation.
KR Office Action dated Jun. 12, 2025 in KR Application No. 10-2023-7001454, with English Translation.
KR Office Action dated Mar. 13, 2025 in KR Application No. 10-2023-7004801, with English Translation.
KR Office Action dated Mar. 19, 2025 in KR Application No. 10-2022-7038020, with English Translation.
KR Office Action dated Mar. 27, 2025 in KR Application No. 10-2022-7003371, with English Translation.
KR Office Action dated May 29, 2025 in KR Application No. 10-2022-7038499, with English Translation.
Stowers et al.; "Directly patterned inorganic hard mask for EUV lithography"; proceedings of the SPIE 7969; Extreme Ultraviolet (EUV) Lithography 11, 796915-1-11 (Apr. 7, 2011), event: SPI E Advanced Lithography, 2011, San Jose California.
TW Office Action dated Mar. 11, 2025 in TW Application No. 110126445, with English Translation.
U.S. Advisory Action dated Jun. 27, 2025 in U.S. Appl. No. 17/596,858.
U.S. Final Office Action dated Apr. 21, 2025 in U.S. Appl. No. 17/596,858.
US Non-Final Office Action dated Jul. 8, 2025 in U.S. Appl. No. 17/998,354.
US Non-Final Office Action dated Jul. 14, 2025 in U.S. Appl. No. 18/005,571.
US Non-Final Office Action dated Jul. 16, 2025 in U.S. Appl. No. 17/905,754.
US Non-Final Office Action dated Jun. 5, 2025 in U.S. Appl. No. 17/758,567.
US Non-Final Office Action dated Jun. 18, 2025 in U.S. Appl. No. 17/753,110.
U.S. Notice of Allowance dated Apr. 9, 2025 in U.S. Appl. No. 17/995,355.
U.S. Appl. No. 19/202,425, inventors Hansen E.C et al., filed May 8, 2025.
U.S. Restriction Requirement dated Apr. 3, 2025 in U.S. Appl. No. 17/758,567.
U.S. Restriction Requirement dated Mar. 20, 2025 in U.S. Appl. No. 17/753,110.
U.S. Restriction Requirement dated Mar. 26, 2025 in U.S. Appl. No. 17/905,754.
Waard H D., et al., "Observations on Implanted Xenon-133 Sources," Proceedings of the Royal Society of London. Series A, Mathematical and Physical Sciences, Jun. 1969, vol. 311 (1504), pp. 139-150.
International Preliminary Report on Patentability and Written Opinion dated Nov. 20, 2025 in PCT Application No. PCT/US2024/028046.
JP Office Action dated Aug. 19, 2025 in JP Application No. 2022-557680, with English Translation.
JP Office Action dated Oct. 7, 2025 in JP Application No. 2024-197800, with English Translation.
JP Office Action dated Sep. 9, 2025 in JP Application No. 2023-502906, with English Translation.
KR Office Action dated Aug. 27, 2025 in KR Application No. 10-2022-7014896, with English Translation.
KR Office Action dated Dec. 3, 2025 in KR Application No. 10-2022-7030615, with English Translation.
KR Office Action dated Nov. 12, 2025 in KR Application No. 10-2023-7004801, with English Translation.

(56) References Cited

OTHER PUBLICATIONS

KR Office Action dated Nov. 26, 2025 in KR Application No. 10-2022-7038020, with English Translation.
TW Office Action and Search Report dated Aug. 15, 2025 in TW Application No. 114123201, with English Translation.
TW Office Action and Search Report dated Nov. 27, 2025 in TW Application No. 110126445, with English Translation.
TW Office Action and Search Report dated Oct. 30, 2025 in TW Application No. 111127705, with English Translation.
U. S. Final Office Action dated Dec. 4, 2025 in U.S. Appl. No. 18/005,571.
U.S. Final Office Action dated Nov. 17, 2025 in U.S. Appl. No. 17/753,110.
U.S. Non-Final Office Action dated Aug. 26, 2025 in U.S. Appl. No. 17/596,858.
U.S. Appl. No. 19/482,119, inventors Demuth J.J et al., filed Nov. 6, 2025.
TW Office Action and Search Report dated Aug. 4, 2025 in TW Application No. 114105681, with English Translation.
International Preliminary Report on Patentability dated Jan. 5, 2023 in PCT Application No. PCT/US2021/034019.
International Search Report and Written Opinion dated Sep. 15, 2021, in PCT Application No. PCT/US2021/034019.
International Search Report and Written Opinion dated Apr. 20, 2026 in PCT Application No. PCT/US2025/059876.
JP Office Action dated Mar. 24, 2026 in JP Application No. 2025-67176, with English Translation.
KR Notice of Allowance and Search Report dated Feb. 18, 2026 in KR Application No. 10-2022-7038499, with English translation.
KR Office Action dated Dec. 28, 2025 in KR Application No. 10-2022-7003371, with English Translation.
KR Office Action dated Feb. 11, 2026 in KR Application No. 10-2025-7015615, with English Translation.
KR Office Action dated Mar. 30, 2026 in KR Application No. 10-2023-7001454, with English Translation.
TW Office Action and Search Report dated Apr. 16, 2026 in TW Application No. 111128103, with English Translation.
TW Office Action dated Feb. 24, 2026 in TW Application No. 114123201, with English Translation.
TW Office Action dated Mar. 18, 2026 in TW Application No. 114117617, with English Translation.
U.S. Advisory Action dated Jan. 16, 2026 in U.S. Appl. No. 17/753,110.
U.S. Final Office Action dated Dec. 12, 2025 in U.S. Appl. No. 17/758,567.
U.S. Final Office Action dated Feb. 18, 2026 in U.S. Appl. No. 17/905,754.
U.S. Non-Final Office Action dated Apr. 1, 2026 in U.S. Appl. No. 17/753,110.
U.S. Non-Final Office Action dated Dec. 18, 2025 in U.S. Appl. No. 18/580,334.
U.S. Notice of Allowance dated Dec. 11, 2025 in U.S. Appl. No. 17/998,354.
U.S. Notice of Allowance dated Dec. 30, 2025 in U.S. Appl. No. 17/596,858.

* cited by examiner 0.5

Backside Tin Concentration (atoms/cm$^2$)

| Z1 | Z2 | Z3 |
|---|---|---|
| <0.1E10 | <0.1E10 | 0.84E10 |

CONTROL OF METALLIC CONTAMINATION FROM METAL-CONTAINING PHOTORESIST

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

FIELD

Embodiments herein relate to the field of semiconductor processing. In particular, various embodiments relate to patterning a semiconductor substrate using photolithography and related processes. Various techniques for controlling metallic contamination are discussed.

BACKGROUND

The fabrication of semiconductor devices, such as integrated circuits, is a multi-step process involving photolithography. In general, the process includes the deposition of material on a wafer, and patterning the material through lithographic techniques to form structural features (e.g., transistors and circuitry) of the semiconductor device. The steps of a typical photolithography process known in the art include: preparing the substrate; applying a photoresist, such as by spin coating; exposing the photoresist to light in a desired pattern, causing the exposed areas of the photoresist to become more or less soluble in a developer solution; developing the photoresist pattern by applying a developer solution to remove either the exposed or the unexposed areas of the photoresist; and subsequent processing to create features on the areas of the substrate from which the photoresist has been removed, such as by etching or material deposition.

The evolution of semiconductor design has created the need, and has been driven by the ability, to create ever smaller features on semiconductor substrate materials. This progression of technology has been characterized in "Moore's Law" as a doubling of the density of transistors in dense integrated circuits every two years. Indeed, chip design and manufacturing has progressed such that modern microprocessors may contain billions of transistors and other circuit features on a single chip. Individual features on such chips may be on the order of 22 nanometers (nm) or smaller, in some cases less than 10 nm.

One challenge in manufacturing devices having such small features is the ability to reliably and reproducibly create photolithographic masks having sufficient resolution. Current photolithography processes typically use 193 nm ultraviolet (UV) light to expose a photoresist. The fact that the light has a wavelength significantly greater than the desired size of the features to be produced on the semiconductor substrate creates inherent issues. Achieving feature sizes smaller than the wavelength of the light requires use of complex resolution enhancement techniques, such as multipatterning. Thus, there is significant interest and research effort in developing photolithographic techniques using shorter wavelength light, such as extreme ultraviolet radiation (EUV), having a wavelength of from 10 nm to 15 nm, e.g., 13.5 nm.

EUV photolithographic processes can present challenges, however, including low power output and loss of light during patterning. Traditional organic chemically amplified resists (CAR) similar to those used in 193 nm UV lithography have potential drawbacks when used in EUV lithography, particularly as they have low absorption coefficients in the EUV region and the diffusion of photo-activated chemical species can result in blur or line edge roughness. Furthermore, in order to provide the etch resistance required to pattern underlying device layers, small features patterned in conventional CAR materials can result in high aspect ratios at risk of pattern collapse. Accordingly, there remains a need for improved EUV photoresist materials, having such properties as decreased thickness, greater absorbance, and greater etch resistance.

The background description provided herein is for the purpose of generally presenting the context of the present technology. Work of the presently named inventors, to the extent it is described in this background section, as well as aspects of the description that may not otherwise qualify as prior art at the time of filing, are neither expressly nor impliedly admitted as prior art against the present technology.

SUMMARY

Various embodiments herein relate to methods, apparatus, and systems for controlling contamination on a substrate. The substrate is typically a semiconductor substrate. In one aspect of the disclosed embodiments, a method of controlling contamination on a substrate is provided, the method including: (a) either (i) processing a frontside of the substrate, thereby causing formation of contamination on a backside of the substrate, or (ii) receiving the substrate with contamination on the backside of the substrate, the contamination including a metal; and (b) after (a), heating the substrate in a post-processing bake process, where heating the substrate reduces a concentration of the metal on the backside of the substrate.

In some embodiments, processing the frontside of the substrate may include at least one process selected from the group consisting of: developing a layer of photoresist; in-situ cleaning the substrate; pulling a mandrel in a patterning application; smoothing a feature on the substrate; and descumming a layer of photoresist. In these or other embodiments, (a) may include either (i) developing the layer of photoresist on the substrate, or (ii) receiving the substrate with a layer of photoresist developed on the frontside of the substrate and contamination on the backside of the substrate, where the metal in the contamination originates from the layer of photoresist on the frontside of the substrate, and where the post-processing bake process of (b) is a post-development bake process that occurs when the layer of photoresist is at least partially developed. In these or other embodiments, during the post-development bake process of (b), the substrate may be baked at a temperature between about 160-300° C. for a duration between about 1-10 minutes.

In these or other embodiments, the method may further include exposing the substrate to a processing gas, the processing gas including at least one gas selected from the group consisting of $N_2$, $H_2$, Ar, He, Xe, and combinations thereof. In these or other embodiments, the method may further include exposing the substrate to a reactive processing gas to increase a volatility of a metal-containing material on the substrate, the metal containing material including the metal. In some embodiments, the method may further include exposing the substrate to a reactive processing gas to increase a stability of a metal-containing material on the substrate, the metal containing material including the metal. In these or other embodiments, the method may further include exposing the substrate to a reactive processing gas selected from the group consisting of a chlorine-containing gas, an oxygen-containing gas, a fluorine-containing gas, ammonia ($NH_3$), hydrogen iodide (HI), diatomic iodine ($I_2$), and combinations thereof. In some cases, the substrate may be exposed to the chlorine-containing gas and the chlorine-containing gas may include at least one gas selected from the group consisting of $BCl_3$, $Cl_2$, HCl, $SiCl_4$, $SOCl_2$, $PCl_3$, and combinations thereof. In some cases, the substrate may be exposed to the oxygen-containing gas and the oxygen-containing gas may include at least one gas selected from the group consisting of $O_2$, $O_3$, $H_2O$, $SO_2$, $CO_2$, CO, COS, $H_2O_2$, $NO_x$, and combinations thereof. In some cases, the substrate may be exposed to the fluorine-containing gas, and the fluorine-containing gas may include at least one gas selected from the group consisting of HF, $C_xF_yH_z$, $NF_3$, $SF_6$, $F_2$, and combinations thereof.

In these or other embodiments, the method may further include exposing the substrate to plasma to increase a volatility of a metal-containing material on the substrate, the metal containing material including the metal. In some embodiments, the method may further include exposing the substrate to plasma to increase a stability of a metal-containing material on the substrate, the metal containing material including the metal. In these or other embodiments, the method may further include exposing the substrate to plasma generated from a plasma generation gas including at least one gas selected from the group consisting of diatomic hydrogen ($H_2$), diatomic nitrogen ($N_2$), argon, helium, krypton, methane ($CH_4$), an oxygen-containing gas, a fluorine-containing gas, a chlorine-containing gas, a hydrogen halide, and combinations thereof. In some embodiments, the plasma generation gas may include the oxygen-containing gas, and the oxygen-containing gas may include at least one gas selected from the group consisting of $O_2$, $O_3$, CO, $CO_2$, COS, $SO_2$, $NO_x$, $H_2O$, and combinations thereof. In some embodiments, the plasma generation gas may include the fluorine-containing gas, and the fluorine-containing gas may include at least one gas selected from the group consisting of $NF_3$, $CF_4$, $CH_3F_3$, $CH_2F_2$, $CHF_3$, $F_2$, $SF_6$, and combinations thereof. In some embodiments, the plasma generation gas may include the chlorine-containing gas, and the chlorine-containing gas may include at least one gas selected from the group consisting of $BCl_3$, $Cl_2$, HCl, $SiCl_4$, $SOCl_2$, $PCl_3$, and combinations thereof. In some embodiments, the plasma generation gas may include (i) the diatomic hydrogen ($H_2$), and (ii) at least one of diatomic nitrogen ($N_2$) or a noble gas.

In these or other embodiments, heating the substrate in the post-development bake process may reduce the concentration of the metal on the backside of the substrate by at least an order of magnitude. In these or other embodiments, the method may further include exposing the substrate to plasma, where heating the substrate in the post-development bake process and exposing the substrate to plasma reduces the concentration of the metal on the backside of the substrate by at least two orders of magnitude.

In these or other embodiments, the method may further include exposing the substrate to light to reduce a concentration of the metal on the backside of the substrate. In some embodiments, the light may include at least one of UV wavelengths, visible wavelengths, or IR wavelengths. In some embodiments, the light may be provided via an IR lamp or a plurality of LEDs, and the substrate may be heated to a temperature between about 250-400° C. for a duration of about 60 seconds or less while the substrate is exposed to the light.

In these or other embodiments, heating the substrate in the post-development bake process may begin while the layer of photoresist is still being developed on the substrate.

In these or other embodiments, the method may further include transferring the substrate from a first processing chamber to a second processing chamber after (a), such that (a) occurs in the first processing chamber and (b) occurs in the second processing chamber. In these or other embodiments, (a) may occur in a processing chamber, and the method may further include heating the processing chamber to a temperature of about 40° C. or greater while the layer of photoresist is developed in (a). In these or other embodiments, (a) may occur in a processing chamber, and the method may further include purging the processing chamber while maintaining the processing chamber at a temperature of about 100° C. or greater, the purge occurring after (a). In some embodiments, the method may further include sweeping the processing chamber with inert gas, where the purge and the sweeping are part of a pump purge sequence.

In these or other embodiments, the method may further include performing a wet clean on the backside of the substrate after (a) and (b). In these or other embodiments, performing the wet clean on the backside of the substrate may further reduce the concentration of the metal on the backside of the substrate by at least an order of magnitude. In these or other embodiments, the wet clean may also clean a bevel edge region on the frontside of the substrate. In these or other embodiments, performing the wet clean on the backside of the substrate may include exposing the backside of the substrate to dilute HF. In these or other embodiments, performing the wet clean on the backside of the substrate may further include exposing the backside of the substrate to dilute HCl or to a standard clean 1 solution including $NH_4OH$, $H_2O_2$, and $H_2O$.

In various, the layer of photoresist may be formed using dry deposition. In other embodiments, the layer of photoresist may be formed using wet deposition. In various embodiments, the layer of photoresist may be developed using dry processing. In some embodiments, the layer of photoresist may be developed using halogen-containing chemistry. In some embodiments, the layer of photoresist may be developed using wet processing.

In various embodiments, the post-development bake process of (b) may occur in a processing chamber, and the following conditions may be used during the post-development bake process of (b): (i) a pressure in the processing chamber may be maintained between about 0.01-1 Torr, (ii) a chlorine-containing gas may be provided to the processing chamber at a rate of about 200-10,000 sccm for a duration between about 1-10 minutes, (iii) a temperature of one or more components of the processing chamber may be maintained between about 20-150° C., and (iv) the substrate may not be exposed to plasma during (b).

In various embodiments, the layer of photoresist may be developed in (a) in a processing chamber, (b) may occur in the same processing chamber as (a), and the method may further include purging the processing chamber using the following conditions: (i) a pressure in the processing chamber may be between about 0.01-1 Torr, (ii) a flow of purge gas may be provided to the processing chamber at a rate between about 200-10,000 sccm, the purge gas including at least one gas selected from the group consisting of diatomic nitrogen ($N_2$), a noble gas, and combinations thereof, the purge gas being provided to the processing chamber for a duration between about 1-minutes, and (iii) one or more components of the processing chamber may be maintained between about 100-300° C., and a substrate support within the processing chamber may be maintained between about 120-300° C.

In various embodiments, (a) may occur in a first processing chamber and (b) may occur in a second processing chamber, and the following conditions may be used during the post-development bake process of (b): (i) a pressure in the second processing chamber may be between about 0.1-760 Torr, (ii) a flow of gas may be provided to the second processing chamber at a rate of about 200-10,000 sccm for a duration between about 1-10 minutes, the substrate may be exposed to the flow of gas, the flow of gas including at least one of air, diatomic nitrogen ($N_2$), diatomic oxygen ($O_2$), water ($H_2O$), a noble gas, or a combination thereof, and (iii) the substrate may be baked at a temperature between about 140-300° C.

In these or other embodiments, the method may further include exposing the substrate to plasma in a processing chamber under the following conditions: (i) a pressure in the processing chamber may be between about 0.1-1 Torr, (ii) a plasma generation gas may be provided at a rate between about 50-5,000 sccm for a duration between about 3-30 seconds, the plasma generation gas may include at least one gas or gas mixture selected from the group consisting of (a) $H_2$, (b) $H_2$ and $N_2$, (c) $H_2$ and a noble gas, (d) $N_2$, without $H_2$, (e) a noble gas, without $H_2$, (f) an oxygen-containing gas, (g) a fluorine-containing gas, and (h) combinations thereof, and (iii) plasma is generated from the plasma generation gas and the substrate is exposed to the plasma.

In these or other embodiments, at least one of (a) and (b) may occur in a processing chamber, and the method may further include cleaning the processing chamber to remove the metal from interior surfaces of the processing chamber. In some embodiments, the processing chamber may be cleaned using the following conditions: (i) a pressure in the processing chamber may be between about 0.1-10 Torr, (ii) a plasma including H radicals may be exposed to the processing chamber, where the H radicals react with the metal on the interior surfaces of the processing chamber to form a metal hydride, (iii) the plasma may be generated using an RF power between about 300-4,000 Watts, and (iv) the processing chamber may be maintained between about 25-250° C. In these or other embodiments, the processing chamber may be cleaned using the following conditions: (i) a pressure in the processing chamber may be between about 0.1-10 Torr, and may be cycled between a lower pressure and a higher pressure as part of a pumping and purging process, (ii) the processing chamber is not exposed to plasma during cleaning, (iii) a gas flow may be provided to the processing chamber during cleaning, the gas flow including at least one gas selected from the group consisting of diatomic nitrogen ($N_2$), diatomic oxygen ($O_2$), a noble gas, and combinations thereof, and (iv) the processing chamber may be maintained between about 25-250° C.

In these or other embodiments, the method may further include performing a wet clean on the backside of the substrate using the following conditions: (i) in a first step, the substrate may be exposed to a first cleaning solution provided at a rate of about 1-3 L/min, the first cleaning solution including dilute HF, (ii) in a second step, the substrate may be exposed to a second cleaning solution provided at a rate of about 1-3 L/min, where the second cleaning solution includes a solution selected from the group consisting of dilute HCl, standard clean 1, and combinations thereof, (iii) the first step and second step may together have a duration between about 20-300 seconds, and (iv) the substrate may be maintained between about 15-60° C.

In these or other embodiments, the concentration of the metal on at least one of the backside or bevel edge region of the substrate may be reduced by at least an order of magnitude to about 1E11 atoms/$cm^2$ or less. In these or other embodiments, the concentration of the metal on at least one of the backside or bevel edge region of the substrate may be reduced by at least an order of magnitude to about 1E10 atoms/$cm^2$ or less.

In these or other embodiments, the metal may be tin.

In another aspect of the disclosed embodiments, a system for processing a substrate is provided, the system including: a processing chamber; an inlet to the processing chamber for introducing gas and/or plasma to the processing chamber; an outlet to the processing chamber for removing materials from the processing chamber; a heater; a substrate support; and a controller configured to cause any one or more of the methods claimed or otherwise described herein.

In another aspect of the disclosed embodiments, a system for processing a substrate is provided, the system including: a processing chamber; an inlet to the processing chamber for introducing gas and/or plasma to the processing chamber; an outlet to the processing chamber for removing materials from the processing chamber; a heater; a substrate support; and a controller configured to cause: (a) either (i) processing a frontside of the substrate, thereby causing formation of contamination on a backside of the substrate, or (ii) receiving the substrate with contamination on the backside of the substrate, the contamination including a metal; and (b) after (a), heating the substrate in a post-processing bake process, where heating the substrate reduces a concentration of the metal on the backside of the substrate.

In some embodiments, processing the frontside of the substrate may include at least one process selected from the group consisting of: developing a layer of photoresist; in-situ cleaning the substrate; pulling a mandrel in a patterning application; smoothing a feature on the substrate; and descumming a layer of photoresist.

In these or other embodiments, the controller may be configured to cause (a) by causing either (i) developing the layer of photoresist on the substrate, or (ii) receiving the substrate with a layer of photoresist developed on the frontside of the substrate and contamination on the backside of the substrate, where the metal in the contamination originates from the layer of photoresist on the frontside of the substrate, and where the post-processing bake process of (b) is a post-development bake process that occurs when the layer of photoresist is at least partially developed.

In various embodiments, (a) and (b) may both occur in the same processing chamber. In other embodiments, (a) may occur in the processing chamber, and (b) may occur in a second processing chamber, the second processing chamber being a different processing chamber than the processing chamber.

In these or other embodiments, the system may further include a plasma generator configured to provide plasma in the processing chamber. In some cases, the plasma generator may be a remote plasma generator such that the plasma is generated at a first location outside of the processing chamber and delivered to a second location inside the processing chamber. These and other aspects are described further below with reference to the drawings.

DETAILED DESCRIPTION

Figure 1:
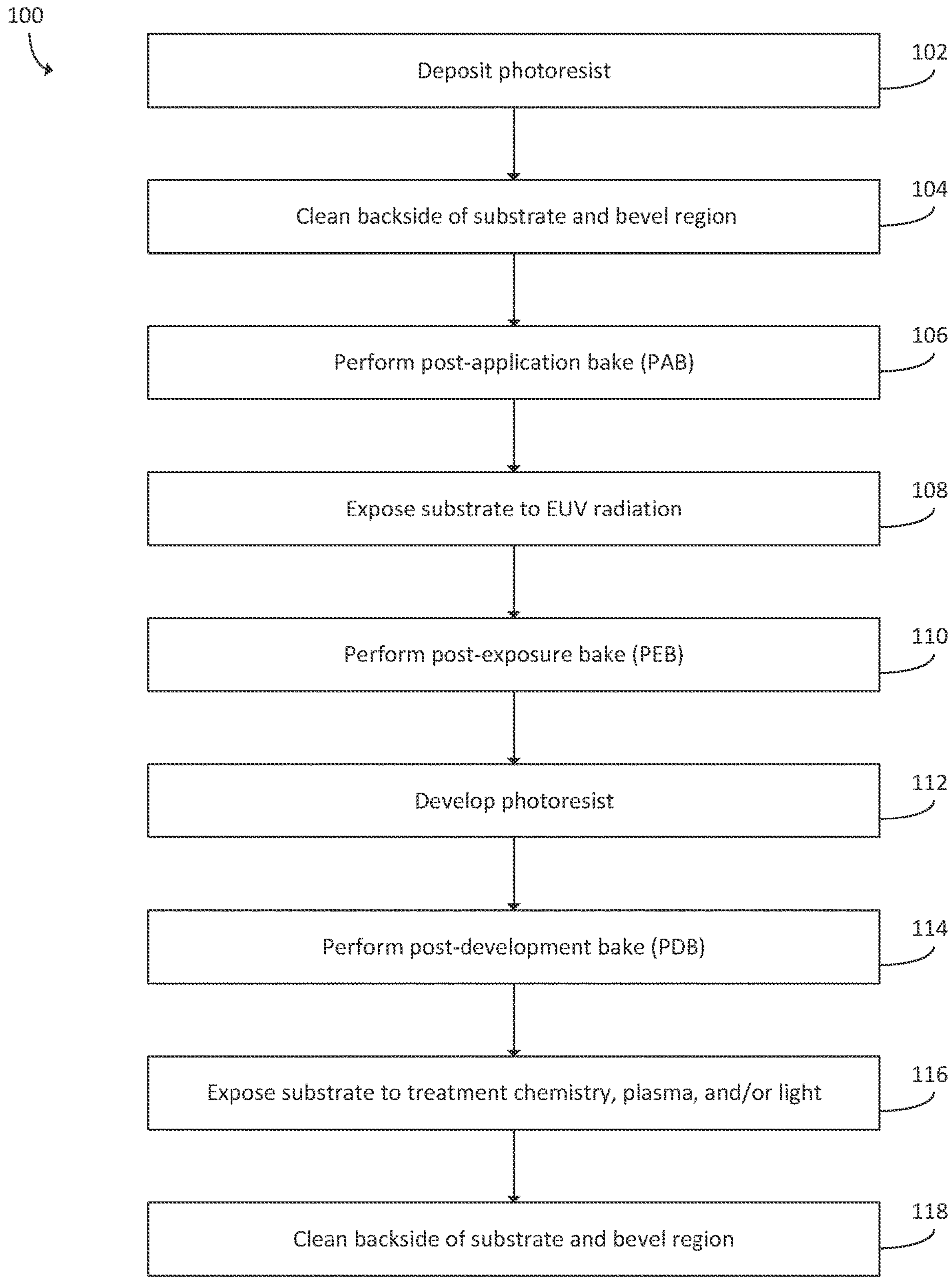
FIG. 1 presents a flow diagram of an example method for depositing, developing, and treating a photoresist according to some embodiments.

This disclosure relates generally to the field of semiconductor processing. In particular aspects, the disclosure is directed to process and apparatus for treating and cleaning of photoresists (e.g., EUV-sensitive metal and/or metal oxide-containing photoresists), for example to remove unwanted photoresist and related materials such as metals and metal bromides deposited on a backside and bevel edge of a substrate in the context of photoresist patterning.

Reference is made herein in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

For example, while the present disclosure is primarily provided in the context of photoresist deposition, development, and treatment, the embodiments are not so limited. Various techniques described herein may also be applied in other contexts, particularly in cases where it is desired to limit outgassing of a metal-containing species such as a metal halide from a substrate and/or to remove metal-containing species from a substrate (particularly but not limited to the backside and bevel edge region of the substrate). Such techniques may be particularly useful in cases where the metal is tin and/or the unwanted material is tin bromide, though other metals and halogens may be used as well. Examples of other processes that may benefit from implementation of one or more of the disclosed techniques include, but are not limited to, in-situ cleaning, mandrel pull, smoothing operations, and photoresist descum operations. It is understood that processes described herein as occurring "post development" may occur after other types of operations (e.g., deposition, etching, treatment, etc.) in the contexts listed above. For instance, the post development bake (PDB) operation may instead be performed as a post deposition bake, a post etching bake, a post treatment bake, etc. In some such cases, the photoresist layer described herein may be substituted with another metal-containing or metal halide-containing layer. For purposes of clarity and brevity, the present disclosure focuses on embodiments in the context of photoresist deposition, development, and treatment.

INTRODUCTION

Patterning of thin films in semiconductor processing is often an important step in the fabrication of semiconductors. Patterning involves lithography. In conventional photolithography, such as 193 nm photolithography, patterns are printed by emitting photons from a photon source onto a mask and printing the pattern onto a photosensitive photoresist, thereby causing a chemical reaction in the photoresist that, after development, removes certain portions of the photoresist to form the pattern.

Advanced technology nodes (as defined by the International Technology Roadmap for Semiconductors) include nodes 22 nm, 16 nm, and beyond. In the 16 nm node, for example, the width of a typical via or line in a Damascene structure is typically no greater than about 30 nm. Scaling of features on advanced semiconductor integrated circuits (ICs) and other devices is driving lithography to improve resolution.

Extreme ultraviolet (EUV) lithography can extend lithography technology by moving to smaller imaging source wavelengths than would be achievable with conventional photolithography methods. EUV light sources at approximately 10-20 nm, or 11-14 nm wavelength, for example 13.5 nm wavelength, can be used for leading-edge lithography tools, also referred to as scanners. The EUV radiation is strongly absorbed in a wide range of solid and fluid materials including quartz and water vapor, and so operates in a vacuum.

EUV lithography makes use of EUV resists that are patterned to form masks for use in etching underlying layers. EUV resists may be polymer-based chemically amplified resists (CARs) produced by liquid-based spin-on techniques. An alternative to CARs are directly photopatternable metal oxide-containing films, such as those available from Inpria, Corvallis, OR, and described, for example, in US Patent Publications US 2017/0102612 and US 2016/0116839, incorporated by reference herein at least for their disclosure of photopatternable metal oxide-containing films. Such films may be produced by spin-on techniques or dry vapor-deposited. The metal oxide-containing film can be patterned directly (i.e., without the use of a separate photoresist) by EUV exposure in a vacuum ambient providing sub-30 nm patterning resolution, for example as described in U.S. Pat. No. 9,996,004, issued Jun. 12, 2018 and titled EUV PHOTOPATTERNING OF VAPOR-DEPOSITED METAL OXIDE-CONTAINING HARDMASKS, and/or in Application PCT/US19/31618, filed May 9, 2019, and titled METHODS FOR MAKING EUV PATTERNABLE HARD MASKS, the disclosures of which at least relating to the composition, deposition, and patterning of directly photopatternable metal oxide films to form EUV resist masks is incorporated by reference herein. Generally, the patterning involves exposure of the EUV resist with EUV radiation to form a photo pattern in the resist, followed by development to remove a portion of the resist according to the photo pattern to form the mask.

It should also be understood that the while present disclosure relates to lithographic patterning techniques and materials exemplified by EUV lithography, it is also applicable to other next generation lithographic techniques. In addition to EUV, which includes the standard 13.5 nm EUV wavelength currently in use and development, the radiation sources most relevant to such lithography are DUV (deep-UV), which generally refers to use of 248 nm or 193 nm excimer laser sources, X-ray, which formally includes EUV at the lower energy range of the X-ray range, as well as e-beam, which can cover a wide energy range. The specific methods may depend on the particular materials and applications used in the semiconductor substrate and ultimate semiconducting device. Thus, the methods described in this application are merely exemplary of the methods and materials that may be used in present technology.

Directly photopatternable EUV resists may be composed of or contain metals and/or metal oxides mixed within organic components. The metals/metal oxides are highly promising in that they can enhance the EUV photon adsorption and generate secondary electrons and/or show increased etch selectivity to an underlying film stack and device layers.

During application of a photoresist film (e.g., EUV photoresist film) to a substrate, either by conventional wet, e.g., spin-on, processing or dry deposition, there may be some unintended deposition of resist material on the wafer backside and/or bevel edge. Likewise, development of a photoresist film on a substrate can cause contamination (e.g., including metals and metal halides) in these same regions. This backside and bevel edge contamination can cause downstream processing problems, including contamination of the patterning (scanner), development tools, and downstream processing tools and metrology tools. Such contamination can be detrimental to the performance of the tools as well as to film deposited on the frontside of the wafer. In many cases, removal of this backside and bevel edge deposition is done by wet cleaning techniques, though dry cleaning techniques may be used as well.

Figure 22:
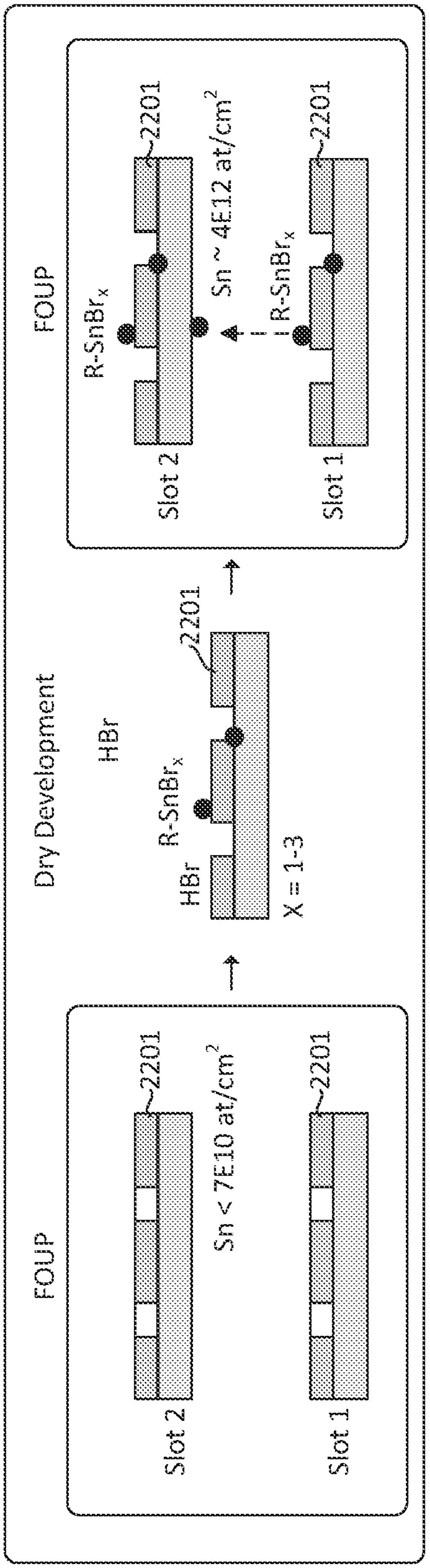
FIG. 22 illustrates substrate-to-substrate contamination that can occur in a processing apparatus.

FIG. 22 illustrates a pair of semiconductors substrates loaded into a front opening unified pod (FOUP), showing how metallic contamination originating from a first substrate during a dry development step can redeposit on a second substrate. Such redeposition can occur when multiple substrates are stored in a single FOUP or similar enclosure. A FOUP is a specialized container designed to securely hold semiconductor substrates in a controlled embodiment, allowing the substrates to be transferred between different apparatus as needed for processing and/or metrology. At a first stage, prior to development of the photoresist, a first substrate is in a first slot of the FOUP and a second substrate is in a second slot of the FOUP. The substrates each include a layer of photoresist 2201 that includes both exposed and unexposed portions. At a second stage, the photoresist 2201 is developed. In this example, a dry development process is used. However, in various other embodiments, a wet development process may be used. The development process selectively removes exposed or unexposed portions of the photoresist 2201, thereby forming the pattern in the photoresist. During the development process, some of the development byproducts (e.g., R-$SnBr_x$, where $1 \leq x \leq 3$) are undesirably redeposited on the front side of the substrate. At a third stage, the substrate contaminated with the development byproducts is loaded into the first slot of the FOUP. Over time, the contamination from the frontside of the substrate in the first slot can be transferred to the backside of the substrate in the second slot. This spread of contamination is undesirable.

The present disclosure provides for various techniques to minimize outgassing of metal and/or metal halide species from a metal-containing film on a substrate. In some cases, the methods involve treating the substrate to make the potentially contaminating species more volatile, such that they can be removed from the substrate and processing chamber. In some cases, the methods involve treating the substrate to make the potentially contaminating species more stable, such that they are less likely to outgas from the substrate during downstream processing. In various cases, the methods involve cleaning the backside and bevel edge area of the substrate after photoresist development to address contamination that is generated during development. These techniques may be combined as desired for a particular application. In various embodiments, the techniques may also act to prevent or reduce unwanted surface migration and/or unwanted reactions on the substrate. Advantageously, the techniques herein have shown a small to negligible effect on the pattern defined in the photoresist. Further, such techniques can provide in improvements in line width roughness (LWR).

Certain operations described herein may be limited to specific regions to ensure removal of the material from backside and bevel edge regions without film degradation on the frontside of the substrate. These operations may include, e.g., the backside and bevel edge cleaning operations. Other operations described herein may act on the frontside of the substrate, or the entire substrate, for example to purposely alter the metal-containing species on one or more substrate surface.

In some embodiments, the unwanted material on the substrate includes EUV resist material. In some embodiments, the unwanted material includes metal, metal halides, and/or organometal halides originating from a reaction between a metal in the EUV resist material and a halogen in the development chemistry. These may be referred to as etch byproducts or development byproducts. Such byproducts are especially likely to remain in the metal-containing photoresist material, which can retain metal bromides and metal chlorides at concentrations up to about 1E16 atoms/$cm^2$, which is about 2-3 orders of magnitude higher than typically acceptable for device manufacturing. In some cases, the metal is tin, the metal halide is $SnBr_x$, and/or the organometal halide is RSnBrx. In these or other cases, the metal is tin, the metal halide is SnClx, and/or the organometal halide is RSnClx. Other metals and halides may be used, as well. In many cases, the unwanted material is deposited on the backside and bevel edge regions of the substrate.

FIG. 1 presents a flow diagram of an example method for depositing and developing a photoresist according to some embodiments. The operations of process 100 may be performed in different orders and/or with different, fewer, or additional operations. One or more operations of the process 100 may be performed using an apparatus described in any one of FIGS. 6-9. In some embodiments, the operations of the process 100 may be implemented, at least in part, according to software stored in one or more non-transitory computer readable media.

At block 102 of the process 100, a layer of photoresist is deposited. This may be either a dry deposition process such as a vapor deposition process or a wet process such as a spin-on deposition process.

The photoresist may be a metal-containing EUV resist. Generally speaking, conventional chemically amplified photoresist materials do not include a significant amount of metal, and do not suffer the related metallic contamination problems to the same degree. As such, while the methods herein can be practiced on any type of photoresist or other film, they may have greatest value when combating contamination from a metal-containing EUV resist. An EUV-sensitive metal or metal oxide-containing film may be deposited on a semiconductor substrate by any suitable technique, including wet (e.g., spin-on) or dry (e.g., CVD) deposition techniques. For example, described processes have been demonstrated for EUV photoresist compositions based on organotin oxides, being applicable to both commercially spin-coatable formulations (e.g., such as are available from Inpria Corp, Corvallis, OR) and formulations applied using dry vacuum deposition techniques, further described below. Though the photoresist described in the present disclosure is often described as a metal-containing EUV resist material, it will be understood that the process operations of the present disclosure may apply to any other films such as silicon-based films or carbon-based films.

Semiconductor substrates may include any material construct suitable for photolithographic processing, particularly for the production of integrated circuits and other semiconducting devices. In some embodiments, semiconductor substrates are silicon wafers. Semiconductor substrates may be silicon wafers upon which features have been created ("underlying features"), having an irregular surface topography. As referred to herein, the frontside of the substrate is a surface onto which films are intentionally deposited or that is to be exposed to EUV during processing. The backside of the substrate is opposite the frontside. Underlying features may include regions in which material has been removed (e.g., by etching) or regions in which materials have been added (e.g., by deposition) during processing prior to conducting a method of this disclosure. Such prior processing may include methods of this disclosure or other processing methods in an iterative process by which two or more layers of features are formed on the substrate.

EUV-sensitive thin films may be deposited on the semiconductor substrate, such films being operable as resists for subsequent EUV lithography and processing. Such EUV-sensitive thin films comprise materials which, upon exposure to EUV, undergo changes, such as the loss of bulky pendant substituents bonded to metal atoms in low density M-OH rich materials, allowing their crosslinking to denser M-O-M bonded metal oxide materials. Through EUV patterning, areas of the film are created that have altered physical or chemical properties relative to unexposed areas. These properties may be exploited in subsequent processing, such as to dissolve either unexposed or exposed areas, or to selectively deposit materials on either the exposed or unexposed areas. In some embodiments, the unexposed film has a more hydrophobic surface than the exposed film under the conditions at which such subsequent processing is performed. For example, the removal of material may be performed by leveraging differences in chemical composition, density and cross-linking of the film. Removal may be by wet processing or dry processing, as further described below.

The thin films are, in various embodiments, organometallic materials, for example organotin materials comprising tin oxide, or other metal oxide materials/moieties. The organometallic compounds may be made in a vapor phase reaction of an organometallic precursor with a counter reactant. In various embodiments, the organometallic compounds are formed through mixing specific combinations of organometallic precursors having bulky alkyl groups or fluoroalkyl with counter-reactants and polymerizing the mixture in the vapor phase to produce a low-density, EUV-sensitive material that deposits onto the semiconductor substrate.

In various embodiments, organometallic precursors comprise at least one alkyl group on each metal atom that can survive the vapor-phase reaction, while other ligands or ions coordinated to the metal atom can be replaced by the counter-reactants. Organometallic precursors include those of the formula:

$$M_aR_bL_c \quad \text{(Formula 1)}$$

wherein: M is an element with a high patterning radiation-absorption cross-section; R is alkyl, such as $C_nH_{2n+1}$, preferably wherein n≥3; L is a ligand, ion or other moiety which is reactive with the counter-reactant; a≥1; b≥1; and c≥1.

In various embodiments, M has an atomic absorption cross section equal to or greater than $1\times10^7$ $cm^2$/mol. M may be, for example, selected from the group consisting of tin, hafnium, tellurium, bismuth, indium, iodine, antimony, germanium, and combinations thereof. In some embodiments, M is tin. R may be fluorinated, e.g., having the formula $C_nF_xH_{(2n+1)}$. In various embodiments, R has at least one beta-hydrogen or beta-fluorine. For example, R may be selected from the group consisting of i-propyl, n-propyl, t-butyl, i-butyl, n-butyl, sec-butyl, n-pentyl, i-pentyl, t-pentyl, sec-pentyl, and mixtures thereof. L may be any moiety readily displaced by a counter-reactant to generate an M-OH moiety, such as a moiety selected from the group consisting of amines (such as dialkylamino, monoalkylamino), alkoxy, carboxylates, halogens, and mixtures thereof.

Organometallic precursors may be any of a wide variety of candidate metal-organic precursors. For example, where M is tin, such precursors include t-butyl tris(dimethylamino) tin, i-butyl tris(dimethylamino) tin, n-butyl tris(dimethylamino) tin, sec-butyl tris(dimethylamino) tin, i-propyl(tris) dimethylamino tin, n-propyl tris(diethylamino) tin, and analogous alkyl(tris)(t-butoxy) tin compounds such as t-butyl tris(t-butoxy) tin. In some embodiments, the organometallic precursors are partially fluorinated.

Counter-reactants have the ability to replace the reactive moieties, ligands or ions (e.g., L in Formula 1, above) so as to link at least two metal atoms via chemical bonding. Counter-reactants can include water, peroxides (e.g., hydrogen peroxide), di- or polyhydroxy alcohols, fluorinated di- or polyhydroxy alcohols, fluorinated glycols, and other sources of hydroxyl moieties. In various embodiments, a counter-reactant reacts with the organometallic precursor by forming oxygen bridges between neighboring metal atoms. Other potential counter-reactants include hydrogen sulfide and hydrogen disulfide, which can crosslink metal atoms via sulfur bridges.

The thin films may include optional materials in addition to an organometallic precursor and counter-reactants to modify the chemical or physical properties of the film, such as to modify the sensitivity of the film to EUV or enhancing etch resistance. Such optional materials may be introduced, such as by doping during vapor phase formation prior to deposition on the semiconductor substrate, after deposition of the thin film, or both. In some embodiments, a gentle remote $H_2$ plasma may be introduced so as to replace some Sn-L bonds with Sn—H, which can increase reactivity of the resist under EUV.

In various embodiments, the EUV-patternable films are made and deposited on the semiconductor substrate using vapor deposition equipment and processes among those known in the art. In such processes, the polymerized organometallic material is formed in vapor phase or in situ on the surface of the semiconductor substrate. Suitable processes include, for example, chemical vapor deposition (CVD), atomic layer deposition (ALD), and ALD with a CVD component, such as a discontinuous, ALD-like process in which metal precursors and counter-reactants are separated in either time or space.

In general, methods comprise mixing a vapor stream of an organometallic precursor with a vapor stream of a counter-reactant so as to form a polymerized organometallic material, and depositing the organometallic material onto the surface of the semiconductor substrate. In some embodiments, more than one organometallic precursor is included in the vapor stream. In some embodiments, more than one counter-reactant is included in the vapor stream. As will be understood by one of ordinary skill in the art, the mixing and depositing aspects of the process may be concurrent, in a substantially continuous process.

In an example continuous CVD process, two or more gas streams, in separate inlet paths, of organometallic precursor and source of counter-reactant are introduced to the deposition chamber of a CVD apparatus, where they mix and react in the gas phase, to form agglomerated polymeric materials (e.g., via metal-oxygen-metal bond formation). The streams may be introduced, for example, using separate injection inlets or a dual-plenum showerhead. The apparatus is configured so that the streams of organometallic precursor and counter-reactant are mixed in the chamber, allowing the organometallic precursor and counter-reactant to react to form a polymerized organometallic material. Without limiting the mechanism, function, or utility of present technology, it is believed that the product from such vapor-phase reaction becomes heavier in molecular weight as metal atoms are crosslinked by counter-reactants, and is then condensed or otherwise deposited onto the semiconductor substrate. In various embodiments, the steric hindrance of the bulky alkyl groups prevents the formation of densely packed network and produces porous, low-density films.

The CVD process is generally conducted at reduced pressures, such as from 10 mTorr to Torr. In some embodiments, the process is conducted at from 0.5 to 2 Torr. In some embodiments, the temperature of the semiconductor substrate is at or below the temperature of the reactant streams. For example, the substrate temperature may be from 0° C. to 250° C., or from ambient temperature (e.g., 23° C.) to 150° C. In various processes, deposition of the polymerized organometallic material on the substrate occurs at rates inversely proportional to surface temperature.

In some embodiments, the EUV-patternable films are made and deposited on the semiconductor substrate using wet deposition equipment and processes among those known in the art. For example, the organometallic material is formed by spin-coating on the surface of the semiconductor substrate.

The thickness of the EUV-patternable film formed on the surface of the semiconductor substrate may vary according to the surface characteristics, materials used, and processing conditions. In various embodiments, the film thickness may range from 0.5 nm to 100 nm, and may be a sufficient thickness to absorb most of the EUV light under the conditions of EUV patterning. For example, the overall absorption of the resist film may be 30% or less (e.g., 10% or less, or 5% or less) so that the resist material at the bottom of the resist film is sufficiently exposed. In some embodiments, the film thickness is from 5 nm to 40 nm or from 10 nm to 20 nm. Without limiting the mechanism, function, or utility of present disclosure, it is believed that, unlike wet spin-coating deposition processes, dry deposition processes present fewer restrictions on the surface adhesion properties of the substrate, and therefore can be applied to a wide variety of substrates. Moreover, as discussed above, the deposited films may closely conform to surface features, providing advantages in forming masks over substrates, such as substrates having underlying features, without "filling in" or otherwise planarizing such features.

At block 104, a cleaning process is performed to clean a backside and bevel edge of the semiconductor substrate. The backside and bevel edge clean may non-selectively etch EUV resist film to equally remove film with various levels of oxidation or crosslinking on the substrate backside and bevel edge. During application of the EUV-patternable film, either by wet deposition processing or dry deposition processing, there may be some unintended deposition of resist material on the substrate bevel edge and/or backside. The unintended deposition may lead to undesirable particles later moving to a top surface of the semiconductor substrate and becoming particle defects. Moreover, this bevel edge and backside deposition can cause downstream processing problems, including contamination of the patterning tools (scanner), development tools, and metrology tools, which can then act to contaminate other substrates. Removal of this bevel edge and backside deposition may be accomplished using wet cleaning techniques or dry cleaning techniques, alone or in combination with other techniques described herein.

The current state-of-the-art for cleaning spin-coated metal-organic photoresists is by wet-clean processing. An example is described below with reference to FIGS. 2A-2D. An edge bead removal (EBR) is performed on a wet track on both the front and the backside of a wafer. A nozzle is positioned over the edge of the wafer on both the frontside and the backside of the wafer, and solvent is dispensed while the wafer is rotating. An organic solvent (for example: PGME, PGMEA, 2-heptanone) dissolves the photoresist on the edge, cleaning the bevel edge region. If the backside is contaminated, the wafer can go to another wet clean station for backside cleaning of the wafer. For spin-coating, the wafer region contacting the chuck typically remains clean and a separate backside clean is not always used. Additional cleans such as dilute hydrofluoric acid (dHF), dilute hydrochloric acid (dHCl), dilute sulfuric acid, or standard clean 1 (SC-1) may be necessary to reduce metal contamination. Before entering the EUV scanner, a backside scrub is commonly performed.

Dry backside and bevel edge cleaning techniques may be used instead of wet techniques. Dry backside and bevel edge clean may be performed using an etch gas. The etch gas may be hydrogen gas, a hydrogen halide, hydrogen gas and a halide gas, or boron trichloride. A process chamber may be equipped with a substrate support having a plurality of minimum contact area (MCA) supports that elevate a substrate so that the etch gas can access the backside of the substrate. The substrate support may be a carrier ring, as described below in relation to FIG. 5A. The etch gas may be delivered in a first etch gas flow from below the substrate support. A gas distributor may deliver curtain gas at a center of the frontside of the substrate to limit the etch gas from reaching the center of the frontside. The gas distributor may also deliver etch gas in a second etch gas flow at a periphery of the frontside of the substrate. A heat source such as a radiative heat source may be applied on the substrate during the dry backside and bevel edge clean. The radiative heat source may be positioned below the substrate support. Backside clean and bevel edge clean are both performed in the same process chamber. In some embodiments, deposition operations and the dry backside and bevel edge clean are performed in the same process chamber. In some embodiments, post-application bake (PAB) and dry backside and bevel edge clean are performed in the same process chamber. Integration of tools/chambers in a single chamber increases throughput, reduces costs, and reduces the likelihood of contamination that would otherwise occur in between transfers.

In some embodiments, the dry clean process involves a vapor and/or plasma having one or more of the following gases: HBr, HCl, HI, $BCl_3$, $SOCl_2$, $Cl_2$, $BBr_3$, $H_2$, $O_2$, $PCl_3$, $CH_4$, methanol, ammonia, formic acid, $NF_3$, HF. In some embodiments, the dry clean process may use the same chemistries as a dry development process described herein. For example, the backside and bevel edge clean may use hydrogen halide development chemistry. For the backside and bevel edge clean process, the vapor and/or the plasma has to be limited to a specific region of the substrate to ensure that only the backside and the bevel edge deposits are removed, without any film degradation on a frontside of the substrate.

Process conditions may be optimized for backside and bevel edge clean. In some embodiments, higher temperature, higher pressure, and/or higher reactant flow may lead to increased etch rate. Suitable process conditions for a dry bevel edge and backside clean may be: reactant flow of 100-10000 sccm (e.g., 500 sccm HCl, HBr, HI or $H_2$ and $Cl_2$, $Br_2$, or $I_2$, $BCl_3$, or $H_2$), temperature of 20° C. to 120° C. (e.g., 100° C.), pressure of 20 mTorr to atmospheric pressure (e.g., 300 mTorr), plasma power of 0 W to 500 W at high frequency (e.g., 13.56 MHz), and for a time of about 10 to 150 seconds, dependent on the photoresist film and composition and properties. It should be understood that while these conditions are suitable for some processing reactors, e.g., a Kiyo etch tool available from Lam Research Corporation, Fremont, CA, a wider range of process conditions may be used according to the capabilities of the processing reactor.

Though the backside and bevel edge clean in block 104 is depicted prior to PAB treatment in block 106, it will be understood that the backside and bevel edge clean of block 104 may be performed at any stage during the process 100 after deposition of the photoresist in block 102 and prior to development in block 112. Hence, the backside and bevel edge clean of block 104 may be performed after photoresist deposition, after PAB treatment, after EUV exposure, or after PEB treatment. As discussed further below, an additional backside and bevel edge clean may be performed later in process 100, for example as described in relation to block 118. The first backside and bevel edge clean operation in block 104 targets removal of unwanted deposition originating from photoresist deposition in block 102, while the second backside and bevel edge clean operation in block 118 targets removal of unwanted contamination that is generated during photoresist development in block 112. In some embodiments, one or both of the backside and bevel edge cleaning operations 104 and 118 may be omitted.

The wet or dry backside and bevel edge cleaning operation may alternatively be extended to a full photoresist removal or photoresist "rework" in which an applied EUV photoresist is removed and the semiconductor substrate prepared for photoresist reapplication, such as when the original photoresist is damaged or otherwise defective. Photoresist rework should be accomplished without damaging the underlying semiconductor substrate, so an oxygen-based etch should be avoided. Instead, variants of halide-containing chemistries as described herein may be used. It will be understood that the photoresist rework operation may be applied at any stage during the process 100. Thus, the photoresist rework operation may be applied after photoresist deposition, after the first or second bevel edge and backside clean, after PAB treatment, after EUV exposure, after PEB treatment, after development, after PDB treatment, after a chemical, plasma, and/or light treatment. In some embodiments, the photoresist rework may be performed for non-selective removal of exposed and unexposed regions of the photoresist but selective to an underlayer.

In some embodiments, the photoresist rework process involves a vapor and/or plasma having one or more of the following gases: HBr, HCl, HI, $BCl_3$, $Cl_2$, $BBr_3$, $H_2$, $PCl_3$, $CH_4$, methanol, ammonia, formic acid, $NF_3$, HF. In some embodiments, the photoresist rework process may use the same chemistries as a dry development process described herein. For example, the photoresist rework may use hydrogen halide development chemistry.

Process conditions may be optimized for the photoresist rework. In some embodiments, higher temperature, higher pressure, and/or higher reactant flow may lead to increased etch rate. Suitable process conditions for a photoresist rework may be: reactant flow of 100-500 sccm (e.g., 500 sccm HCl, HBr, HI, $BCl_3$ or $H_2$ and $Cl_2$ or $Br_2$), temperature of −10 to 140° C. (e.g., 80° C.), pressure of 20-1000 mTorr (e.g., 300 mTorr), plasma power of 300 W to 800 W (e.g., 500 W) at high frequency (e.g., 13.56 MHz), wafer bias of 0 to 200 $V_b$ (a higher bias may be used with harder underlying substrate materials) and for a time of about 20 seconds to 3 minutes, sufficient to completely remove the EUV photoresist, dependent on the photoresist film and composition and properties. In some embodiments, photoresist rework can be performed without application of plasma. The photoresist rework can be performed thermally with a halide-containing gas such as a hydrogen halide (e.g., HBr) at elevated temperatures (e.g., between 80° C.-120° C.). It should be understood that while these conditions are suitable for some processing reactors, e.g., a Kiyo etch tool available from Lam Research Corporation, Fremont, CA, a wider range of process conditions may be used according to the capabilities of the processing reactor.

At block 106 of the process 100, an optional post-application bake (PAB) is performed after deposition of the EUV-patternable film and prior to EUV exposure and/or after performing backside and bevel edge clean. The PAB treatment may involve a combination of thermal treatment, chemical exposure, and moisture to increase the EUV sensitivity of the EUV-patternable film, reducing the EUV dose to develop a pattern in the EUV-patternable film. The PAB treatment temperature may be tuned and optimized for increasing the sensitivity of the EUV-patternable film. For example, the treatment temperature may be between about 90° C. and about 200° C. or between about 150° C. and about 190° C. In some embodiments, the PAB treatment may be conducted with gas ambient flowing in the range of 100-10000 sccm, moisture content in the amount of a few percent up to 100% (e.g., 20%-50%), a pressure between atmospheric and vacuum, and a treatment duration of about 1 to 15 minutes, for example about 2 minutes. In some embodiments, the PAB treatment is conducted at a temperature between about 100° C. to 200° C. for about 1 minute to 2 minutes.

At block 108 of the process 100, the metal-containing EUV resist film is exposed to EUV radiation to develop a pattern. Generally speaking, the EUV exposure causes a change in the chemical composition and cross-linking in the metal-containing EUV resist film, creating a contrast in etch selectivity that can be exploited for subsequent development.

The metal-containing EUV resist film may then be patterned by exposing a region of the film to EUV light, typically under relatively high vacuum. EUV devices and imaging methods among those useful herein include methods known in the art. In particular, as discussed above, exposed areas of the film are created through EUV patterning that have altered physical or chemical properties relative to unexposed areas. For example, in exposed areas, metal-carbon bond cleavage may occur via beta-hydride elimination, leaving behind reactive and accessible metal hydride functionality that can be converted to hydroxide and cross-linked metal oxide moieties via metal-oxygen bridges, which can be used to create chemical contrast either as a negative tone resist or as a template for hard mask. In general, a greater number of beta-H in the alkyl group results in a more sensitive film. Following exposure, the metal-containing EUV resist film may be baked, so as to cause additional cross-linking of the metal oxide film. The difference in properties between exposed and unexposed areas may be exploited in subsequent processing, such as to dissolve unexposed areas or to deposit materials on the exposed areas. For example the pattern can be developed using a dry method to form a metal oxide-containing mask. Methods and apparatus among those useful in such processes are described in PCT Patent Application PCT/US2019/067540, filed Dec. 19, 2019, incorporated by reference herein for its disclosure of the methods and apparatus.

In particular, in various embodiments, the hydrocarbyl-terminated tin oxide present on the surface is converted to hydrogen-terminated tin oxide in the exposed region(s) of an imaging layer, particularly when the exposure is performed in a vacuum using EUV. However, removing exposed imaging layers from vacuum into air, or the controlled introduction of oxygen, ozone, $H_2O_2$, or water, can result in the oxidation of surface Sn—H into Sn—OH. The difference in properties between exposed and unexposed regions may be exploited in subsequent processing, such as by reacting the irradiated region, the unirradiated region, or both, with one or more reagents to selectively add material to or remove material from the imaging layer.

Without limiting the mechanism, function or utility of present technology, EUV exposure, for example, at doses of from 10 mJ/cm$^2$ to 100 mJ/cm$^2$, may alleviate steric hindrance and provide space for the low-density film to collapse. In addition, reactive metal-H bond generated in the beta-hydride elimination reactions can react with neighboring active groups such as hydroxyls in the film, leading to further cross-linking and densification, and creating chemical contrast between exposed and unexposed region(s).

Following exposure of the metal-containing EUV resist film to EUV light, a photopatterned metal-containing EUV resist is provided. The photopatterned metal-containing EUV resist includes EUV-exposed and unexposed regions.

At block 110 of the process 100, an optional post-exposure bake (PEB) is performed to further increase contrast in etch selectivity of the photopatterned metal-containing EUV resist. The photopatterned metal-containing EUV resist is thermally treated in the presence of various chemical species to facilitate cross-linking of the EUV-exposed regions of the photopatterned metal-containing EUV resist.

In various embodiments, a bake strategy involves careful control of the bake ambient, introduction of reactive gases, and/or careful control of the ramping rate of the bake temperature. Examples of useful reactive gases include e.g., air, $H_2O$, $H_2O_2$ vapor, $CO_2$, CO, $O_2$, $O_3$, $CH_4$, $CH_3OH$, $N_2$, $H_2$, $NH_3$, $N_2O$, NO, alcohol, acetyl acetone, formic acid, Ar, He, or their mixtures. The PEB treatment is designed to (1) drive complete evaporation of organic fragments that are generated during EUV exposure and (2) oxidize the metal hydride species (the other product from the beta-H elimination reaction during EUV exposure) into metal hydroxide, and (3) facilitate cross-linking between neighboring —OH groups and form a cross-linked metal oxide network. The bake temperature is carefully selected to achieve optimal EUV lithographic performance. Too low a PEB temperature would lead to incomplete removal of organic fragments as well as insufficient cross-linking, and consequently less chemical contrast for development at a given dose. Too high a PEB temperature would also have detrimental impacts, including severe oxidation and film shrinkage in the unexposed region (the region that is removed by development of the patterned film to form the mask in this example), as well as, undesired interdiffusion at the interface between the photopatterned metal-containing EUV resist and an underlayer, both of which will contribute to loss of chemical contrasts and an increase in defect density due to insoluble scum. The PEB treatment temperature may be between about 100° C. and about 300° C., between about 170° C. and about 290° C., or between about 200° C. and about 240° C. In some embodiments, the PEB treatment may be conducted with gas ambient flowing in the range of 100-10000 sccm, moisture content in the amount of a few percent up to 100% (e.g., 20%-50%), a pressure between atmospheric and vacuum, and a treatment duration of about 1 to 15 minutes, for example about 2 minutes. In some embodiments, PEB thermal treatments may be repeated to further increase etch selectivity.

At block 112 of the process 100, the photopatterned metal-containing EUV resist is developed to form a resist mask. In various embodiments, the exposed regions are removed (positive tone) or the unexposed regions are removed (negative tone). In some embodiments, development may include selective deposition on either the exposed or unexposed regions of the photopatterned metal-containing EUV resist, followed by an etching operation. In various embodiments, these processes may be dry processes or wet processes. Examples of processes for development involve an organotin oxide-containing EUV-sensitive photoresist thin film (e.g., 10-30nm thick, such as 20 nm), subjected to a EUV exposure dose and post-exposure bake, and then developed. The photoresist film may be, for example, deposited based on a gas phase reaction of an organotin precursor such as isopropyl(tris)(dimethylamino)tin and water vapor, or may be a spin-on film comprising tin clusters in an organic matrix.

The photopatterned metal-containing EUV resist is developed by exposure to a development chemistry. In some embodiments, the development chemistry includes a halide-containing chemistry. For instance, bromine-containing chemistry, chlorine-containing chemistry, and/or fluorine-containing chemistry may be used. In various embodiments, the halide-containing chemistry is a hydrogen halide such as HBr, HCl, HI, and HF. Dry development techniques are further discussed in PCT Patent Application No. PCT/US2020/039615, filed Jun. 25, 2020, which is herein incorporated by reference in its entirety.

The development operation at block 112 may be optimized in certain embodiments. Such optimizations may be particularly useful in the case where dry development techniques are used. The optimization may be done to reduce metal and/or metal halide outgassing from the photoresist on the substrate, which may deposit on the backside and bevel edge area of the substrate. Certain optimization techniques may promote removal of the potentially contaminating species, while other techniques may passivate the contaminating species to reduce their ability to outgas during downstream outgassing. The various optimizations described herein can be combined as desired for a particular application.

In various embodiments, the photoresist development operation at block 112 may be optimized by performing the development in a heated processing chamber. Such heating reduces the overall byproduct condensation/accumulation in the chamber, which results in less unwanted byproduct deposition on the substrate. In various embodiments, the processing chamber and/or showerhead are maintained at an elevated temperature, for example about 40° C. or higher, or about 65° C. or higher, or about 80° C. or higher, or about 100° C. or higher. In these or other cases, the processing chamber and showerhead may be maintained at a maximum temperature of about 300° C. or less, or about 250° C. or less, or about 200° C. or less, or about 150° C. or less, or about 100° C. or less, or about 80° C. or less. In some cases, the temperature is actively controlled and changed during dry development. In some such cases, the temperature is actively increased during dry development. In other such cases, the temperature is actively decreased during dry development.

In these or other embodiments, the photoresist development operation at block 112 may be optimized by performing a high temperature purge step in inert atmosphere at reduced pressure. The purge step may be performed at the end of the photoresist development operation in block 112, or immediately afterwards, in the same processing chamber in which the development operation occurs. Example gases that may be provided to establish an inert atmosphere include, e.g., Ar, He, $N_2$, Kr, Xe, and $H_2$. Combinations of such gases can also be used. Example gas flow rates may be between about 200-10,000 sccm. The purge may have a duration between about 1-10 minutes, in some cases at least about 2 minutes, or at least about 5 minutes. The purge step may be performed at a pressure between about 5 mTorr and about 10 Torr. In some cases, the pressure may be at least about 10 mTorr. In these or other embodiments, the pressure may be about 1 Torr or less. The temperature during the purge step (e.g., the temperature of the processing chamber, the showerhead, and/or the substrate support) may be maintained at an elevated temperature, for example about 100° C. or greater, or about 120° C. or greater. In some cases, the processing chamber may be maintained at a temperature between about 100-250° C., or between about 100-300° C., and the substrate support may be maintained at a temperature between about 120-250° C., or between about 120-300° C.

In these or other embodiments, a pump purge sequence may be used toward the end of the development process in block 112, or immediately afterward. Such a process may involve one or more cycles of pumping the processing chamber down to a reduced pressure, and sweeping the processing chamber with inert gas. This pumping and purging increases the efficiency of halogen and metal halide removal from the substrate and chamber.

In these or other cases, the optimization may involve a thermal treatment, such as a bake step described below in relation to block 114. In these or other cases, the optimization may involve a chemical, plasma, and/or light treatment, such as the treatment operations described below in relation to block 116. As such, the operations described in relation to blocks 114 and/or 116 may overlap with the photoresist development operation in block 112, in some cases toward the end of the development operation. In other embodiments, the operations of blocks 114 and/or 116 may occur after the photoresist development operation of block 112 is completed.

At block 114, the substrate is exposed to a post-development bake (PDB). The PDB occurs after some or all of the photoresist is developed in block 112. Although this step is referred to as a "post-development bake," it is understood that this step may also overlap with the development step to some degree, as explained above.

Much like the photoresist deposition step in block 102, the photoresist development step in block 112 can cause metal and metal halide contamination on the backside and bevel edge of the substrate. As mentioned above, in many cases the development is done using halide-containing chemistry such as HBr. In some cases, the halide chemistry reacts with the metal in the photoresist, partially dissolving the photoresist and causing formation of metal halides and/or other metal-containing species that can redeposit on the substrate, for example on the backside and bevel edge of the substrate. Such contamination is detrimental for the reasons described above, including continual outgassing and contamination of other substrates and downstream processing equipment and metrology tools.

The PDB treatment may involve a combination of thermal treatment, optional chemical exposure, optional plasma exposure, and optional light exposure (discussed further in relation to block 116) to reduce the likelihood of metal and metal halide outgassing during downstream processing. The thermal treatment involves exposing the substrate to elevated temperatures. For example, the substrate may be baked at a temperature between about 160-300° C., for a duration between about 1-10 minutes. In some cases the temperature may be maintained between about 160-250° C., or between about 160-220° C. Such baking may involve heating the substrate support, processing chamber, showerhead, and/or processing gases. In some cases, the walls of the processing chamber may be heated and/or maintained at an elevated temperature. Example temperatures for the chamber walls may be between about 20-120° C. In some cases, the pressure during the PDB treatment may be maintained between a minimum of about 0.01 Torr or 0.1 Torr, and a maximum about 1 Torr, 10 Torr, or atmospheric pressure (e.g., about 760 Torr). Example processing gases that may be provided to the processing chamber during the PDB treatment include, but are not limited to, $N_2$, a mixture of $N_2/O_2$, He, Ar, Xe, $H_2$, chlorine-containing gases, fluorine-containing gases, oxygen-containing gases, and combinations thereof. Example chlorine-, fluorine-, and oxygen-containing gases are discussed below. Example flow rates are between about 200-10,000 sccm.

The PDB treatment desorbs physisorbed metal halide species (e.g., $SnBr_x$ and/or other tin halides or metal halides in various embodiments) from the substrate surface. However, the PDB treatment may be ineffective in completely removing the metal halide species from the relevant portions of the substrate (e.g., backside and bevel edge region), and chemisorbed halide species (e.g., metal halide species) may remain on the substrate after the PDB treatment. Further, the metal-containing photoresist on the frontside of the substrate continues to be a source for further outgassing and related contamination. In various embodiments, the remaining chemisorbed species/contamination may be removed in a wet clean operation described below in block 118.

In some embodiments, the PDB treatment is a thermal treatment that does not involve exposing the substrate to reactive chemistry or plasma. In cases where no reactive chemistry or plasma is used in connection with the PDB treatment in block 114, the use of the above-described pumping and purging sequence is particularly beneficial in reducing contamination on the substrate. In embodiments where the PDB treatment is a thermal treatment and no further cleaning steps are used (e.g., where blocks 116 and 118 are omitted), outgassing may still be an issue over longer timeframes, for example several days. In such embodiments, the queue time for a particular substrate after the substrate is exposed to the PDB treatment in block 114 and before the substrate is used for further processing may be controlled, for example using a maximum queue time of about 1 day, about 2 days, about 3 days, or about 5 days. This control of queue time limits the amount of outgassing/recontamination that originates from each substrate, thereby limiting contamination on the substrate, nearby substrates, and downstream processing equipment and metrology tools. Without wishing to be bound by theory or mechanism of action, it is believed that the mechanism of recontamination is a surface hopping or diffusion mechanism. Additional pump purge sequences, as well as queue time control, can limit such recontamination. Of course, while such techniques are especially beneficial in embodiments where the substrate is not subjected to further cleaning after the PDB treatment, it is understood that the pump purge sequence, as well as queue time control, may also be used in other embodiments where further cleaning steps are used. Further, such a pump purge sequence may be performed at any time during the method of FIG. 1, for example in connection with the operations in blocks 112, 114, and/or 116.

In some embodiments, the PDB treatment of block 114 may involve exposing the substrate to reactive chemistry, plasma, and/or light, as described in relation to block 116. In some other embodiments, the operations described in relation to block 116 may occur after the PDB treatment of block 114. As mentioned above, the PDB treatment of block 114 may also overlap with the photoresist development step in block 112. As such, it is understood that the operations of block 116 may also overlap with those of block 112. In other cases, the substrate may be exposed to chemical treatment, plasma treatment, and/or light treatment in operation 116 after the operations of blocks 112 and/or 114 are completed, for example in the same or different processing chamber where the operations of blocks 112 and/or 114 occur.

Block 116 involves optionally exposing the substrate to a chemical treatment, a plasma treatment, and/or a light treatment. Such treatments may be combined as desired for a particular application. In some cases, the treatment is intended to alter a metal-containing species (e.g., a metal or metal halide) such that it becomes more volatile, thereby allowing the metal-containing species to be removed from the substrate and processing chamber via a vacuum connection. Such treatments benefit from relatively high temperatures and low pressures (e.g., which may involve one or more purges) to promote removal of the volatile species.

One technique for accomplishing this increased volatility is to expose the substrate to chlorine-containing chemistry (e.g., one or more of $BCl_3$, $Cl_2$, HCl, $SiCl_4$, $SOCl_2$, and $PCl_3$). This technique is particularly beneficial in cases where the photoresist was developed in block 112 using bromine-based chemistry such as HBr. Exposure of the substrate to the chlorine-containing chemistry in block 116 results in formation of species (e.g., metal chlorides) that are more volatile than the previously existing contamination species (e.g., metals and metal bromides). Another technique for achieving increased volatility is to expose the substrate to hydrogen (e.g., $H_2$) at relatively high temperatures, e.g., at least about 200° C., or at least about 250° C. The chemical exposure may have a duration between about 1-10 minutes. Increasing the volatility of the contamination species promotes removal of the contamination species from the substrate and processing chamber. In various embodiments where the substrate is exposed to a chemical treatment, plasma treatment, and/or light treatment, the processing chamber may be purged (e.g., using the purge and/or pump purge sequences described above) after the treatment.

In some cases, the treatment of block 116 is intended to alter a metal-containing species such that it becomes more stable, thereby decreasing the risk that such species outgases to cause contamination. One technique for accomplishing this increased stability is to expose the substrate to oxygen-containing chemistry (e.g., one or more of $O_2$, $O_3$, $H_2O$, $SO_2$, $CO_2$, CO, COS, $NO_x$ (e.g., such as $NO_2$, NO, and $N_2O$), and $H_2O_2$ vapor) to form metal oxides from the metal halides. Another technique for accomplishing the increased stability is to expose the substrate to fluorine-containing chemistry (e.g., one or more of HF, $C_xF_yH_z$, $NF_3$, $SF_6$, and $F_2$) to form metal fluorides from other metal halides such as metal bromides or metal chlorides. Other chemistry that may be used to promote stability of the metal-containing species include, but are not limited to, $NH_3$ (particularly useful at high temperatures such as above about 200° C.), HI, and $I_2$.

In certain implementations where block 116 involves a chemical treatment, the process gas(es) may flow at a rate between about 200-10,000 sccm. Example exposure times are between about 1-10 minutes. Example temperatures (e.g., for one or more of the substrate support, chamber, showerhead, process gases, etc.) may be between about 20-150° C.

In various embodiments, the treatment of block 116 involves exposing the substrate to plasma. The plasma treatment may act to suppress outgassing and the related contamination mechanism. In many cases, the plasma is a remotely generated plasma that is delivered to the processing chamber. In other cases, a direct plasma may be generated in situ with the substrate. The plasma is generated from a plasma generation gas. Various plasma generation gases may be used, including, e.g., any one or more of $H_2$, $N_2$, Ar, He, Kr, Xe, $CH_4$, oxygen-based gases (e.g., $O_2$, $O_3$, CO, $CO_2$, COS, $SO_2$, $NO_x$, $H_2O$), fluorine-based gases (e.g., $NF_3$, $C_xF_y$ (e.g., $CF_4$, etc.), $C_xH_yF_z$ (e.g., $CH_3F_3$, $CH_2F_2$, $CHF_3$, etc.), $F_2$, $SF_6$), chlorine-based gases (e.g., one or more of $BCl_3$, $Cl_2$, HCl, $SiCl_4$, $SOCl_2$, and $PCl_3$), and hydrogen halides (e.g., HBr, HI, etc.). In some particular embodiments, the plasma generation gas may include a mixture of $H_2/N_2$, a mixture of $H_2$/Ar, a mixture of $H_2$/He, a mixture of $H_2$/Kr, a mixture of $H_2$/Xe, a mixture of $H_2/CH_4$, a mixture of $CH_4/O_2$, a mixture of one or more oxygen-based gas with an inert gas, a mixture of one or more fluorine-based gas with an inert gas, or a mixture of one or more chlorine-based gas with an inert gas. Example flow rates for the plasma generation gas may be between about 50-10,000 sccm. In some cases the flow rate is at least about 100 sccm. In these or other cases, the flow rate may be about 5,000 sccm or less. In some cases where an oxygen-containing plasma is used, the duration of the plasma exposure may be particularly short (e.g., between about 1-30 seconds, or between about 1-5 seconds), sometimes referred to as a flash, in order to prevent the oxygen-containing plasma from attacking any exposed carbon-based materials such as a carbon-containing underlayer.

During the plasma treatment of block 116, the pressure in the processing chamber may be maintained as low as about 5 mTorr and as high as about 10 Torr. In some cases the pressure is between about 5-300 mTorr, for example in embodiments where the processing chamber includes or is in fluidic communication with a turbo pump. In some cases the pressure is between about 100 mTorr and about 10 Torr, for example in embodiments where the processing chamber is or includes a rough pump. Higher pressures (e.g., 100 mTorr to 10 Torr) may be beneficial in minimizing damage to the substrate as a result of the plasma exposure. In some cases where the plasma treatment is targeted to passivate the contaminating species, relatively higher pressures may be used, for example between about 0.1-10 Torr, or between about 0.1-5 Torr. The substrate may be exposed to the plasma for a duration between about 1-120 seconds. The plasma may be generated at one or more frequencies, for example a low frequency at about 13.6 kHz, and a high frequency at about 10 MHz. Other frequencies may be used as well, for example 400 kHz, 1 MHz, 2 MHz, 27 MHz, 60 MHz, etc. The plasma may be generated using an RF power between about 50-300 W, for example in cases where the plasma is a transformer coupled plasma or a capacitively coupled plasma generated in situ. The plasma may be generated at these or even higher powers (e.g., about 3000 W or less, in some cases between about 1000-3000 W) in cases where the plasma is generated remotely, for example using a microwave plasma source in a microwave strip chamber. The duty cycle of the plasma (e.g., a TCP plasma) may be between about 10%-100% CW.

In some cases, for example where the plasma is generated in situ (e.g., TCP or CCP), the pressure may be between about 5-300 mTorr, the temperature of the processing chamber, showerhead, substrate support, etc. may be between about 20-140° C., and the plasma may be generated at an RF power between about 50-300 W. In some other cases, for example where the plasma is generated remotely (e.g., in a microwave strip chamber, sometimes referred to as MWS), the pressure may be between a minimum of about 100 mTorr and a maximum of about 10 Torr or 1 Torr, the temperature of the processing chamber, showerhead, substrate support, etc. may be between about 100-300° C., and the plasma may be generated at a power of about 500-3000 W.

In various embodiments where the plasma is generated remotely, the following conditions may be used. The pressure in the processing chamber is maintained between about 0.1-1 Torr, process gases are flowed at a rate between about 50-5000 sccm, the substrate is exposed to the remote plasma for a duration between about 3-30 seconds, and the remote plasma is generated from a hydrogen-containing gas (e.g., $H_2$, or $H_2$ in combination with one or more of $N_2$, Ar, He, Kr, or Xe). Example power levels, frequencies, and other plasma generation conditions are discussed further above and below.

In some cases, the plasma treatment may promote removal of a metal or metal halide species. In some such cases, the plasma treatment may alter the contamination species to form a more volatile species. In other cases, the plasma treatment may promote formation of more stable species from the metal or metal halide species. As described above, formation of more volatile species may reduce outgassing/contamination by removing the contaminating species from the substrate/chamber, while formation of more stable species may reduce outgassing/contamination by reducing the likelihood that such species are able to volatilize during downstream processing or queue time.

In various implementations, the plasma generation gas includes at least $H_2$ (e.g., in some cases $H_2/N_2$, $H_2$/Ar, $H_2$/He etc.). The addition of a gentle $H_2$ plasma treatment enables a reduction in the amount of chemisorbed metal halide (e.g., tin bromide in some cases) on the substrate backside and bevel edge region. This allows for an increased maximum queue time after treatment, before the substrate is used for further processing. The maximum queue time is based on the rate at which the contamination species are outgassing and the maximum acceptable concentration of the contamination. In some cases, exposure of the substrate to plasma generated from $H_2/N_2$ or $H_2$/inert gas, in combination with the wet clean operations described below in relation to block 118, provide a metal concentration (e.g., on the substrate backside and bevel edge region) that is about 1E10 atoms/$cm^2$ or less. Such results are highly desirable. Further, such treatments have been shown to achieve these results without causing undesirable damage to the photoresist pattern and other materials on the front surface of the substrate.

In some implementations, the plasma generation gas includes at least one oxygen-containing species such as those provided above. The oxygen-containing species may react with the metal or metal halide to form a metal oxide. In some implementations, the plasma generation gas includes at least one fluorine-containing species such as those listed above. The fluorine-containing species may react with the metal or metal halide (e.g., metal bromide in some cases) to form a metal fluoride. The metal oxide and metal fluoride may be more stable than the previously existing contamination species, thereby reducing the risk of outgassing and related contamination.

In various embodiments, the treatment in block 116 involves exposing the substrate to light. The duration of the light exposure may be between about 1-120 s. In some cases, the light is provided as part of a rapid thermal anneal that involves exposing the substrate to a relatively high temperature (e.g., between about 250-400° C.) for a relatively short period of time (e.g., about 60 seconds or less). In certain cases, a similar rapid thermal anneal process may be provided without substantial light exposure. The light may be provided by a lamp or a collection of LEDs, either of which may provide light at UV wavelengths, visible wavelengths, and/or IR wavelengths. In some particular cases, a lamp that provides UV light is used. In these or other cases, LEDs that provide visible light are used. The LEDs may be provided in a substrate support or other structure. In some cases, the light exposure may take place using a module dedicated to such exposure. In other cases, the light exposure may take place in a processing chamber that is also used for other purposes, such as one or more operations in FIG. 1. In various embodiments, the light exposure of block 116 may be done using a LUMIER™ module, available from Lam Research of Fremont, CA. In some cases, the PDB treatment in block 114 may likewise occur using such a module. Other apparatus may also be used.

Returning to the embodiment of FIG. 1, the method continues with block 118, where a wet clean is performed to remove contamination from the backside and bevel edge region of the substrate. Generally, details provided above related to wet cleaning in block 104 may also apply to wet cleaning in block 118. While the wet cleaning in block 104 targets contamination that occurs during deposition of the photoresist in block 102, wet cleaning in block 118 targets contamination that occurs during development of the photoresist.

In some embodiments, the wet cleaning in block 118 involves exposing relevant portions of the substrate to one or more of dilute HF, dilute HCl, or standard clean 1 (SC-1, a mixture of $NH_4OH$:$H_2O_2$:$H_2O$). In many cases, a two-step wet clean process is used, with the first step involving exposure of the substrate to dilute HF, and the second step involving exposure of the substrate to standard clean 1 or dilute HCl. The dilute HF may be up to about 49% HF (by weight), which corresponds to a commercially available HF solution. This solution may be diluted up to about 1:1000 (by volume), for example with water. The dilute HCl may be up to about 4% HCl (by weight), and may be diluted up to about 1:100 (by volume) with water, in some cases up to about 1:10 (by volume) with water. Each wet clean step may have a duration between about 20-300 seconds. The substrate and/or the solution used to treat the substrate may be maintained at a temperature between about 15-60° C. Example flow rates for the solution may be between about 1-3 L/min.

Experimental results, shown in the accompanying figures, illustrate that the wet clean process is very effective in reducing the concentration of metals/metal halides on the backside of the substrate, thereby preventing such metals from outgassing and causing contamination issues. The wet clean process is particularly effective when combined with one or more of the optimizations described in relation to photoresist development in block 112, one or more of the baking strategies described in relation to the PDB treatment of block 114, and/or one or more of the treatment strategies described in relation to block 116.

Another technique that may be used to minimize metal outgassing and contamination involves periodically cleaning the process chamber(s) used to process the substrates. As described above, the various operations described in FIG. 1 may be performed on one or more apparatus, each of which includes a processing chamber. Any or all of these processing chambers should be periodically cleaned to remove metal-containing contamination from the interior surfaces of the processing chamber. Such chamber cleaning helps reduce re-deposition of contamination species on later processed substrates. In some cases, the chamber cleaning may be as frequent as once per substrate. For instance, the chamber may be cleaned after each substrate is processed. In other cases, this frequency may be lower, for example every 2 substrates, or every 5 substrates, or every substrates. Different processing chambers may benefit from cleaning at different frequencies, depending on the processes occurring in the relevant chamber. Method for dry chamber cleaning are further discussed in PCT Application No. PCT/US2020/070187, filed Jun. 25, 2020, which is herein incorporated by reference in its entirety.

In various embodiments, cleaning a relevant processing chamber involves exposing the chamber to gas chemistry and/or plasma that provides H radicals. The H radicals react with the metal, for example forming metal hydrides. In a particular example, the metal is tin and exposure of the chamber to plasma results in formation of $Sn_xH_y$ species. Chamber cleaning typically occurs without a substrate present in the chamber to avoid damaging the substrate and materials thereon. In some cases, the cleaning happens automatically, and may be referred to as a waferless automatic cleaning process (WAC). The chamber pressure during chamber cleaning may be between about Torr, for example between about 0.3-9 Torr. The pressure may be varied between multiple pressures while the processing gas is provided. In some cases, the pressure is varied between a lower pressure (e.g., about 1 Torr or less, in some cases about 0.5 Torr) and a higher pressure (e.g., about 5 Torr or greater, in some cases about 9 Torr). The pressure may be varied as part of a pump and purge sequence. Example processing gases may include, but are not limited to, $H_2$, other hydrogen-containing species that produce H radicals, $N_2$, $O_2$, $N_2$+$O_2$, Ar, and other inert gases. In some cases, the chamber is cleaned without exposure to plasma. In other cases where plasma is used, the plasma may be remotely generated and delivered to the chamber being cleaned, or it may be directly generated in situ in the chamber being cleaned. In some embodiments, the plasma is generated from a mixture of $CH_4$ and $O_2$ or $NH_3$ and $O_2$. The plasma may be generated at one or more frequency, such as a low frequency between about 13.56 kHz and/or a high frequency between about 10 MHz. Other frequencies may be used as well, for example 400 kHz, 1 MHz, 2 MHz, 27 MHz, 60 MHz, etc. The plasma may be generated using an RF power between about 300-4000 W. The plasma may have a duty cycle between about 10% to CW. The processing chamber, substrate support, showerhead, etc. may be maintained at a temperature between about during cleaning. In some embodiments, one or more particular heat source may be used to heat one or more of the processing chamber, substrate support, showerhead, etc. while the chamber is being cleaned. For instance, in some cases an IR heat source may be used. In these or other embodiments, an LED chuck/substrate support may be used. Other heating sources may be used as appropriate.

In some cases, for example where the plasma is generated in situ (e.g., TCP or CCP), the pressure may be between about 5-300 mTorr, the temperature of the processing chamber, showerhead, substrate support, etc. may be between about 20-140° C., and the plasma may be generated at an RF power between about 50-300 W. In some other cases, for example where the plasma is generated remotely (e.g., in MWS or other remote plasma chamber), the pressure may be between about 100 mTorr and about 10 Torr, the temperature of the processing chamber, showerhead, substrate support, etc. may be between about 100-300° C., and the plasma may be generated at a power of about 1000-4000 W, for example between about 1000-3000 W.

In some other embodiments, a dry cleaning process such as the one described above in relation to block 104 may be used instead of, or in addition to, the wet cleaning process in block 118.

In many cases, a substrate treated using the techniques described herein provides a metal concentration of about 1E11 atoms/$cm^2$ or less, for example about 1E10 atoms/$cm^2$ or less on a backside and/or bevel edge area of the substrate. In various embodiments, the techniques described herein may be used to decrease the concentration of metal on the backside and/or bevel edge region of a substrate to a level that is 1, 2, or even 3 orders of magnitude lower than would otherwise be achieved in the absence of such techniques (e.g., where the development operation in block 112 is a conventional dry development and the operations in blocks 114, 116, and 118 are omitted). In some cases, the operations described in blocks 114, 116, and 118 operate to decrease the concentration of metal on the backside and/or bevel edge area of the substrate, as compared to the concentration present after the development step at block 112.

In some cases, an existing apparatus may be modified to perform one or more processes described herein. For instance, an apparatus used for developing the photoresist (e.g., using dry or wet techniques) may be modified to include any one or more of the following features: (1) a substrate support configured to reach the elevated temperatures described herein; (2) plumbing to provide appropriate gases for treating the substrate via chemical treatment or plasma treatment; (3) a plasma generator configured to provide plasma to the processing chamber; (4) one or more light source configured to provide UV, visible, and/or IR radiation on the substrate; and/or (5) a controller configured to cause any of the methods described herein. Similarly, an apparatus used for baking a substrate may be modified to include any one or more of these features.

With reference to FIG. 1, in some embodiments the photoresist is developed in block 112 in a first processing chamber, the PDB treatment is performed in block 114 in a second processing chamber, the chemical, plasma, and/or light treatment in block 116 is performed in a third processing chamber, and the wet clean is performed in a fourth processing chamber. In other embodiments, some of these steps are combined in a single processing chamber. For instance, developing the photoresist in block 112 and performing the PDB in block 114 may occur in a first processing chamber, the treatment in block 116 may occur in a second chamber, and the wet cleaning may occur in a third chamber. In another embodiment, developing the photoresist in block 112, performing the PDB in block 114, and performing the treatment in block 116 all occur in a first chamber, and the wet clean in block 118 occurs in a second chamber. The chamber used to perform the PDB in block 114 may be the same or different chamber used to perform the PAB in block 106 and/or the PEB in block 110. In various embodiments, any two or more of the chambers described herein may be combined in a multi-chamber apparatus/tool that serves multiple purposes. Appropriate substrate handling equipment, loadlocks, etc. may be provided to transfer the substrate between chambers as needed. Further, a controller may be provided to control the process operations as described herein. In a particular embodiment, the multi-chamber apparatus includes at least one chamber configured for dry processing (e.g., vapor-based/plasma-based processing, for example to perform one or more of the operations in blocks 112, 114, and 116) and at least one chamber configured for wet processing (for example to perform the cleaning operation in block 118).

FIGS. 2A-2D show cross-sectional schematic illustrations of various processing stages of a backside and bevel edge clean using wet clean techniques. These techniques may be used in connection with the wet clean techniques described in relation to blocks 104 and 118, for example.

Figure 2A:
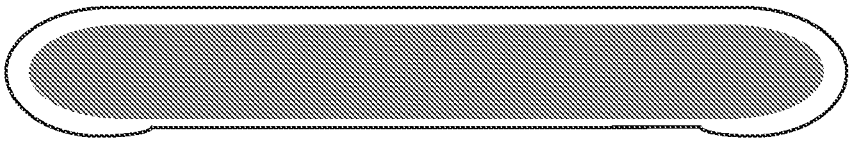
FIGS. 2A-2D show cross-sectional schematic illustrations of various processing stages of a wet backside and bevel edge clean process according to certain embodiments.

As shown in FIG. 2A, the EUV resist material may be deposited on the frontside, backside, and bevel edge of a substrate. As noted above, such deposition may occur through wet spin-on techniques or dry vapor/plasma-based techniques. The EUV resist material and related metallic and metal halide contamination deposited on the backside and bevel edge increases the likelihood of contamination on the frontside of the substrate and contamination of downstream tools. Such EUV resist material and metal-containing contamination is unwanted. It is desired to remove EUV resist material and metal-containing contamination from the backside and bevel edge of the substrate. In some instances, it is desired to remove some EUV resist material or other metal-containing contamination deposited on the frontside of the substrate, including EUV resist material deposited at a periphery of the frontside of the substrate.

Figure 2B:
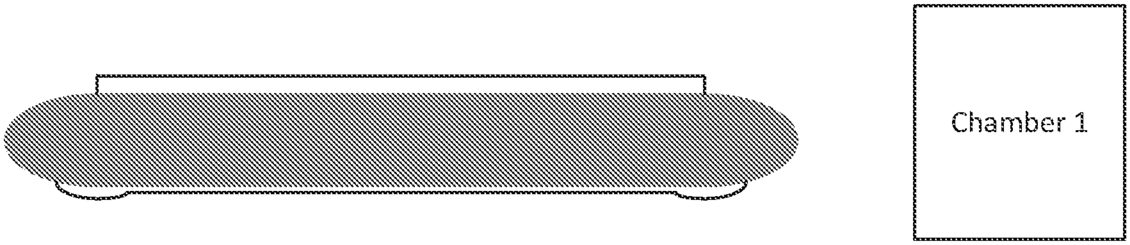

As shown in FIG. 2B, the unwanted material deposited on the bevel edge of the substrate is removed by a wet bevel edge clean. In a standard edge bead removal process, organic solvent such as PGME, PGMEA, or 2-heptanone is dispensed to remove the EUV resist material deposited on the bevel edge in a first process chamber (Chamber 1). The first process chamber may be a spin-clean tool. The organic solvent may be dispensed at a low/mild temperature such as about Any heating of solvents which are flammable introduces a significant fire/explosion hazard. The substrate undergoes rinse/dry operations before optionally proceeding to a second process chamber (Chamber 2).

Figure 2C:
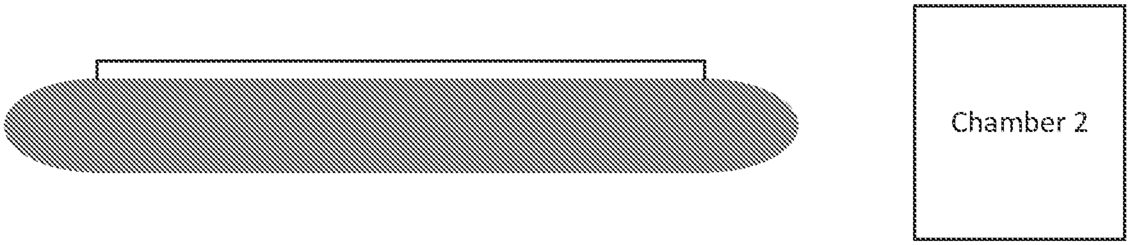

As shown in FIG. 2C, the unwanted material deposited on the backside of the substrate is removed by a wet backside clean. The wet backside clean may be performed in the second process chamber. The second process chamber may be another spin-clean tool that can clean the backside of the substrate. For example, the wet backside clean can employ cleaning agents such as dHF, dHCl, dilute sulfuric acid, or SC-1. The cleaning agent may be dispensed at a low/mild temperature such as about 20° C. The wet backside clean may also remove material on the bevel edge region, though it is typically ineffective in uniform or complete removal of material on the bevel edge region. Accordingly, backside cleans and bevel edge cleans are sometimes separated between the first process chamber and the second process chamber. The substrate undergoes rinse/dry operations before proceeding to a third process chamber (Chamber 3).

Figure 2D:
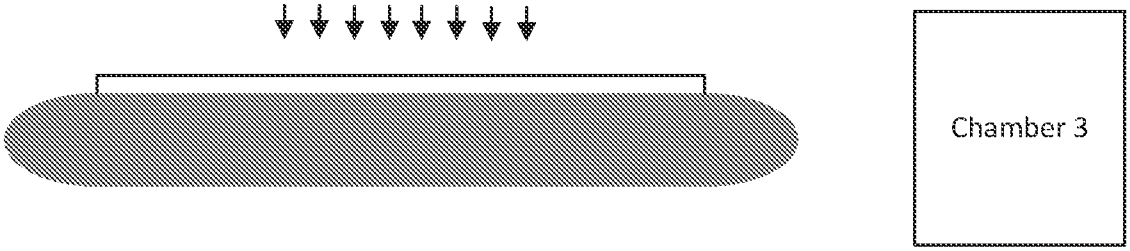

As shown in FIG. 2D, the substrate is transferred to the third process chamber to undergo optional PAB thermal treatment. In some embodiments, the third process chamber is an oven or includes a hot plate by which the substrate is exposed to an elevated temperature. The PAB thermal treatment increases the substrate temperature to an elevated temperature such as between about and 200° C. This stabilizes the lithography properties of the EUV resist on the frontside of the substrate for EUV exposure. The PAB thermal treatment is a dry treatment.

In contrast to wet backside and bevel edge cleaning techniques, dry backside and bevel edge cleaning techniques may be less costly and more environmentally safe. Dry backside and bevel edge cleaning techniques may integrate chambers so that dry processing steps may be performed in fewer tools/chambers. Dry backside and bevel edge cleaning techniques may address non-uniformity issues related to wet backside and bevel edge cleaning techniques.

In some cases, the dry backside and bevel edge cleaning techniques employs plasma to remove material from the backside and bevel edge of a substrate. Existing hardware may confine plasma to the backside and bevel edge of the substrate to remove material. In some other cases, dry backside and bevel edge cleaning may be accomplished without striking a plasma. For example, the dry backside and bevel edge clean utilizes etch gas confined to specific regions of the substrate to remove material (e.g., EUV resist material) from the backside and bevel edge of the substrate. The dry backside and bevel edge clean exposes the substrate to an elevated temperature to promote non-selective removal of the material at the backside and bevel edge.

Figure 3A:
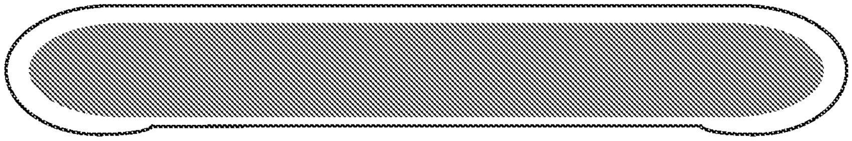
FIGS. 3A-3C show cross-sectional schematic illustrations of various processing stages of a dry backside and bevel edge clean process according to certain embodiments.
Figure 3B:
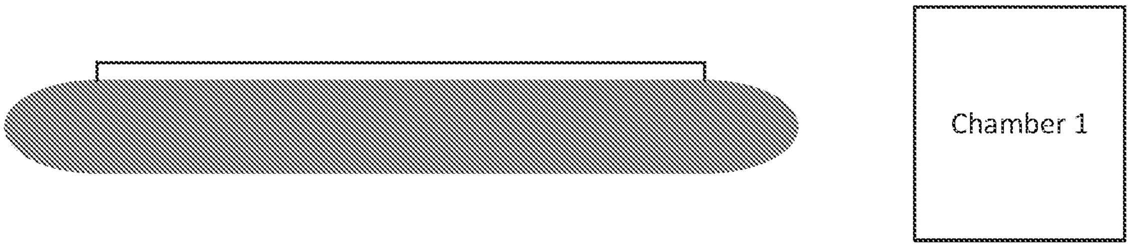
Figure 3C:
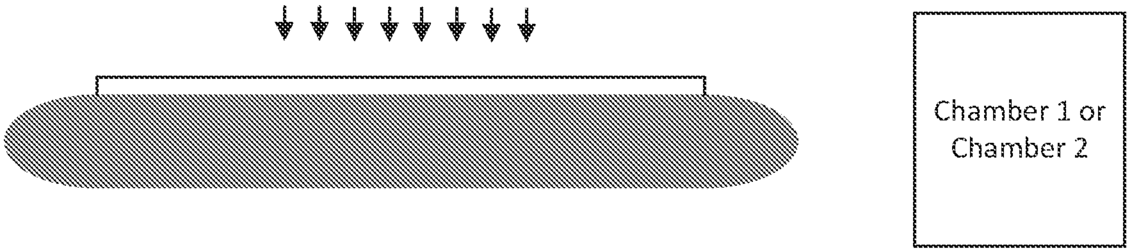

FIGS. 3A-3C show cross-sectional schematic illustrations of various processing stages of dry backside and bevel edge clean of photoresist material according to some embodiments. Deposition of photoresist material (e.g., EUV resist material) may be performed using wet or dry deposition techniques. Wet deposition techniques include spin-coating. Dry deposition techniques include chemical vapor deposition (CVD) or atomic layer deposition (ALD).

As shown in FIG. 3A, the EUV resist material and related metal and metal halide contamination may be deposited on the frontside, backside, and bevel edge of a substrate. The unwanted material deposited on the backside and bevel edge increases the likelihood of contamination on the frontside of the substrate and contamination of downstream tools. It is desired to remove the unwanted material from the backside and bevel edge of the substrate. In some instances, it is desired to remove some unwanted material deposited on the frontside of the substrate, including EUV resist material and related metallic and metal halide contamination deposited at a periphery of the frontside of the substrate. For instance, it may be desired to remove unwanted material about a few millimeters from the edge (e.g., about 1.5 mm) at the frontside. In some embodiments, the EUV resist material is an organo-metal-containing resist material or organo-metal oxide. The EUV resist material may include an element selected from a group consisting of: tin, hafnium, tellurium, bismuth, indium, antimony, iodine, and germanium. The unwanted metallic or metal halide contamination may result from a reaction between a metal in the EUV resist material and halogen-based chemistry. The metal in the EUV resist material may have a high patterning radiation-absorption cross-section. In some embodiments, the element may have a high EUV-absorption cross-section. In some embodiments, the EUV resist material may generally be composed of Sn, 0, and C. For instance, the EUV resist material includes organotin oxide.

As shown in FIG. 3B, the EUV resist material deposited on the backside and bevel edge of the substrate is removed by a dry clean. The dry clean may expose the backside and bevel edge of the substrate to etch gas. In some embodiments, the etch gas is a hydrogen halide, hydrogen gas, hydrogen gas and halide gas, or boron trichloride ($BCl_3$). In one example, the etch gas is a hydrogen halide such as HCl, HBr, or HI. In another example, the etch gas is hydrogen gas ($H_2$). In yet another example, the etch gas is a mixture of $H_2$ with $Cl_2$, $Br_2$, or $I_2$. In still yet another example, the etch gas is $BCl_3$. While this disclosure is not limited to any particular theory or mechanism of operation, in some cases the approach is understood to leverage the chemical reactivity of EUV photoresist materials and related contamination with the clean chemistry (e.g., HCl, HBr, HI, $H_2$ and $Cl_2$, $Br_2$, or $I_2$, $BCl_3$) to form volatile products using vapors. The EUV photoresist materials and related contamination may be treated and/or removed using vapors and/or plasma at various temperatures. It is believed that higher temperatures, pressures, and/or reactant flow can further accelerate or enhance reactivity. In some embodiments, the EUV resist material and/or related contamination can be removed with etch rates of up to 1 nm/s. In some embodiments, the etch gas is activated by a remote plasma source. This may further accelerate or enhance reactivity. In some embodiments, the etch gas is delivered with a carrier gas such as argon, helium, nitrogen, or other suitable carrier gas.

In some embodiments, the photoresist material is not EUV resist material, but a silicon-based material or carbon-based material. The etch gas for removal of such materials may be different than for removal of EUV resist material. In some embodiments, the etch gas includes an oxidizing gas such as $O_2$, $CO_2$, $N_2O$, and the like for removal of carbon-based materials. In some embodiments, the etch gas includes a fluorine-based gas such as $C_xF_y$ or $C_xF_yH_z$ or chlorine-based gas for removal of silicon-based materials.

An inert curtain gas may be delivered on the frontside of the substrate to limit the etch gas to the backside and bevel edge of the substrate. The curtain gas may include gases such as nitrogen ($N_2$), oxygen ($O_2$), water ($H_2O$), argon (Ar), helium (He), xenon (Xe), neon (Ne), or mixtures thereof. The curtain gas is flowed on the frontside of the substrate to protect at least central regions of the frontside of the substrate from the etch gas. As the curtain gas is flowed to the frontside, the curtain gas spreads across the frontside to protect EUV resist material deposited on the frontside.

The curtain gas may be flowed simultaneously with the etch gas. A first etch gas flow may be introduced to the backside of the substrate. The first etch gas flow may spread across the backside of the substrate, where the backside of the substrate may be accessible when the substrate is supported by MCA supports on a carrier ring. In some embodiments, a second etch gas flow may be introduced to the periphery of the frontside of the substrate. The second etch gas flow may flow along the periphery of the frontside and wrap around the bevel edge of the substrate. The first etch gas flow may be introduced from one or more bottom gas inlets positioned below the substrate support, and the second etch gas flow may be introduced from one or more peripheral gas inlets of a gas distributor positioned above the substrate support. The gas distributor may include a modular ring with the one or more peripheral gas inlets. The modular ring may modulate spacing between the one or more peripheral gas inlets and the frontside of the substrate. In some embodiments, curtain gas is flowed from one or more central gas inlets of the gas distributor, where a first gap separating the one or more peripheral gas inlets from the frontside is greater than a second gap separating the one or more central gas inlets from the frontside.

The substrate may be heated to an elevated temperature during the dry clean, where the elevated temperature is between about 20° C. and about 170° C., between about 20°

C. and about 140° C., between about 40° C. and about 140° C., or about 100° C. In some embodiments, the dry clean may be performed at an elevated pressure. The pressure in a process chamber may be between about 0.02 Torr and atmospheric pressure, between 0.1 Torr and atmospheric pressure, or between about 1 Torr and atmospheric pressure. In some embodiments, the dry clean may be performed with a high flow rate of the etch gas. The etch gas flow rate may be between about 50 sccm and about 10000 sccm, between about 100 sccm and about 10000 sccm, or between about 200 sccm and about 5000 sccm. Unlike wet cleaning techniques, the non-plasma thermal cleaning technique of the present disclosure can tune process parameters such as temperature, pressure, and gas flow rate to control etch rate. A high etch rate may be achieved to remove unexposed EUV resist material with higher temperature and/or pressure and flow rate.

Both backside clean and bevel edge clean are performed in a first process chamber (Chamber 1) rather than in separate process chambers. This reduces the likelihood of contamination of tools that may otherwise occur in between cleaning operations. A single pass may be performed for essentially multiple process steps in a single tool. This also reduces cost and increases throughput. No wet cleaning or rinse/dry operations are performed in the dry backside and bevel edge clean of the present disclosure.

In some embodiments, the dry backside and bevel edge clean includes exposure to etch gas followed by purging. Purging introduces a purge gas to pump/purge residual etch gas from the first process chamber. It will be understood that purging may be useful to remove residual etch gases or etch byproducts from the process chamber to avoid undesired etching of the frontside of the substrate during substrate transfer. Purging may flow an inert gas and/or a reactive gas. The reactive gas may react with the residual etch gas to facilitate ease of removal. The reactive gas may be, for example, a tin-based precursor such as an organotin precursor. The inert gas may be Ar, He, Ne, Xe, or $N_2$. The chamber pressure may be between about 0.1 Torr and about 6 Torr. The purge gas flow may be between about 10 sccm and about 10000 sccm or between about 50 sccm and about 5000 sccm. In some embodiments, the pump/purge may proceed at a high temperature such as between about 20° C. and about 140° C. or between about 80° C. and about 120° C. The high temperature may facilitate removal of residual etch gas from the first process chamber. In some embodiments, chamber walls and other components may be heated to release residual etch gas. The residual etch gas (e.g., halide gas or halide-containing gas) may be exhausted through an exhaust line during pumping/purging. In some embodiments, the pump/purge operation may also be referred to as dehalogenation. Halides may readily stick to chamber walls, chamber components, or wafers. If the halides stick to the wafer, there is an increased risk of the halides (e.g., bromine) being released from the wafer during EUV scanning, thereby corroding or damaging the scanner.

In some embodiments, the duration of the dry backside and bevel edge clean is between about 10 seconds and about 150 seconds. In some embodiments, the endpoint of the backside and bevel edge clean is detected by one or more sensors. The one or more sensors may detect the presence of absence of EUV resist deposits on the backside and bevel edge of the substrate. The one or more sensors may include an IR sensor and/or optical sensor.

As shown in FIG. 3C, the substrate is exposed to an optional PAB thermal treatment. In some embodiments, the PAB thermal treatment is performed in the same process chamber as the dry backside and bevel edge clean (i.e., first process chamber). That way, the dry backside and bevel edge clean is integrated with the PAB thermal treatment. This may further reduce the likelihood of contamination, reduce cost, and increase throughput. This may have minimal impact or positive impact on lithography performance. In some embodiments, the PAB thermal treatment is performed in a second process chamber (Chamber 2) that is different than the dry backside and bevel edge clean. The PAB treatment is a dry treatment.

The PAB thermal treatment increases the substrate temperature to an elevated temperature such as between about 100° C. and about 170° C. or between about 120° C. and about 150° C. In some embodiments, the substrate temperature may be controlled using a radiative heat source such as an IR lamp or one or more LEDs. The radiative heat source may be positioned below the substrate. Alternatively, the radiative heat source may be positioned above the substrate. The substrate temperature may be actively controlled by a pyrometer in a feedback control loop established with the radiative heat source. The atmosphere during PAB thermal treatment may be controlled by flowing inert gases such as $N_2$, Ar, He, Xe, or Ne, where the inert gases may be mixed with $O_2$ and/or $H_2O$. The flow rate of the inert gases may be between about 10 sccm and about 10000 sccm or between about 50 sccm and about 5000 sccm. The pressure during PAB thermal treatment may be controlled to be between about 0.02 Torr and atmospheric pressure, between about 0.1 Torr and atmospheric pressure, or between about 1 Torr and atmospheric pressure.

Apparatus

The present disclosure provides various hardware implementations to achieve the methods described herein. In many cases, two or more operations described in FIG. 1 may take place in the same processing chamber. In various embodiments, at least two processing chambers are provided, one configured to perform dry processes and one configured to perform wet processes. Such chambers may be combined on a single tool, as described herein.

Figure 4:
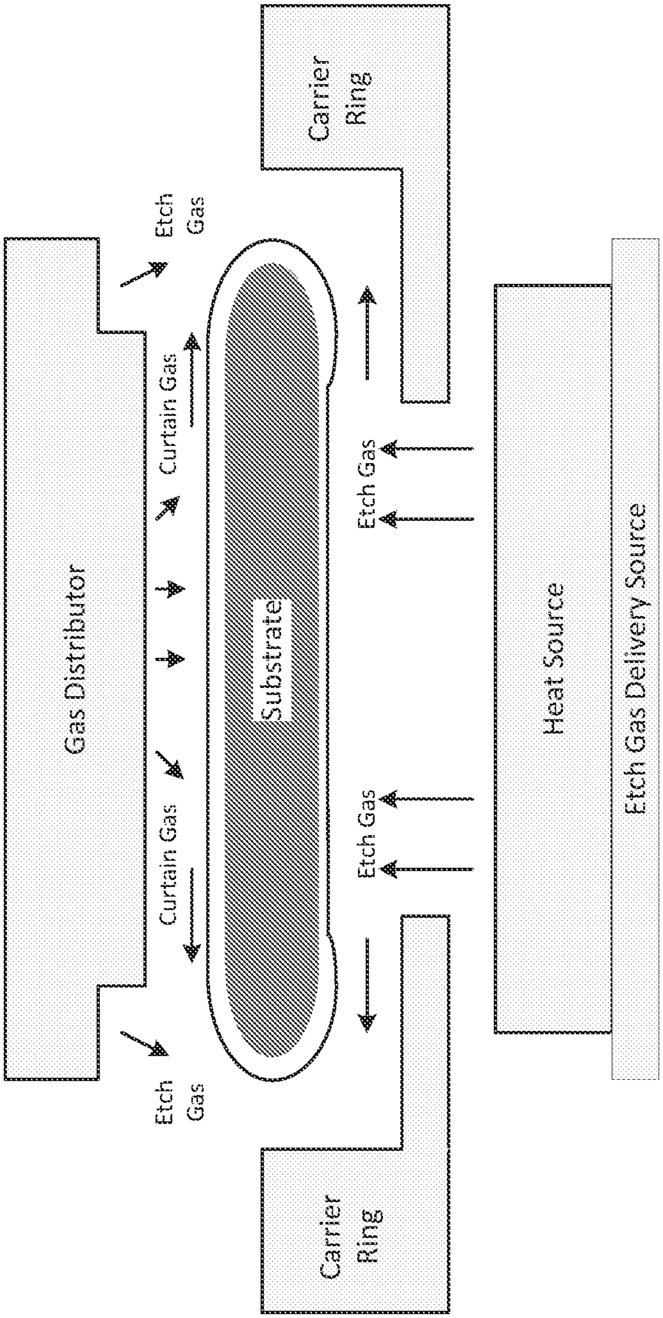
FIG. 4 shows a schematic illustration of a process chamber for performing dry backside and bevel edge clean according to some embodiments.

FIG. 4 shows a schematic illustration of a process chamber for performing dry backside and bevel edge clean according to some embodiments. An apparatus or tool for performing dry backside and bevel edge clean may include a process chamber. The process chamber may be integrated to not only perform both backside clean and bevel edge clean, but also one or more additional dry processing technique such as PAB treatment deposition, PEB treatment, EUV exposure, PDB treatment, chemical/plasma/light treatment, dry development, etc. The apparatus may include a substrate support in the process chamber for supporting a substrate. In some embodiments, the substrate support may receive the substrate after deposition of material (e.g., EUV resist material) on the frontside, backside, and bevel edge of the substrate. A plurality of minimum contact area (MCA) may be configured to extend from a major surface of the substrate support to elevate the substrate so that etch gas can access a backside of the substrate. The apparatus further includes a gas distributor over the substrate support and coupled to the process chamber for delivering curtain gas to a frontside of the substrate. The apparatus further includes an etch gas delivery source below the substrate support and coupled to the process chamber for delivering etch gas to a backside of the substrate. The apparatus may further include a heat source such as a radiative heat source below the substrate support.

Figure 5A:
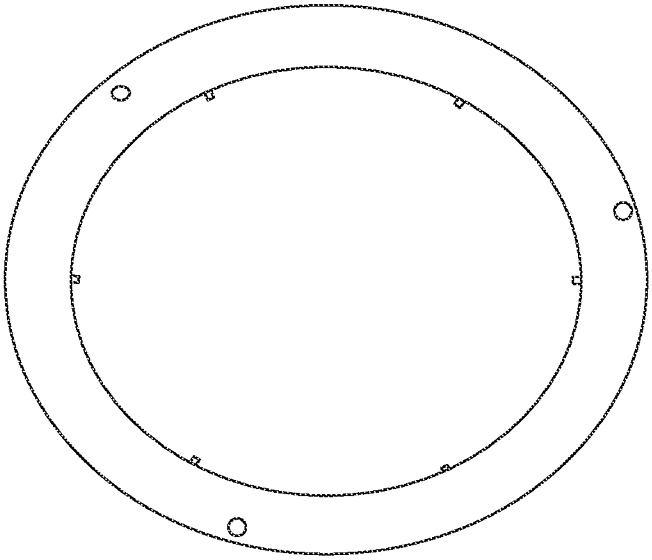
FIG. 5A shows a perspective view of a carrier ring for supporting a substrate in a process chamber according to some embodiments.
Figure 5B:
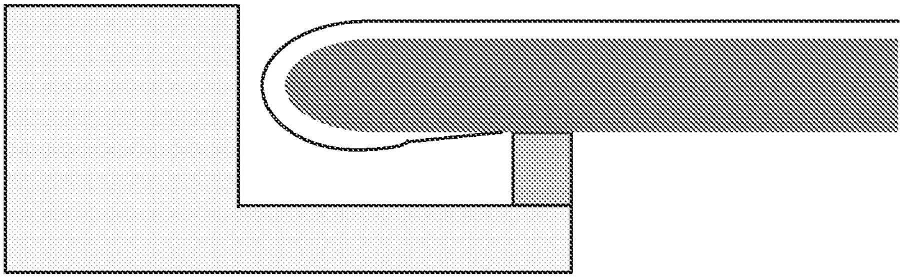
FIG. 5B shows a cross-sectional schematic illustration of a carrier ring supporting and contacting a backside of a substrate according to some embodiments.

The substrate support may include a carrier ring. The carrier ring may have an annular body for supporting the substrate. FIG. 5A shows a perspective view of a carrier ring for supporting a substrate in a process chamber according to some embodiments. A substrate in the semiconductor industry typically has a diameter of 200 mm, 300 mm, or 450 mm. An outer diameter of the carrier ring is greater than the diameter of the substrate and an inner diameter of the annular body is less than the diameter of the substrate. The inner diameter may equal to or less than about 280 mm, equal to or less than about 240 mm, or equal to or less than about 200 mm. In other words, the substrate may be gripped by a ring with a radius equal to or less than about 140 mm. The plurality of MCA supports may extend from a major surface of the carrier ring to contact the backside of the substrate. In some embodiments, the plurality of MCA supports may be symmetrically arranged about a center of the carrier ring. For instance, the plurality of MCA supports may include three MCA supports, four MCA supports, five MCA supports, six MCA supports, or more. The MCA supports may be pins. The plurality of MCA supports may include any suitable insulating material. The insulating material may be a soft material such as a perfluoroalkoxy alkane (PFA) to avoid scratching the substrate. FIG. 5B shows a cross-sectional schematic illustration of a carrier ring supporting and contacting a backside of a substrate according to some embodiments.

The position of the MCA supports may be optimized to the preceding deposition process to avoid contacting the substrate where it has backside deposition. Put another way, the plurality of MCA supports may be configured to contact areas of the backside of the substrate where there is little to no backside deposition (e.g., photoresist deposits). This placement may be determined based on knowledge or data ascertained from one or more previous deposition operations indicating where there is little to no backside deposition. For example, the MCA supports may contact the backside of the substrate in areas closer to a center of the substrate than an edge of the substrate. At the same time, the position of the MCA supports does not prevent the etch gas from accessing areas with backside deposition.

The plurality of MCA supports provide minimal contact with the backside of the substrate. The plurality of MCA supports may elevate the substrate above a major surface of the carrier ring to a height to permit gas flow across the backside of the substrate. In some embodiments, the height is between about 0.025 mm and about 0.5 mm or between about 0.05 mm and about 0.25 mm. In some embodiments, the MCA supports are extendable/retractable from the major surface of the substrate support. In some embodiments the height is adjustable so that gap size is controlled. In some embodiments, the backside of the substrate is supported by MCA supports with a shifting mechanism or rotation mechanism in order to be able to clean the area directly touched by the MCA supports and the substrate. The etch gas may be blocked by accessing the area in direct contact with the MCA support. Even though the area is very small in relation to the substrate it may still have an unacceptably high metal contamination. Therefore, this area needs to be cleaned as well. In other words, the MCA supports may shift or rotate positions to contact different points of the backside of the substrate. The shifting mechanism may be incorporated into lift pins which are used during substrate transfer. After the first part of the clean which cleans the whole substrate except the area touched by the MCA supports, the carrier ring may lower the substrate onto the lift pins. The lift pins move the substrate by a multiple of the MCA area ~10 s of um. Afterwards the carrier ring moves back into process position and a second clean is performed to clean the areas first touched by the MCA supports. In some embodiments, the backside of the substrate is supported by a section of MCA supports, where the carrier ring is divided into two or more sections of X number of MCA supports each, where X is any integer value. In this case the clean may process may be split into several time steps. During each time step one or more of the parts of the split ring is moved away from the substrate surface enabling the clean in that section. All sections have to at least been lifted/cleaned once during the clean. A minimum number of section(s) needs to stay in place for the substrate to be held securely in the process position. For example, the carrier ring may be split into two sections of three pins each. The carrier ring and the plurality of MCA supports may be configured in a manner to modulate etch gas flow in the backside of the substrate. Specifically, the height of the MCA supports, the inner diameter of the carrier ring, the positioning of the MCA supports, and other aspects of the carrier ring may be designed to modulate gas flow between the curtain gas from the top and the etch gas from the bottom to ensure that both the backside and the bevel edge are etched but not certain regions of the frontside of the substrate.

Returning to FIG. 4, an etch gas delivery source and a radiative heat source may be positioned below the substrate support (e.g., carrier ring). The etch gas delivery source may include one or more bottom gas inlets or nozzles for delivering etch gas to the backside of the substrate. The radiative heat source may be spaced apart from the backside of the substrate but may heat the substrate to an elevated temperature by radiative heating. The radiative heat source may provide controlled ramp capability, pulsing, and rapid changes in temperature. In some embodiments, the radiative heat source includes one or more IR lamps or one or more LEDs. To enable rapid changes of temperature the heat source may be in the 1-10 kW range. In some embodiments, the substrate support may be configured to rotate. For controllability of the substrate temperature, the one or more IR lamps or the one or more LEDs may be separated into zones for controlled heating of various regions of the substrate. Additionally, the one or more lamps or the one or more LEDs may each be independently controllable. By pulsing the LEDs, a temperature ramp up of the wafer can be controlled. The radiative heat source may also serve to block stray light from reaching the frontside of the substrate. In some embodiments, the etch gas delivery source includes one or more holes through the radiative heat source. In some embodiments, the etch gas delivery source includes one or more holes positioned outside of the radiative heat source. The positioning of the one or more holes may not be critical as uniformity of etch gas flow on the backside of the substrate is not critical for removal of material on the backside of the substrate. Thus, the etch gas delivery source may be positioned in any manner so that the etch gas is able to reach or otherwise access the backside of the substrate.

A gas distributor is positioned above the substrate support for delivering curtain gas to the frontside of the substrate. The gas distributor may include one or more central gas inlets for directing curtain gas flow at a center of the frontside of the substrate. In some embodiments, the gas distributor may include one or more peripheral gas inlets for directing an etch gas flow at a periphery of the frontside of the substrate. It will be understood that the periphery of the frontside of the substrate may occupy an area of 15% or less, 10% or less, or 5% or less of the frontside of the substrate. In some embodiments, the gas distributor includes a top plate with multiple holes arranged in a central region of the top plate and multiple holes arranged in a peripheral region of the top plate. In some embodiments, the gas distributor includes modular rings of different diameters. In some instances, the modular rings may have different shapes. Etch gas may be delivered through one of the modular rings, and curtain gas may be delivered through another one of the modular rings. Thus, the gas distributor includes at least a modular ring for the one or more peripheral gas inlets, where the at least one modular ring is configured to modulate spacing of the one or more peripheral gas inlets from the frontside of the substrate. Removal at the bevel edge can be modulated by modulating the spacing of the one or more peripheral gas inlets in the modular ring. Additionally or alternatively, the gas distributor includes one or more nozzles for directing etch gas flow at the bevel edge of the substrate.

The gas distributor may be configured so that a first gap separating the one or more peripheral gas inlets front the frontside of the substrate is greater than a second gap separating the one or more central gas inlets from the frontside of the substrate. In some embodiments, the first gap is at least two times greater than the second gap. The second gap may be as small as possible without touching the EUV resist film on the frontside of the substrate. As shown in FIG. 4, the gas distributor may have a stepped design. That way, curtain gas flow may be provided at a higher pressure and delivered across a smaller gap at a center of the substrate and etch gas flow may be provided at a lower pressure and delivered across a larger gap at a periphery of the substrate. The etch gas flow delivered from above the substrate support may be referred to as the “second etch gas flow,” whereas the etch gas flow delivered from below the substrate support may be referred to as the “first etch gas flow.” The second etch gas flow delivered at the periphery of the substrate may wrap around parts of the frontside and the bevel edge region of the substrate. For instance, the etch gas flow may wrap around 5 mm or less, around 3 mm or less, or 1.5 mm or less of the frontside of the substrate. The curtain gas flow prevents etch gas from reaching a remainder of the frontside of the substrate.

In addition or in the alternative to the radiative heat source, the apparatus may further include one or more heaters. The one or more heaters may provide substrate temperature control. In some embodiments, the one or more heaters are coupled to the gas distributor and above the substrate. The one or more heaters may be radiative heat sources. In some embodiments, the one or more heaters are configured to provide ambient heating in the process chamber. In some embodiments, the one or more heaters provide substrate temperature control in the range of 20° C. to 170° C. or 20° C. to 140° C., or other temperature ranges described herein.

The apparatus may further include one or more sensors for detecting a presence of film deposits on the backside and/or bevel edge of the substrate. In some embodiments, the one or more sensors include an optical device such as an IR sensor that serves as an endpoint detection.

Figure 6:
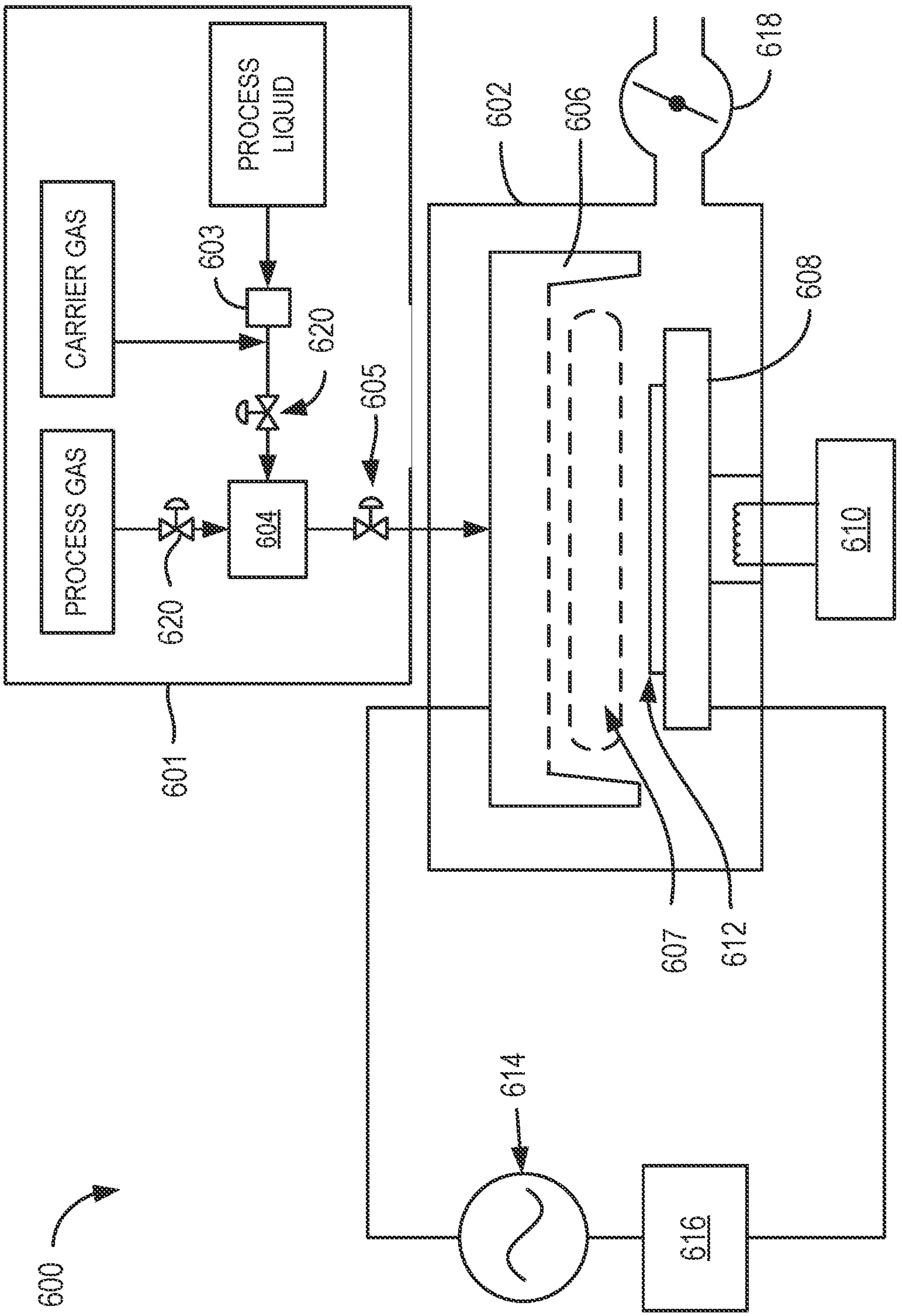
FIG. 6 depicts a schematic illustration of an example process station for maintaining a low-pressure environment that is suitable for performing backside and bevel edge clean operations according to some embodiments.
Figure 7:
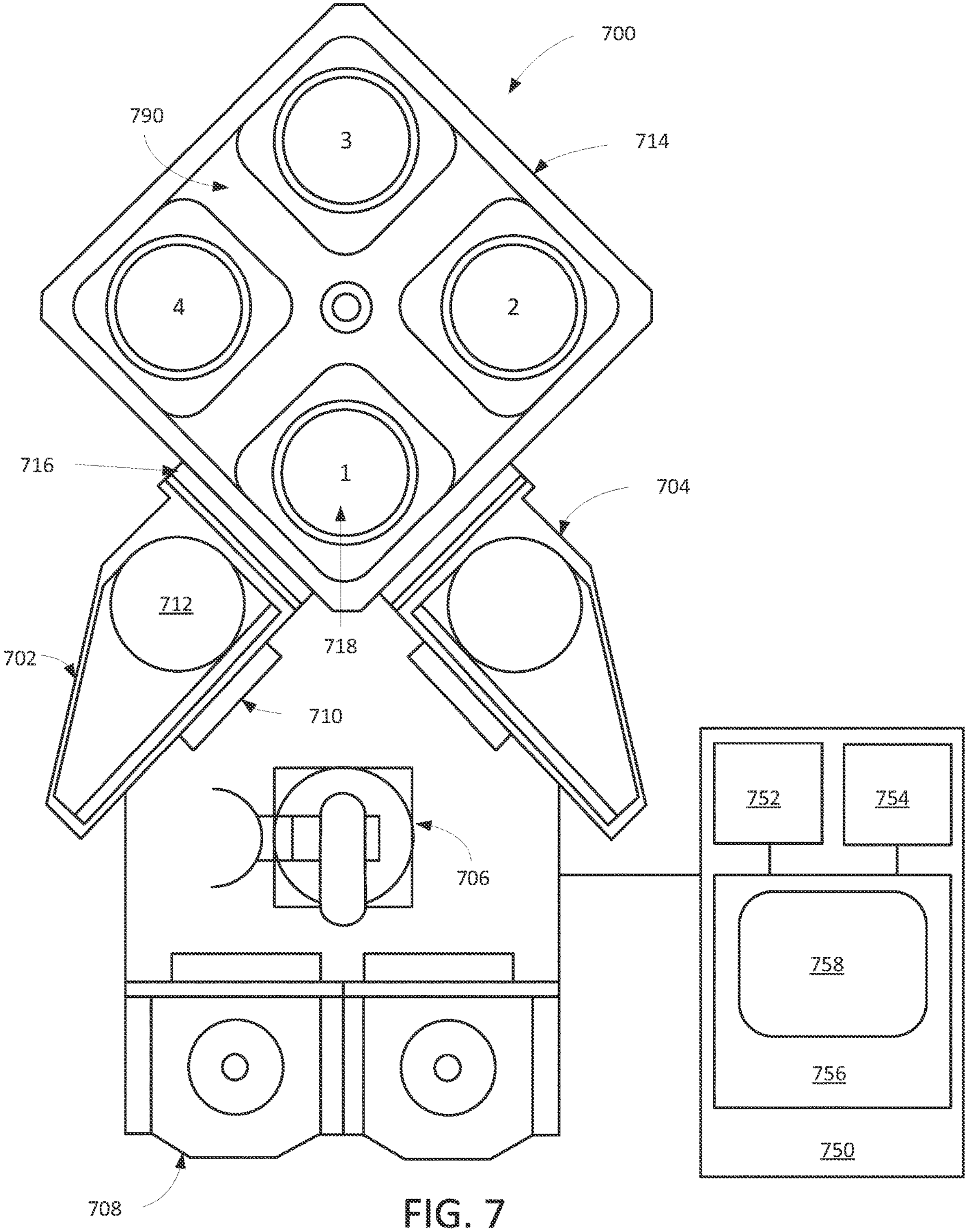
FIG. 7 depicts a schematic illustration of an example multi-station processing tool suitable for implementation of various development, clean, rework, descum, and smoothing operations described herein.

FIG. 6 depicts a schematic illustration of an embodiment of process station 600 having a process chamber body 602 for maintaining a low-pressure environment that is suitable for the described dry backside and bevel edge clean embodiments. A plurality of process stations 600 may be included in a common low pressure process tool environment. For example, FIG. 7 depicts an embodiment of a multi-station processing tool 700, such as a VECTOR® processing tool available from Lam Research Corporation, Fremont, CA. In some embodiments, one or more hardware parameters of the process station 600 including those discussed in detail below may be adjusted programmatically by one or more computer controllers 650.

A process station may be configured as a module in a cluster tool. FIG. 9 depicts a semiconductor process cluster tool architecture with vacuum-integrated deposition and patterning modules suitable for implementation of the embodiments described herein. Such a cluster process tool architecture can include resist deposition, resist exposure (EUV scanner), resist development and etch modules, as described above and further below with reference to FIGS. 8 and 9. Further, such a cluster tool architecture can include a processing chamber configured for wet processing, for example to perform backside and bevel edge region cleaning using wet techniques.

Returning to FIG. 6, process station 600 fluidly communicates with reactant delivery system 601*a* for delivering process gases to a distribution showerhead 606. Reactant delivery system 601*a* optionally includes a mixing vessel 604 for blending and/or conditioning process gases, for delivery to showerhead 606. One or more mixing vessel inlet valves 620 may control introduction of process gases to mixing vessel 604. Where plasma exposure is used, plasma may also be delivered to the showerhead 606 or may be generated in the process station 600. As noted above, in at least some embodiments, non-plasma thermal exposure is favored.

FIG. 6 includes an optional vaporization point 603 for vaporizing liquid reactant to be supplied to the mixing vessel 604. In some embodiments, a liquid flow controller (LFC) upstream of vaporization point 603 may be provided for controlling a mass flow of liquid for vaporization and delivery to process station 600. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM.

Showerhead 606 distributes process gases toward substrate 612. In the embodiment shown in FIG. 6, the substrate 612 is located beneath showerhead 606 and is shown resting on a pedestal 608. Showerhead 606 may have any suitable shape, and may have any suitable number and arrangement of ports for distributing process gases to substrate 612.

In some embodiments, pedestal 608 may be raised or lowered to expose substrate 612 to a volume between the substrate 612 and the showerhead 606. It will be appreciated that, in some embodiments, pedestal height may be adjusted programmatically by a suitable computer controller 650. In some embodiments, the showerhead 606 may have multiple plenum volumes with multiple temperature controls. In some embodiments, the pedestal 608 may be replaced by a carrier ring for supporting the substrate 612.

In some embodiments, pedestal 608 may be temperature controlled via heater 610. Alternatively, the substrate 612 supported by a carrier ring may be heated by a radiative heat source positioned below the substrate 612. In some embodiments, the substrate 612 may be heated to a temperature of greater than 0° C. and up to 300° C. or more, for example 50 to 120° C., such as about to 80° C., during non-plasma thermal exposure of a resist to dry backside and bevel edge clean chemistry, such as HBr or HCl, as described in disclosed embodiments. In some embodiments, the heater 610 of the pedestal 608 may include a plurality of independently controllable temperature control zones.

Further, in some embodiments, pressure control for process station 600 may be provided by a butterfly valve 618.

As shown in the embodiment of FIG. 6, butterfly valve 618 throttles a vacuum provided by a downstream vacuum pump (not shown). However, in some embodiments, pressure control of process station 600 may also be adjusted by varying a flow rate of one or more gases introduced to the process station 600.

In some embodiments, a position of showerhead 606 may be adjusted relative to pedestal 608 to vary a volume between the substrate 612 and the showerhead 606. Further, it will be appreciated that a vertical position of pedestal 608 and/or showerhead 606 may be varied by any suitable mechanism within the scope of the present disclosure. In some embodiments, pedestal 608 may include a rotational axis for rotating an orientation of substrate 612. It will be appreciated that, in some embodiments, one or more of these example adjustments may be performed programmatically by one or more suitable computer controllers 650.

Where plasma may be used, for example in gentle plasma-based dry clean embodiments and/or etch operations conducted in the same chamber, showerhead 606 and pedestal 608 electrically communicate with a radio frequency (RF) power supply 614 and matching network 616 for powering a plasma. In some embodiments, the plasma energy may be controlled by controlling one or more of a process station pressure, a gas concentration, an RF source power, an RF source frequency, and a plasma power pulse timing. For example, RF power supply 614 and matching network 616 may be operated at any suitable power to form a plasma having a desired composition of radical species. Examples of suitable powers are up to about 500 W.

In some embodiments, instructions for a controller 650 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a recipe phase may include instructions for setting a flow rate of a dry clean chemistry reactant gas, such as HBr or HCl, and time delay instructions for the recipe phase. In some embodiments, the controller 650 may include any of the features described below with respect to system controller 750 of FIG. 7.

As described above, one or more process stations may be included in a multi-station processing tool. FIG. 7 shows a schematic view of an embodiment of a multi-station processing tool 700 with an inbound load lock 702 and an outbound load lock 704, either or both of which may include a remote plasma source. A robot 706 at atmospheric pressure is configured to move wafers from a cassette loaded through a pod 708 into inbound load lock 702 via an atmospheric port 710. A wafer is placed by the robot 706 on a pedestal 712 in the inbound load lock 702, the atmospheric port 710 is closed, and the load lock is pumped down. Where the inbound load lock 702 includes a remote plasma source, the wafer may be exposed to a remote plasma treatment to treat the silicon nitride surface in the load lock prior to being introduced into a processing chamber 714. Further, the wafer also may be heated in the inbound load lock 702 as well, for example, to remove moisture and adsorbed gases. Next, a chamber transport port 716 to processing chamber 714 is opened, and another robot (not shown) places the wafer into the reactor on a pedestal of a first station shown in the reactor for processing. While the embodiment depicted in FIG. 7 includes load locks, it will be appreciated that, in some embodiments, direct entry of a wafer into a process station may be provided.

The depicted processing chamber 714 includes four process stations, numbered from 1 to 4 in the embodiment shown in FIG. 7. Each station has a heated pedestal (shown at 718 for station 1), and gas line inlets. It will be appreciated that in some embodiments, each process station may have different or multiple purposes. For example, in some embodiments, a process station may be switchable between dry clean and deposition process modes. Additionally or alternatively, in some embodiments, processing chamber 714 may include one or more matched pairs of dry clean and deposition process stations. While the depicted processing chamber 714 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 7 depicts an embodiment of a wafer handling system 790 for transferring wafers within processing chamber 714. In some embodiments, wafer handling system 790 may transfer wafers between various process stations and/or between a process station and a load lock. It will be appreciated that any suitable wafer handling system may be employed. Non-limiting examples include wafer carousels and wafer handling robots. FIG. 7 also depicts an embodiment of a system controller 750 employed to control process conditions and hardware states of process tool 700. System controller 750 may include one or more memory devices 756, one or more mass storage devices 754, and one or more processors 752. Processor 752 may include a CPU or computer, analog, and/or digital input/output connections, stepper motor controller boards, etc.

In some embodiments, system controller 750 controls all of the activities of process tool 700. System controller 750 executes system control software 758 stored in mass storage device 754, loaded into memory device 756, and executed on processor 752. Alternatively, the control logic may be hard coded in the controller 750. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 758 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 700. System control software 758 may be configured in any suitable way. For example, various process tool component subroutines or control objects may be written to control operation of the process tool components used to carry out various process tool processes. System control software 758 may be coded in any suitable computer readable programming language.

In some embodiments, system control software 758 may include input/output control (IOC) sequencing instructions for controlling the various parameters described above. Other computer software and/or programs stored on mass storage device 754 and/or memory device 756 associated with system controller 750 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 718 and to control the spacing between the substrate and other parts of process tool 700.

A process gas control program may include code for controlling halide-containing gas composition (e.g., HBr or HCl gas as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 750. The user interface may include a display screen, graphical software displays of the apparatus and/or process conditions, and user input devices such as pointing devices, keyboards, touch screens, microphones, etc.

In some embodiments, parameters adjusted by system controller 750 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 750 from various process tool sensors. The signals for controlling the process may be output on the analog and digital output connections of process tool 700. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 750 may provide program instructions for implementing the above-described deposition processes. The program instructions may control a variety of process parameters, such as DC power level, RF bias power level, pressure, temperature, etc. The instructions may control the parameters to operate development and/or etch processes according to various embodiments described herein.

The system controller 750 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 750.

In some embodiments, the system controller 750 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 750, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 750 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 1450 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 750, in some embodiments, may be a part of or coupled to a computer that is integrated with, coupled to the system, otherwise networked to the system, or a combination thereof. For example, the system controller 750 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 750 receives instructions in the form of data, which specify parameters for each of the processing steps to be performed during one or more operations. It should be understood that the parameters may be specific to the type of process to be performed and the type of tool that the system controller 750 is configured to interface with or control. Thus as described above, the system controller 750 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a wet deposition chamber or module, a dry deposition chamber or module, a spin-rinse chamber or module, a metal plating chamber or module, a wet clean chamber or module, a dry clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, an EUV lithography chamber (scanner) or module, a wet photoresist development chamber or module, a dry photoresist development chamber, a chemical, plasma, and/or light-based treatment chamber or module, and any other semiconductor processing systems that may be associated or used in the fabrication and/or manufacturing of semiconductor wafers.

As noted above, depending on the process step or steps to be performed by the tool, the system controller 750 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Inductively coupled plasma (ICP) reactors which, in certain embodiments, may be suitable for etch operations suitable for implementation of some embodiments, are now described. Although ICP reactors are described herein, in some embodiments, it should be understood that capacitively coupled plasma reactors may also be used.

Figure 8:
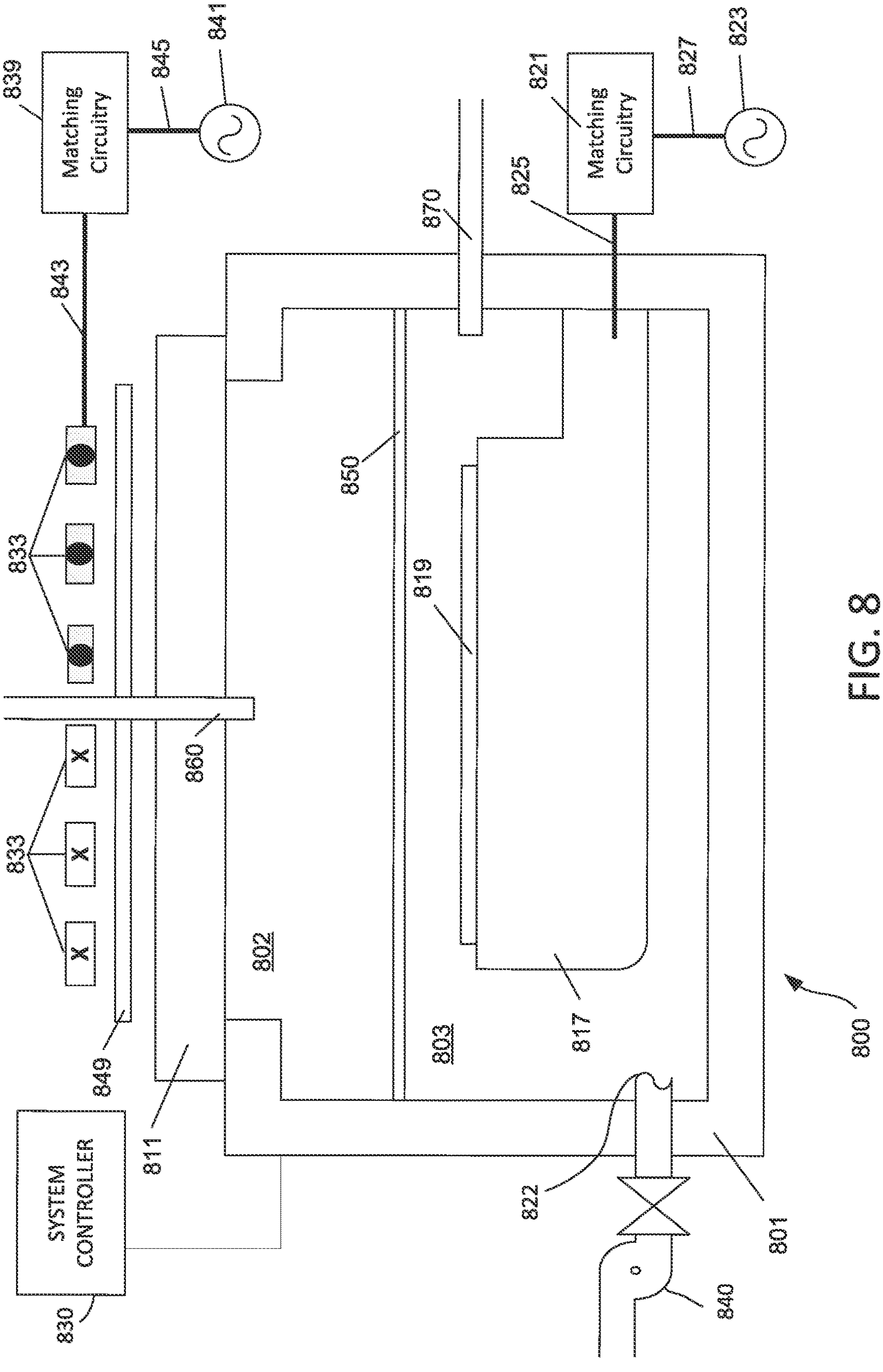
FIG. 8 shows a cross-sectional schematic view of an example inductively-coupled plasma apparatus for implementing certain embodiments and operations described herein.
Figure 9:
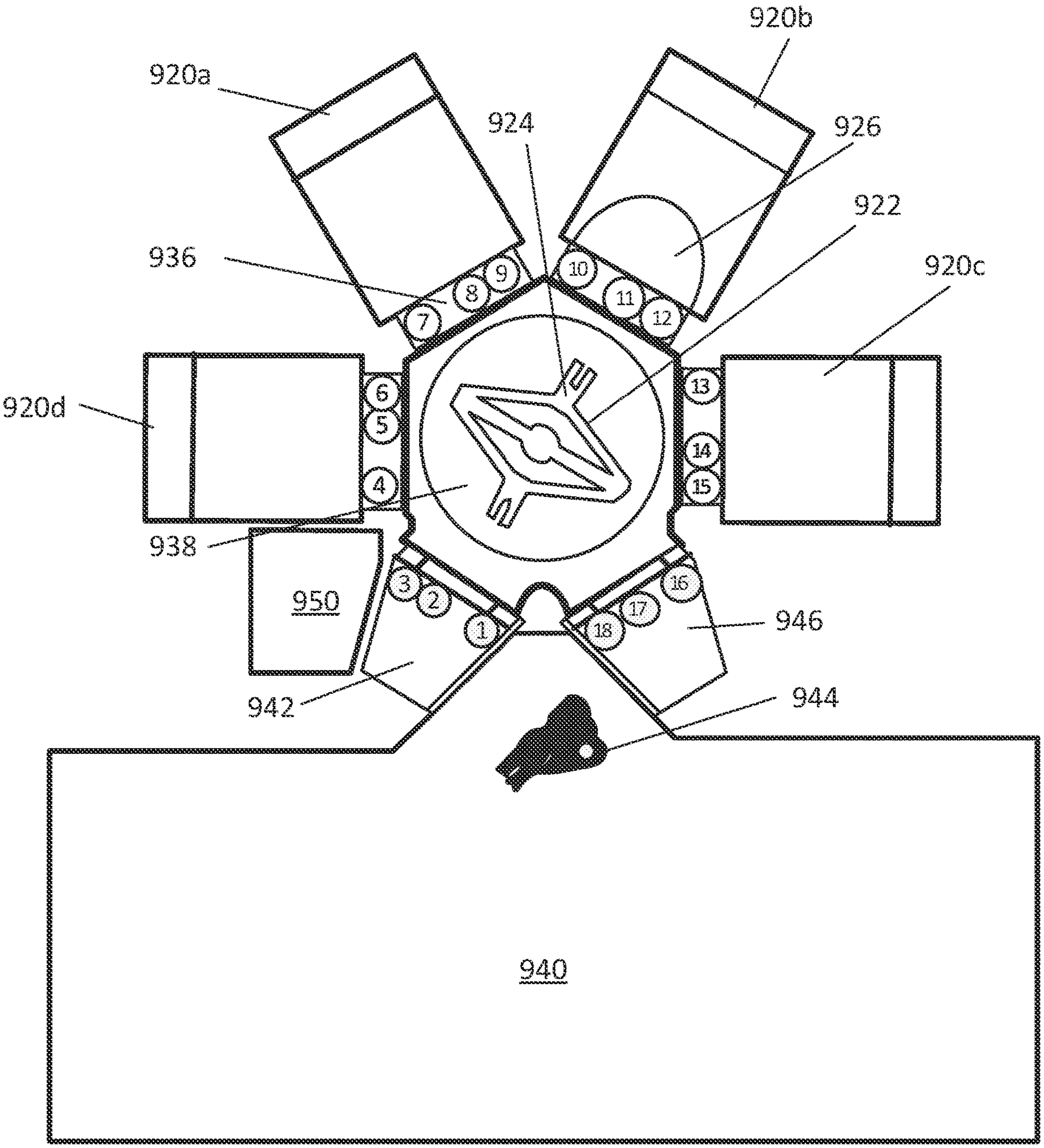
FIG. 9 depicts a semiconductor process cluster tool architecture with vacuum-integrated deposition and patterning modules that interface with a vacuum transfer module, suitable for implementations of processes described herein.

FIG. 8 schematically shows a cross-sectional view of an inductively coupled plasma apparatus 800 appropriate for implementing certain embodiments or aspects of the disclosed embodiments such as dry backside and bevel edge clean, an example of which is a Kiyo® reactor, produced by Lam Research Corp. of Fremont, CA. In other embodiments, other tools or tool types having the functionality to conduct the dry backside and bevel edge clean described herein may be used for implementation.

The inductively coupled plasma apparatus 800 includes an overall process chamber 824 structurally defined by chamber walls 801 and a window 811. The chamber walls 801 may be fabricated from stainless steel, aluminum, or plastic. The window 811 may be fabricated from quartz or other dielectric material. An optional internal plasma grid 850 divides the overall process chamber into an upper sub-chamber 802 and a lower sub chamber 803. In most embodiments, plasma grid 850 may be removed, thereby utilizing a chamber space made of sub chambers 802 and 803. A chuck 817 is positioned within the lower sub-chamber 803 near the bottom inner surface. The chuck 817 is configured to receive and hold a semiconductor wafer 819 upon which the etching and deposition processes are performed. The chuck 817 can be an electrostatic chuck for supporting the wafer 819 when present. In some embodiments, an edge ring (not shown) surrounds chuck 817, and has an upper surface that is approximately planar with a top surface of the wafer 819, when present over chuck 817. The chuck 817 also includes electrostatic electrodes for chucking and dechucking the wafer 819. A filter and DC clamp power supply (not shown) may be provided for this purpose. Other control systems for lifting the wafer 819 off the chuck 817 can also be provided. The chuck 817 can be electrically charged using an RF power supply 823. The RF power supply 823 is connected to matching circuitry 821 through a connection 827. The matching circuitry 821 is connected to the chuck 817 through a connection 825. In this manner, the RF power supply 823 is connected to the chuck 817. In various embodiments, a bias power of the electrostatic chuck may be set at about 50V or may be set at a different bias power depending on the process performed in accordance with disclosed embodiments. For example, the bias power may be between about 20 Vb and about 100 V, or between about 30 V and about 150 V.

Elements for plasma generation include a coil 833 is positioned above window 811. In some embodiments, a coil is not used in disclosed embodiments. The coil 833 is fabricated from an electrically conductive material and includes at least one complete turn. The example of a coil 833 shown in FIG. 8 includes three turns. The cross sections of coil 833 are shown with symbols, and coils having an "X" extend rotationally into the page, while coils having a "●" extend rotationally out of the page. Elements for plasma generation also include an RF power supply 541 configured to supply RF power to the coil 833. In general, the RF power supply 841 is connected to matching circuitry 839 through a connection 845. The matching circuitry 839 is connected to the coil 833 through a connection 843. In this manner, the RF power supply 841 is connected to the coil 833. An optional Faraday shield 849*a* is positioned between the coil 833 and the window 811. The Faraday shield 849*a* may be maintained in a spaced apart relationship relative to the coil 833. In some embodiments, the Faraday shield 849*a* is disposed immediately above the window 811. In some embodiments, the Faraday shield 849*b* is between the window 811 and the chuck 817. In some embodiments, the Faraday shield 849*b* is not maintained in a spaced apart relationship relative to the coil 833. For example, the Faraday shield 849*b* may be directly below the window 811 without a gap. The coil 833, the Faraday shield 849*a*, and the window 811 are each configured to be substantially parallel to one another. The Faraday shield 849*a* may prevent metal or other species from depositing on the window 811 of the process chamber 824.

Process gases may be flowed into the process chamber through one or more main gas flow inlets 860 positioned in the upper sub-chamber 802 and/or through one or more side gas flow inlets 870. Likewise, though not explicitly shown, similar gas flow inlets may be used to supply process gases to a capacitively coupled plasma processing chamber. A vacuum pump, e.g., a one or two stage mechanical dry pump and/or turbomolecular pump 840, may be used to draw process gases out of the process chamber 824 and to maintain a pressure within the process chamber 824. For example, the vacuum pump may be used to evacuate the lower sub-chamber 803 during a purge operation of ALD. A valve-controlled conduit may be used to fluidically connect the vacuum pump to the process chamber 824 so as to selectively control application of the vacuum environment provided by the vacuum pump. This may be done employing a closed loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 800, one or more process gases may be supplied through the gas flow inlets 860 and/or 870. In certain embodiments, process gas may be supplied only through the main gas flow inlet 860, or only through the side gas flow inlet 870. In some cases, the gas flow inlets shown in the figure may be replaced by more complex gas flow inlets, one or more showerheads, for example. The Faraday shield 849*a* and/or optional grid 850 may include internal channels and holes that allow delivery of process gases to the process chamber 824. Either or both of Faraday shield 849*a* and optional grid 850 may serve as a showerhead for delivery of process gases. In some embodiments, a liquid vaporization and delivery system may be situated upstream of the process chamber 824, such that once a liquid reactant or precursor is vaporized, the vaporized reactant or precursor is introduced into the process chamber 824 via a gas flow inlet 860 and/or 870.

Radio frequency power is supplied from the RF power supply 841 to the coil 833 to cause an RF current to flow through the coil 833. The RF current flowing through the coil 533 generates an electromagnetic field about the coil 833. The electromagnetic field generates an inductive current within the upper sub-chamber 802. The physical and chemical interactions of various generated ions and radicals with the wafer 819 etch features of and selectively deposit layers on the wafer 819.

If the plasma grid 850 is used such that there is both an upper sub-chamber 802 and a lower sub-chamber 803, the inductive current acts on the gas present in the upper sub-chamber 802 to generate an electron-ion plasma in the upper sub-chamber 802. The optional internal plasma grid 850 limits the amount of hot electrons in the lower sub-chamber 803. In some embodiments, the apparatus 800 is designed and operated such that the plasma present in the lower sub-chamber 803 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 803 through port 822. The chuck 817 disclosed herein may operate at elevated temperatures ranging between about 10° C. and about 250° C. The temperature will depend on the process operation and specific recipe.

Apparatus 800 may be coupled to facilities (not shown) when installed in a clean room or a fabrication facility. Facilities include plumbing that provide processing gases, vacuum, temperature control, and environmental particle control. These facilities are coupled to apparatus 800, when installed in the target fabrication facility. Additionally, apparatus 800 may be coupled to a transfer chamber that allows robotics to transfer semiconductor wafers into and out of apparatus 800 using typical automation.

In some embodiments, a system controller 830 (which may include one or more physical or logical controllers) controls some or all of the operations of a process chamber 824. The system controller 830 may include one or more memory devices and one or more processors. In some embodiments, the apparatus 800 includes a switching system for controlling flow rates and durations when disclosed embodiments are performed. In some embodiments, the apparatus 800 may have a switching time of up to about 500 ms, or up to about 750 ms. Switching time may depend on the flow chemistry, recipe chosen, reactor architecture, and other factors.

In some embodiments, the system controller 830 is part of a system, which may be part of the above-described examples. System controller 830 is further described above in relation to FIG. 7.

EUVL patterning may be conducted using any suitable tool, often referred to as a scanner, for example the TWINSCAN NXE: 3300B® platform supplied by ASML of Veldhoven, NL). The EUVL patterning tool may be a standalone device from which the substrate is moved into and out of for deposition and etching as described herein. Or, as described below, the EUVL patterning tool may be a module on a larger multi-component tool. FIG. 9 depicts a semiconductor process cluster tool architecture with vacuum-integrated deposition, backside and bevel edge clean, EUV patterning and dry development/etch modules that interface with a vacuum transfer module, suitable for implementation of the processes described herein. While the processes may be conducted without such vacuum integrated apparatus, such apparatus may be advantageous in some embodiments.

FIG. 9 depicts a semiconductor process cluster tool architecture with vacuum-integrated deposition and patterning modules that interface with a vacuum transfer module, suitable for implementation of processes described herein. The arrangement of transfer modules to "transfer" wafers among multiple storage facilities and processing modules may be referred to as a "cluster tool architecture" system. Deposition and patterning modules are vacuum-integrated, in accordance with the requirements of a particular process. Other modules, such as for etch, may also be included on the cluster.

A vacuum transport module (VTM) 938 interfaces with four processing modules 920*a*-920*d*, which may be individually optimized to perform various fabrication processes. By way of example, processing modules 920*a*-920*d* may be implemented to perform deposition, evaporation, ELD, dry development, etch, strip, and/or other semiconductor processes. For example, module 920*a* may be an ALD reactor that may be operated to perform in a non-plasma, thermal atomic layer depositions as described herein, such as Vector tool, available from Lam Research Corporation, Fremont, CA. And module 920*b* may be a PECVD tool, such as the Lam Vector®. It should be understood that the figure is not necessarily drawn to scale.

Airlocks 942 and 946, also known as a loadlocks or transfer modules, interface with the VTM 938 and a patterning module 940. For example, as noted above, a suitable patterning module may be the TWINSCAN NXE: 3300B® platform supplied by ASML of Veldhoven, NL). This tool architecture allows for work pieces, such as semiconductor substrates or wafers, to be transferred under vacuum so as not to react before exposure. Integration of the deposition modules with the lithography tool is facilitated by the fact that EUVL also requires a greatly reduced pressure given the strong optical absorption of the incident photons by ambient gases such as $H_2O$, $O_2$, etc.

As noted above, this integrated architecture is just one possible embodiment of a tool for implementation of the described processes. The processes may also be implemented with a more conventional stand-alone EUVL scanner and a deposition reactor, such as a Lam Vector tool, either stand alone or integrated in a cluster architecture with other tools, such as etch, strip etc. (e.g., Lam Kiyo or Gamma tools), as modules, for example as described with reference to FIG. 9 but without the integrated patterning module.

Airlock 942 may be an "outgoing" loadlock, referring to the transfer of a substrate out from the VTM 938 serving a deposition module 920*a* to the patterning module 940, and airlock 946 may be an "ingoing" loadlock, referring to the transfer of a substrate from the patterning module 940 back in to the VTM 938. The ingoing loadlock 946 may also provide an interface to the exterior of the tool for access and egress of substrates. Each process module has a facet that interfaces the module to VTM 938. For example, deposition process module 920*a* has facet 936. Inside each facet, sensors, for example, sensors 1-18 as shown, are used to detect the passing of wafer 926 when moved between respective stations. Patterning module 940 and airlocks 942 and 946 may be similarly equipped with additional facets and sensors, not shown.

Main VTM robot 922 transfers wafer 926 between modules, including airlocks 942 and 946. In one embodiment, robot 922 has one arm, and in another embodiment, robot 922 has two arms, where each arm has an end effector 924 to pick wafers such as wafer 926 for transport. Front-end robot 944, in is used to transfer wafers 926 from outgoing airlock 942 into the patterning module 940, from the patterning module 940 into ingoing airlock 946. Front-end robot 944 may also transport wafers 926 between the ingoing loadlock and the exterior of the tool for access and egress of substrates. Because ingoing airlock module 946 has the ability to match the environment between atmospheric and vacuum, the wafer 926 is able to move between the two pressure environments without being damaged.

It should be noted that a EUVL tool typically operates at a higher vacuum than a deposition tool. If this is the case, it is desirable to increase the vacuum environment of the substrate during the transfer between the deposition to the EUVL tool to allow the substrate to degas prior to entry into the patterning tool. Outgoing airlock 942 may provide this function by holding the transferred wafers at a lower pressure, no higher than the pressure in the patterning module 940, for a period of time and exhausting any off-gassing, so that the optics of the patterning tool 940 are not contaminated by off-gassing from the substrate. A suitable pressure for the outgoing, off-gassing airlock is no more than 1E-8 Torr.

In some embodiments, a system controller 950 (which may include one or more physical or logical controllers) controls some or all of the operations of the cluster tool and/or its separate modules. It should be noted that the controller can be local to the cluster architecture, or can be located external to the cluster architecture in the manufacturing floor, or in a remote location and connected to the cluster architecture via a network. The system controller 950 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain embodiments, the system controller executes system control software.

The system control software may include instructions for controlling the timing of application and/or magnitude of any aspect of tool or module operation. System control software may be configured in any suitable way. For example, various process tool component subroutines or control objects may be written to control operations of the process tool components necessary to carry out various process tool processes. System control software may be coded in any suitable compute readable programming language. In some embodiments, system control software includes input/output control (IOC) sequencing instructions for controlling the various parameters described above. For example, each phase of a semiconductor fabrication process may include one or more instructions for execution by the system controller. The instructions for setting process conditions for condensation, deposition, evaporation, patterning and/or etching phase may be included in a corresponding recipe phase, for example.

In various embodiments, an apparatus for forming a negative pattern mask is provided. The apparatus may include a processing chamber for patterning, deposition and etch, and a controller including instructions for forming a negative pattern mask. The instructions may include code for, in the processing chamber, patterning a feature in a chemically amplified (CAR) resist on a semiconductor substrate by EUV exposure to expose a surface of the substrate, developing the photopatterned resist, and etching the underlying layer or layer stack using the patterned resist as a mask. Development may be performed using a halide-containing chemistry.

It should be noted that the computer controlling the wafer movement can be local to the cluster architecture, or can be located external to the cluster architecture in the manufacturing floor, or in a remote location and connected to the cluster architecture via a network. A controller as described above with respect to any of FIG. 6, 7 or 8 may be implemented with the tool in FIG. 9.

Figure 10:
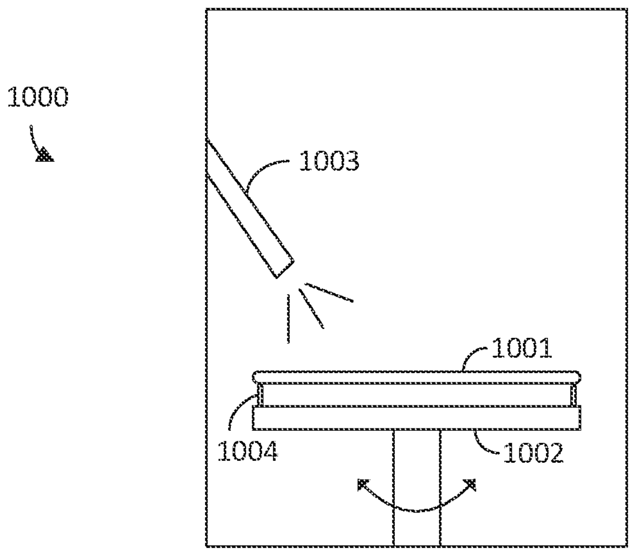
FIG. 10 depicts a wet processing chamber in accordance with various embodiments herein.

FIG. 10 depicts a simplified view of a wet processing chamber 1000 according to various embodiments. The wet processing chamber 1000 may be used for one or more operations described herein, such as wet photoresist deposition, wet backside and bevel edge cleaning, and/or wet photoresist development. The wet processing chamber 1000 may include a substrate support 1002 configured to support a substrate 1001 during processing. In the embodiment of FIG. 10, the substrate support 1001 includes a series of pins 1004 that support the substrate at its periphery. This allows for processing on one side of the substrate with minimal substrate contact on the opposite side. Such an embodiment is particularly useful for processing the backside of a substrate, as the substrate can be loaded upside down (e.g., frontside down) without damaging the frontside of the substrate. The substrate support 1002 may be configured to rotate during processing, as indicated by the double-headed arrow. A nozzle 1003 may be provided to dispense a processing fluid to a surface of the substrate 1001. Appropriate plumbing (not shown) may be provided to provide the nozzle 1003 with the relevant processing fluid, and to remove the processing fluid from the processing chamber 1000. In some cases the processing fluid may be recycled.

Experimental Results

Figure 11:
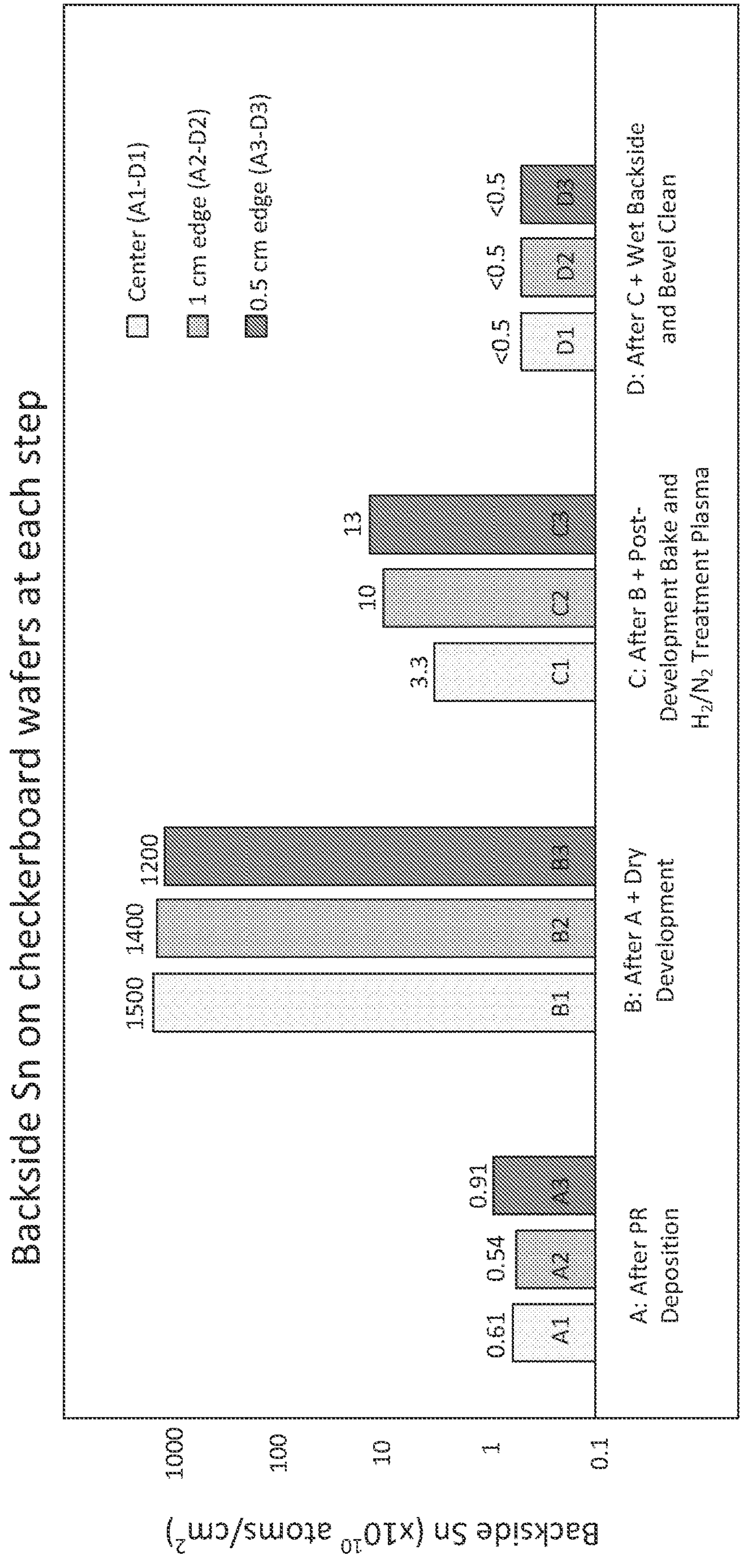
FIGS. 11 and 12 depict experimental results showing the concentration of tin on the backside of a substrate after various processing steps described herein.

FIG. 11 depicts experimental results showing the concentration of tin on the backside of a substrate after various processing steps described herein. Results were taken at four different times: (A) after photoresist deposition; (B) after A and dry development of the photoresist; (C) after B, post-development bake, and $H_2/N_2$ plasma treatment; and (D) after C and wet cleaning on substrate backside and bevel edge. At each time, three different measurements were taken, including (1) at the center of the substrate; (2) 1 cm from the edge of the substrate; and (3) 0.5 cm from the edge of the substrate. As an example, column A1 of FIG. 11 shows the tin concentration on the substrate at location 1 at time A.

At time A, the concentration of tin is between about 0.5E10 atoms/cm$^2$ and 1E10 atoms/cm$^2$. At time B, the concentration of tin is substantially higher due to contamination generated during the dry development step. For instance, at time B the concentration of tin is between about 12E12 atoms/cm$^2$ and 15E12 atoms/cm$^2$. The tin concentration is substantially reduced between times B and C as a result of the PDB treatment and the $H_2/N_2$ plasma treatment. At time C, the tin concentration ranges between about 3E10 atoms/cm$^2$ and 13E10 atoms/cm$^2$. The tin concentration is further reduced between times C and D as a result of the wet backside and bevel edge cleaning operation. At time D, the tin concentration is reduced to <0.5E10 atoms/cm$^2$. These concentrations are comparable, and even lower, than the starting concentrations at time A.

Figure 12:
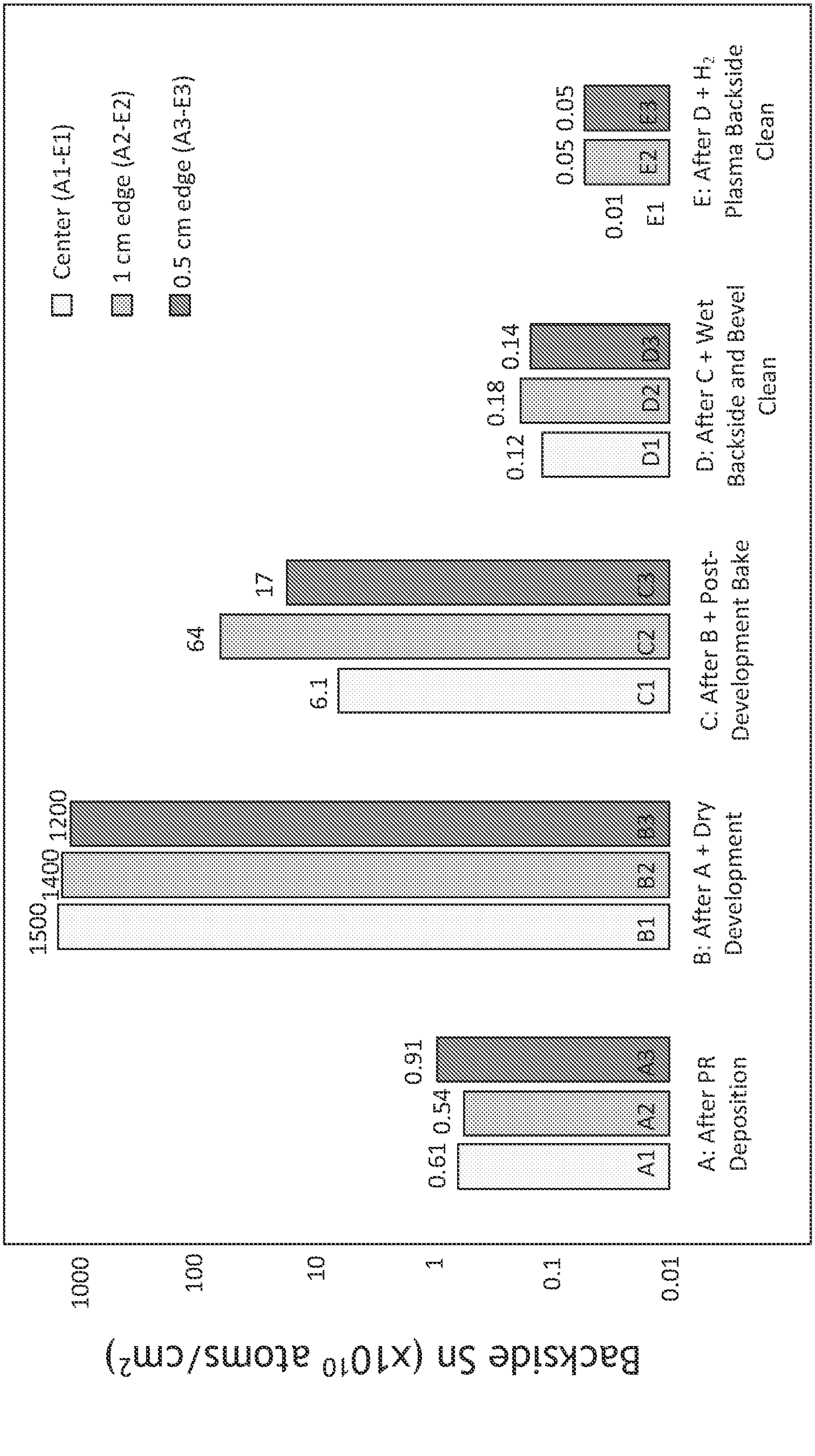

FIG. 12 depicts experimental results showing the concentration of tin contamination on the backside of a substrate after various processing steps described herein. Results were taken at five different times: (A) after photoresist deposition; (B) after A and dry development of the photoresist; (C) after B and a post development bake; (D) after C and wet cleaning on substrate backside and bevel edge; and (E) after D and dry cleaning on substrate backside with $H_2$ plasma. At each time, three different measurements were taken, including (1) at the center of the substrate; (2) 1 cm from the edge of the substrate; and (3) 0.5 cm from the edge of the substrate. As an example, column A1 of FIG. 12 shows the tin concentration on the substrate at location 1 at time A.

At time A, the concentration of tin is between about 0.5E10 atoms/cm$^2$ and 1E10 atoms/cm$^2$. At time B, the concentration of tin is substantially higher due to contamination generated during the dry development step. For example, at time B the concentration of tin is between about 12E12 atoms/cm$^2$ and 15E12 atoms/cm$^2$. The tin concentration is substantially reduced between times B and C as a result of the post development bake treatment. At time C, the tin concentration ranges between about 6E10 atoms/cm$^2$ and 65E10 atoms/cm$^2$. The tin concentration is further reduced between times C and D as a result of the wet backside and bevel edge cleaning operation. At time D, the tin concentration ranges between about 0.1E10 atoms/cm$^2$ and 0.2E10 atoms/cm$^2$. The tin concentration continues to decrease between times D and E as the backside of the substrate is exposed to the $H_2$ plasma. At time E, the tin concentration ranges between about 0.01E10 atoms/cm$^2$ and 0.05E10 atoms/cm$^2$.

Notably, FIG. 12 shows that the post development bake enabled a substantial reduction in tin concentration on the backside of the substrate. Further, the backside wet clean reduced the tin concentration to <1E10 atoms/cm$^2$, and the addition of the $H_2$ plasma to clean the backside of the substrate further reduced the backside tin concentration by a factor of about 4.

Figure 13A:
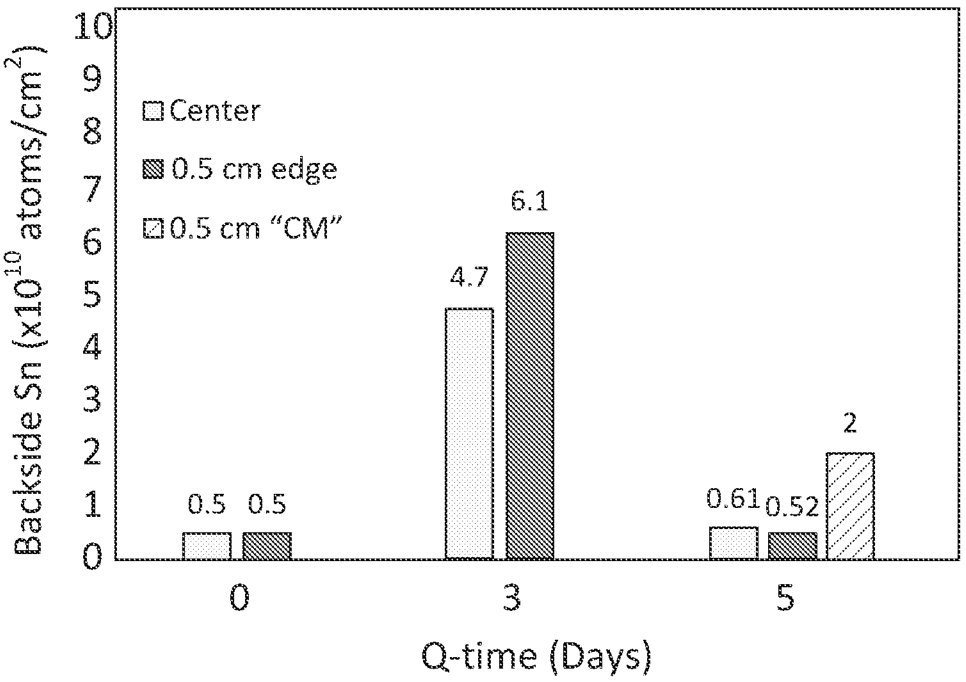
FIGS. 13A and 13B depict experimental results showing the concentration of tin on the backside of the substrate over different durations of queue time.
Figure 13B:
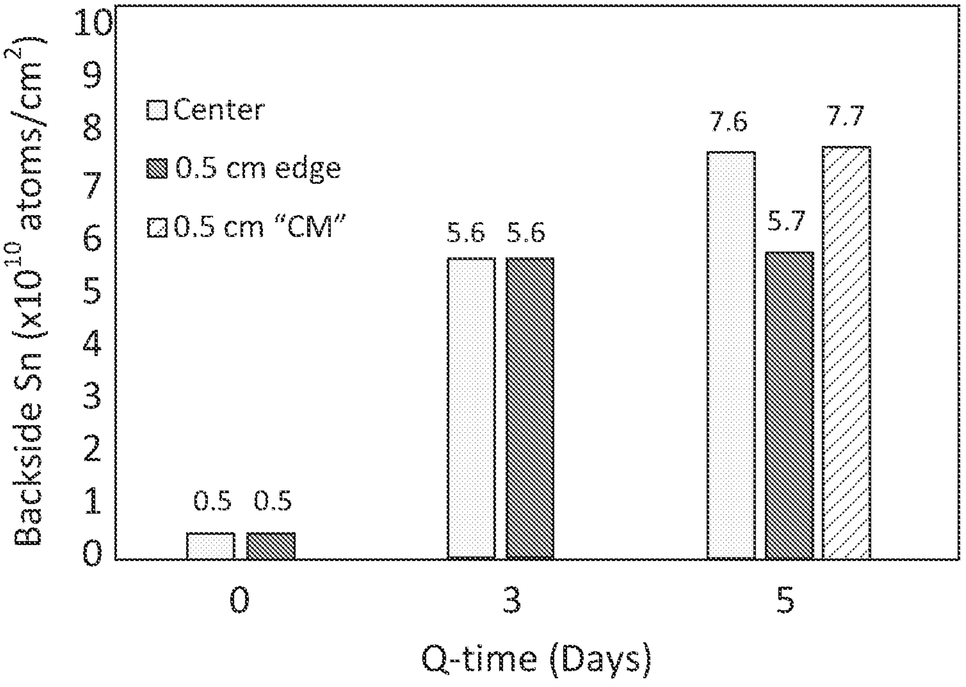

FIGS. 13A and 13B depict experimental results showing the benefit of adding a plasma treatment to the post development bake. In this example, the process flow involved (1) depositing the photoresist; (2) wet cleaning the backside of the substrate; (3) dry developing the photoresist; (4) performing a post development bake (with and without a plasma treatment step); (5) wet cleaning the backside of the substrate again; (6) exposing the substrate to typical queue conditions for various durations; and (7) performing metrology to measure the concentration of tin on the backside of the substrate after the different queue durations. The tin concentrations were measured at three different times, including queue times of 0 days, 3 days, and 5 days. At 0 days and 3 days, and 5 days, the tin concentrations were measured at the center of the substrates and 0.5 cm from the edge of the substrates. Further, at 5 days the tin concentrations were measured at 0.5 cm from the edge of the substrates along a crescent moon shape (CM). The measurements were done on the backside of the substrates.

FIG. 13A shows the results for cases where the post development bake step did not include any plasma treatment. By contrast, FIG. 13B shows the results for cases where the post development bake step included a plasma treatment. The plasma treatment in this example involved exposing the substrate to a $H_2/N_2$ plasma during the post development bake process. As seen in FIGS. 13A and 13B, both treatment processes resulted in similar backside tin concentrations when the queue time was 0 days or 3 days. When the queue time was increased to days, the substrates that were exposed to the plasma treatment during the post development bake step showed substantially lower backside tin concentrations compared to the substrates that were not exposed to plasma during this step. These results show that the plasma treatment during the post development bake step does not have a negative effect on available queue time (e.g., the time available before the backside tin concentration climbs to an unacceptably high level as a result of the issues described herein). In fact, such a plasma treatment may lengthen the available queue time in many cases.

Figure 14:
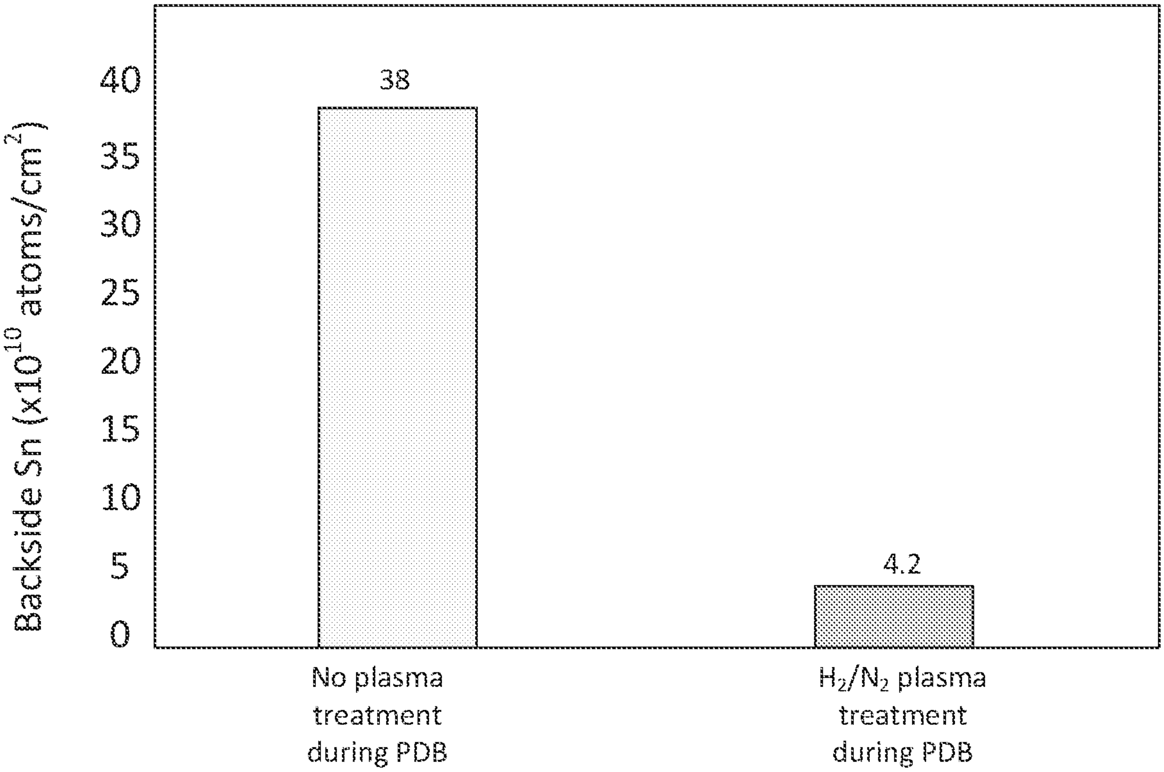
FIG. 14 depicts experimental results showing the benefit of adding a plasma treatment during a post development bake step.

FIG. 14 shows experimental results that show the effectiveness of adding a plasma treatment to the post development bake. These results are in line with those shown in FIGS. 13A and 13B. In the example of FIG. 14, the process flow involved (1) depositing the photoresist; (2) wet cleaning the backside of the substrate; (3) dry developing the photoresist; (4) performing a post development bake (with and without a plasma treatment step); (5) wet cleaning the backside of the substrate again; (6) exposing the substrate to typical queue conditions for a duration of about 2 days; and (7) performing metrology to measure the concentration of tin on the backside of the substrate after the queue. The plasma treatment during the post development bake involved exposing the substrate to $H_2/N_2$ plasma. As shown in FIG. 14, where no plasma treatment was used during the post development bake, the resulting backside tin concentration after two days of queue time was about 38E10 atoms/cm$^2$. When the plasma treatment was added to the post development bake, the resulting backside tin concentration after two days of queue time was only about 4.2E10 atoms/cm$^2$. This represents a reduction in backside tin concentration by nearly an order of magnitude.

Figure 15:
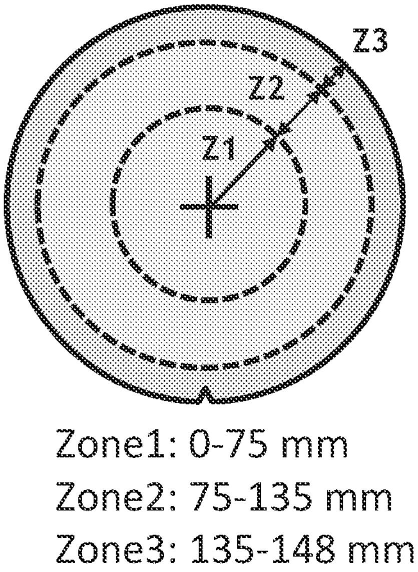
FIG. 15 depicts experimental results showing where the remaining tin contamination is concentrated after various processing steps described herein.

FIG. 15 depicts a substrate divided into three different analysis zones (Z1-Z3), and a table reporting the backside tin concentration within each zone. The first zone (Z1) corresponds to the central circular portion of the substrate, out to a radius of about 75 mm. The second zone (Z1) corresponds to the middle annular portion of the substrate, from a radius of about 75 mm to a radius of about 135 mm. The third zone (Z3) corresponds to the outer annular portion of the substrate, from a radius of about 135 mm to a radius of about 148 mm. In this example, the process flow involved (1) depositing the photoresist; (2) wet cleaning the backside of the substrate; (3) dry developing the photoresist; (4) performing a post development bake with a plasma treatment step; (5) wet cleaning the backside of the substrate again; (6) exposing the substrate to typical queue conditions for a duration of about 4.5 days; and (7) performing metrology to measure the concentration of tin on the backside of the substrate after the queue. The plasma treatment during the post development bake step involved exposing the substrate to $H_2/N_2$ plasma. The results in FIG. 15 show that after this series of operations, most of the tin contamination remaining on the backside of the substrate is located in the third zone, e.g., near the edge of the substrate.

Figure 16A:
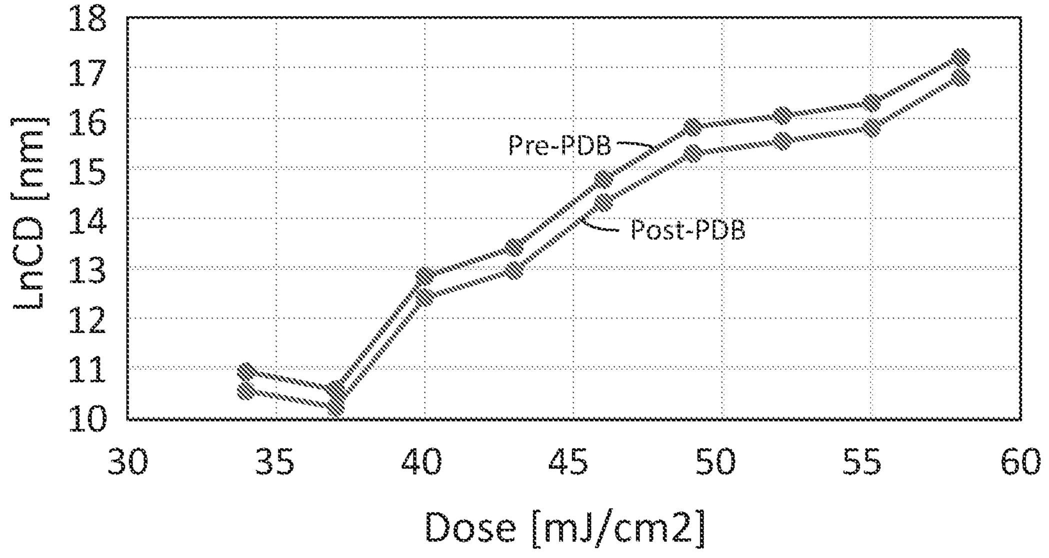
FIGS. 16A and 16B depict experimental results showing the effectiveness of a post development bake process as described herein, particularly with regard to line critical dimension (FIG. 16A) and line width roughness (FIG. 16B).
Figure 16B:
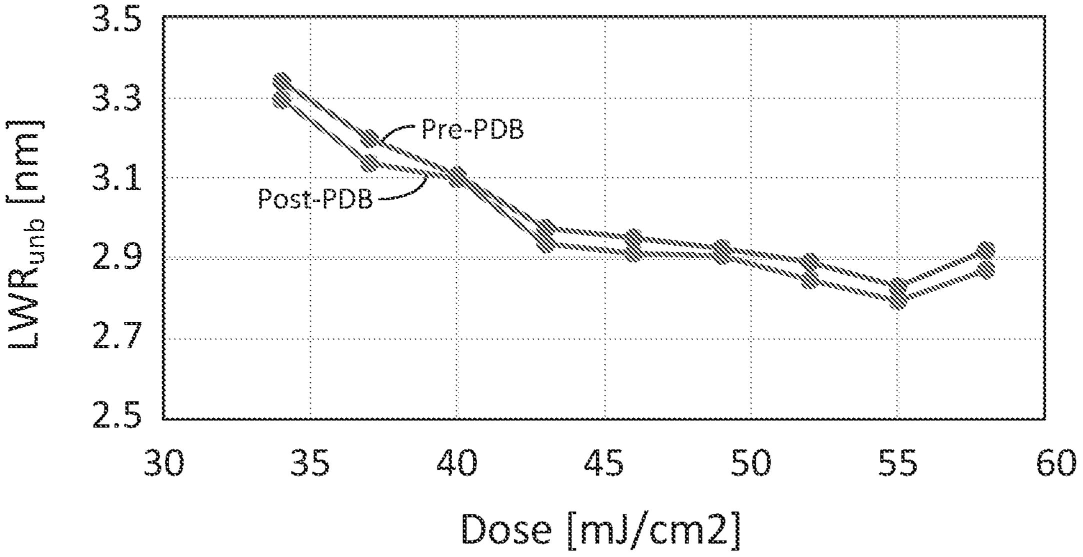

FIGS. 16A and 16B depict experimental results showing the improvement in line critical diameter (FIG. 16A) and line width roughness (FIG. 16B) across the range of typical EUV dose as a result of a post development bake step that involved exposing the substrate to an $H_2/N_2$ plasma treatment. These figures show measurements taken at two times, including before the post development bake step and after the post development bake step. FIG. 16A shows that the post development bake and plasma treatment step resulted in a reduction in line critical diameter of about 0.4-0.5 nm across the EUV dose range. This represented a reduction of between about 2-4% at each dose. Likewise, FIG. 16B shows that the post development bake and plasma treatment step resulted in a reduction in line width roughness across the EUV dose range.

Figure 17A:
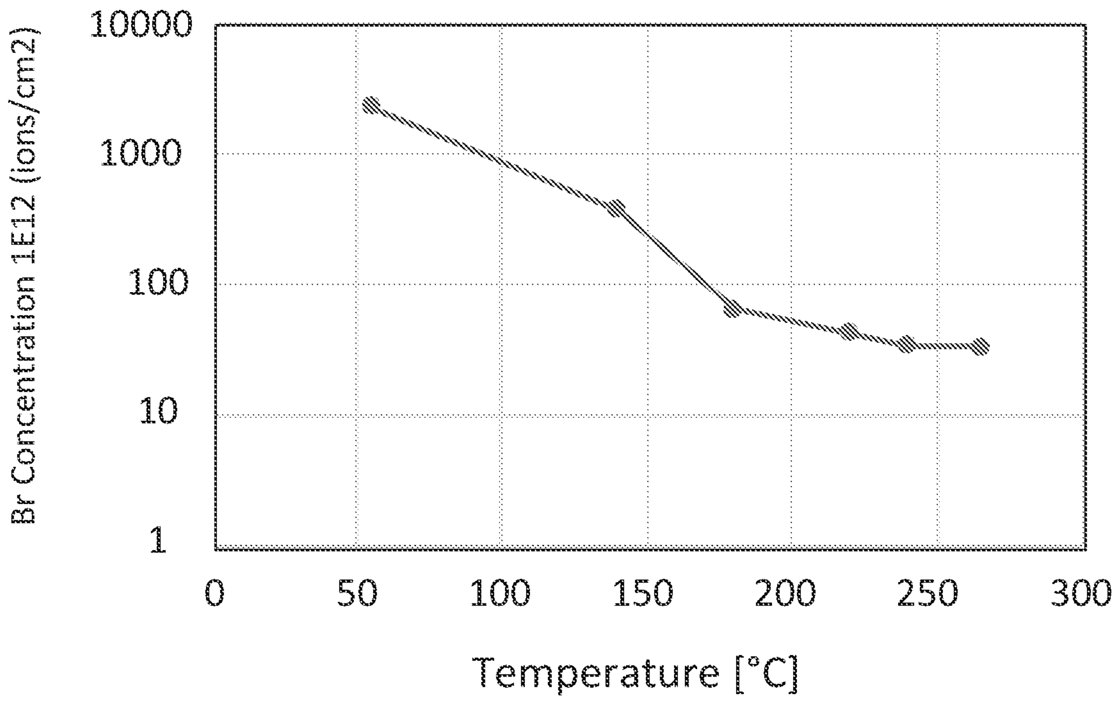
FIGS. 17A and 17B depict experimental results showing the concentration of residual bromine on the front side of a substrate (FIG. 17A) and the concentration of tin contamination on the backside of a substrate (FIG. 17B) after processing in a post development bake performed at various temperatures.
Figure 17B:
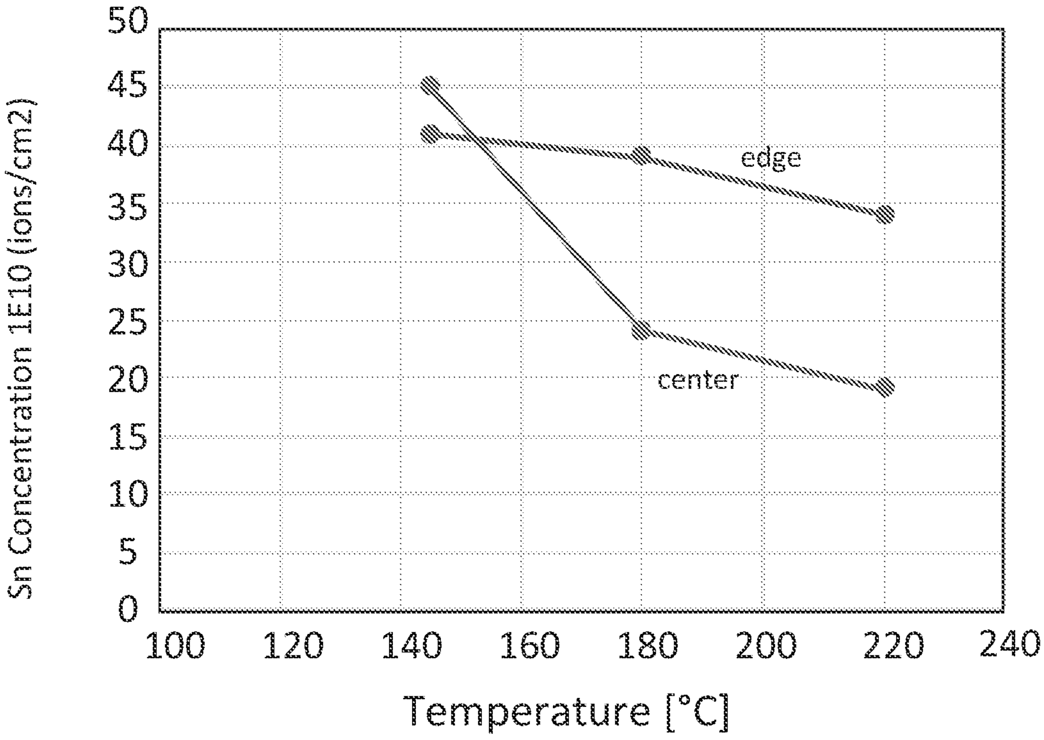

FIGS. 17A and 17B depict experimental results showing the concentration of residual bromine on the front side of a substrate (FIG. 17A) and the concentration of tin contamination on the backside of a substrate (FIG. 17B) after processing in a post development bake performed at various temperatures. In this example, the development process was a dry development process, and no wet clean (or other cleaning process) was performed between the post development bake process and the metrology. FIG. 17A shows exposing the substrate to the post development bake process dramatically reduces the concentration of bromine on the substrate. As the temperature of the post development bake increases, the residual bromine concentration substantially decreases. At higher temperatures (e.g. above about 250° C.), this benefit tapers off. FIG. 17B shows that as the post development bake temperature increases, the concentration of tin contamination on the backside of the substrate decreases. The tin concentration decreased at both the center and the edge of the substrate, and the decrease near the center of the substrate was particularly large.

Figure 18A:
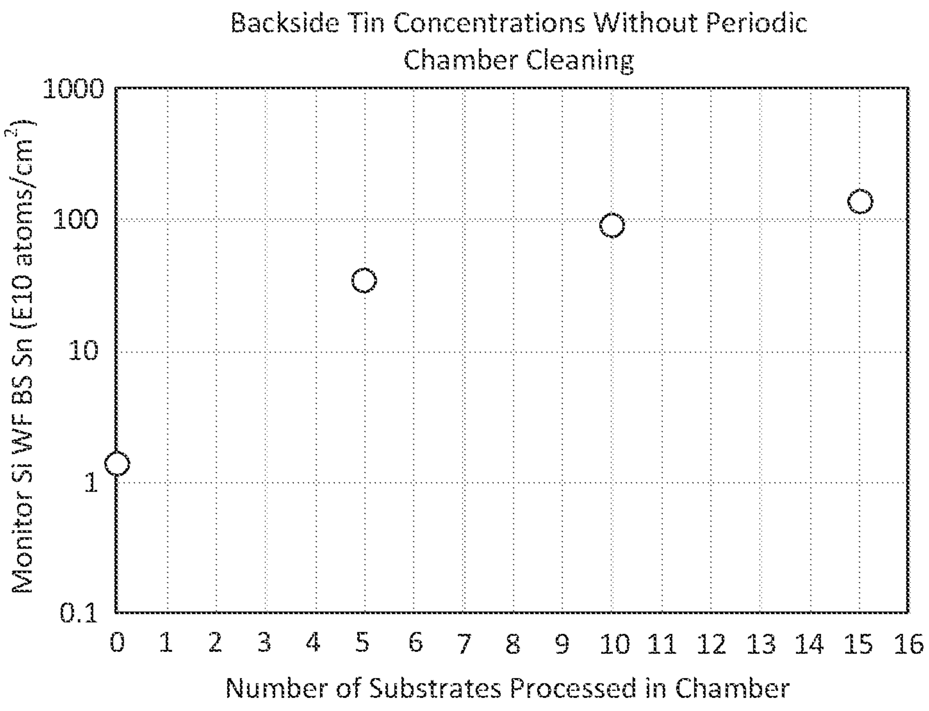
FIGS. 18A and 18B depict experimental results showing the benefit of periodically cleaning the process chamber used for performing the post development bake process.
Figure 18B:
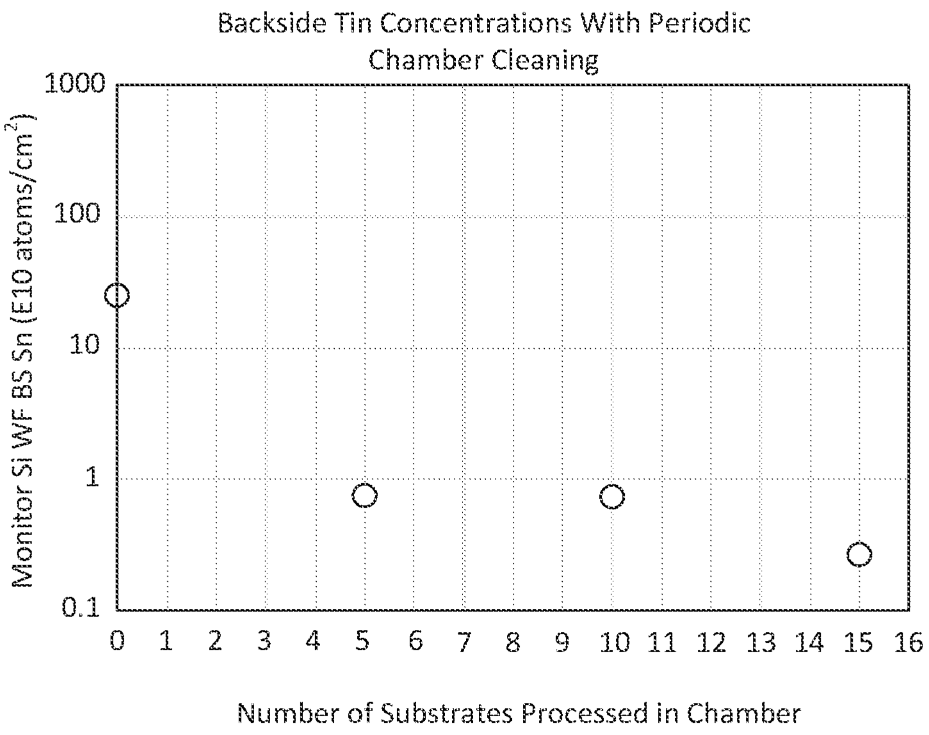

FIGS. 18A and 18B depict experimental results showing the benefit of periodically cleaning the process chamber used for performing the post development bake process. A first series of substrates shown in FIG. 18A was processed using a post development bake step, with no chamber cleaning being performed between substrates. A second series of substrates shown in FIG. 18B was processed using a post development bake step, with the chamber being cleaned after each substrate was baked. In both cases, the tin concentrations were measured after each $5^{th}$ substrate was processed (e.g., after 5 substrates, after 10 substrates, etc.). FIG. 18A shows that when the chamber is not periodically cleaned, the concentration of backside tin contamination continues to increase as additional substrates are processed. In fact, the backside tin concentration is about 2 orders of magnitude higher after 10 substrates are processed, reaching over 100E10 atoms/$cm^2$. This increase is substantial and undesirable. By contrast, FIG. 18B shows that when the chamber is periodically cleaned, the concentration of backside tin contamination remains low and stable, at a level under 1E10 atoms/$cm^2$. This low and stable tin concentration was achieved even when the starting concentration was over 10E10 atoms/$cm^2$, over an order of magnitude higher.

Figure 19A:
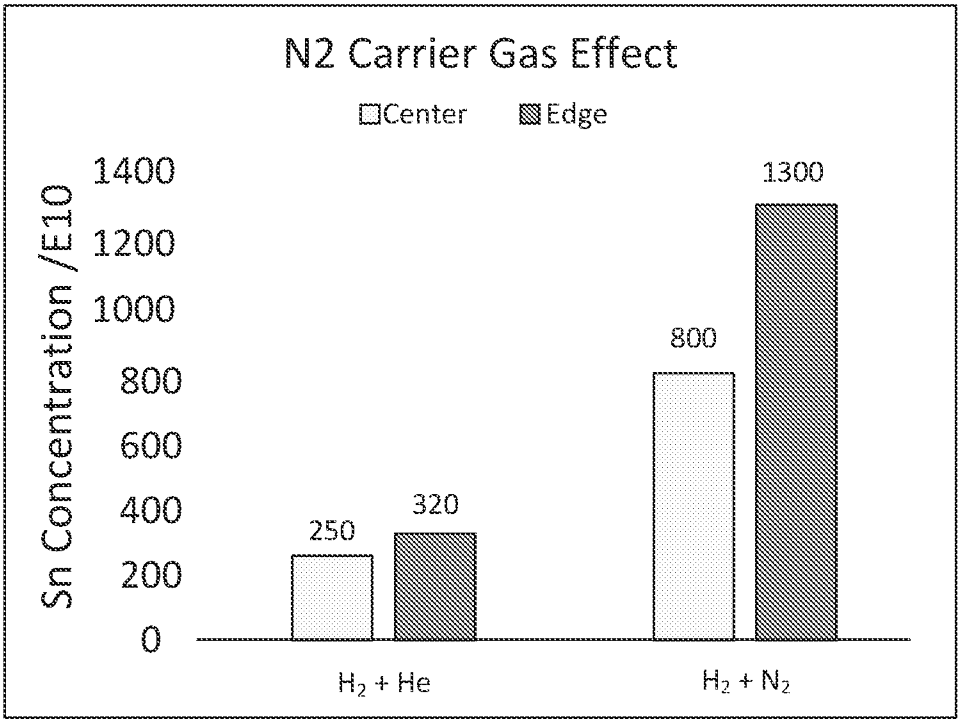
FIGS. 19A and 19B show experimental results related to optimization of a plasma treatment according to various embodiments.
Figure 19B:
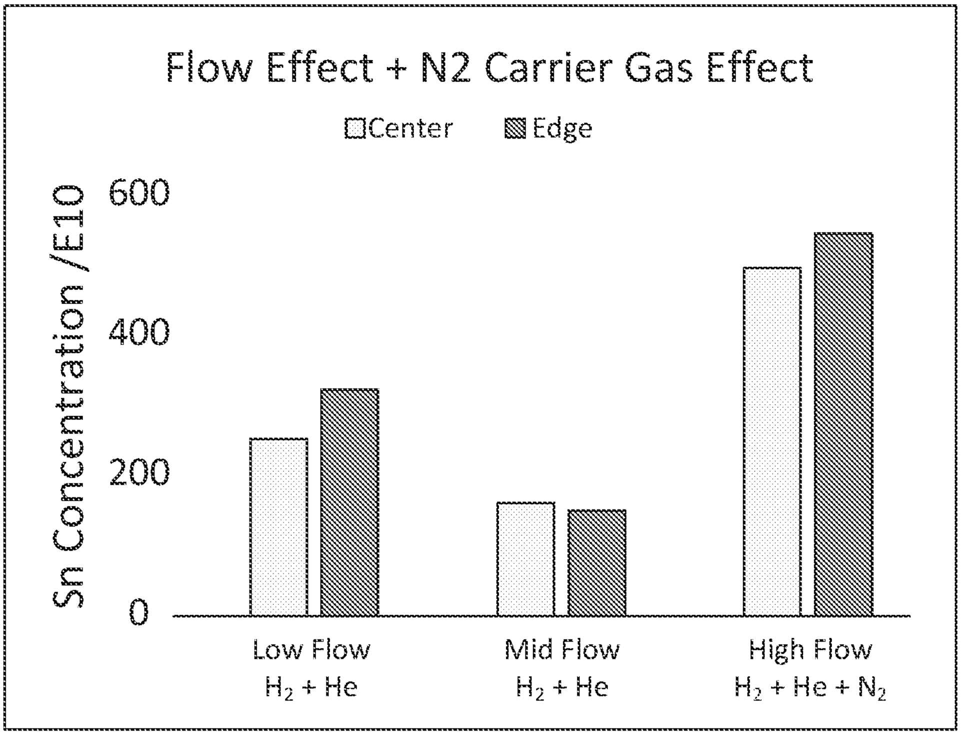

FIGS. 19A and 19B show experimental results related to optimization of a plasma treatment according to various embodiments at lower temperatures. FIG. 19A looks at the effect of different carrier gases on backside tin concentration, while FIG. 19B looks at the effect of total flow rate on backside tin concentration. In all of the examples related to FIGS. 19A and 19B, the plasma treatment involved exposing the substrate to plasma generated from hydrogen ($H_2$), with either helium, nitrogen ($N_2$), or a combination of helium and nitrogen used as a carrier gas. The hydrogen was present at a concentration of about 5% by volume in each case. As shown in FIG. 19A, the $H_2$/He plasma treatment resulted in substantially lower backside tin concentration compared to the $H_2/N_2$ plasma treatment. This suggests that helium provides better tin reduction results compared to nitrogen when acting as a carrier gas for hydrogen. FIG. 19B shows results from three different plasma treatments. A first plasma treatment involved a low flow situation where the substrate was exposed to plasma generated from $H_2$/He. A second plasma treatment involved a mid-flow situation where the substrate was exposed to plasma generated from $H_2$/He, where the flow of $H_2$/He was about double the flow compared to the first plasma treatment. A third plasma treatment involved a high flow situation where the substrate was exposed to plasma generated from $H_2/He/N_2$, and where the flow of $H_2/He/N_2$ was about three times the flow of $H_2$/He used in the first plasma treatment. In this example, doubling the flow rate of $H_2$/He resulted in reducing the concentration of backside tin contamination. The addition of a substantial amount of $N_2$ in the third plasma treatment resulted in increasing the backside tin contamination.

Additional Embodiments

Figure 20:
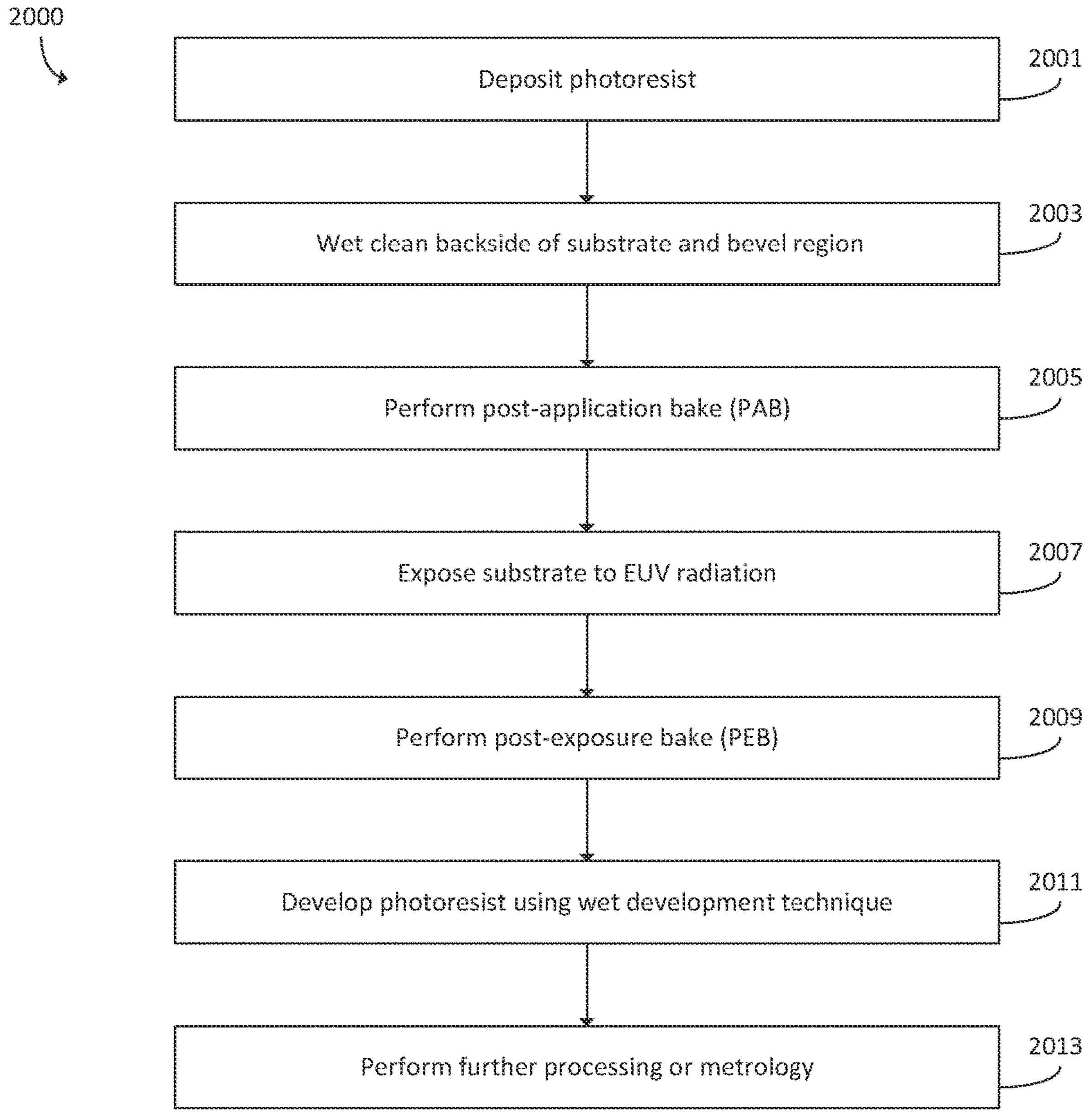
FIGS. 20 and 21 illustrate example process flows according to various embodiments.
Figure 21:
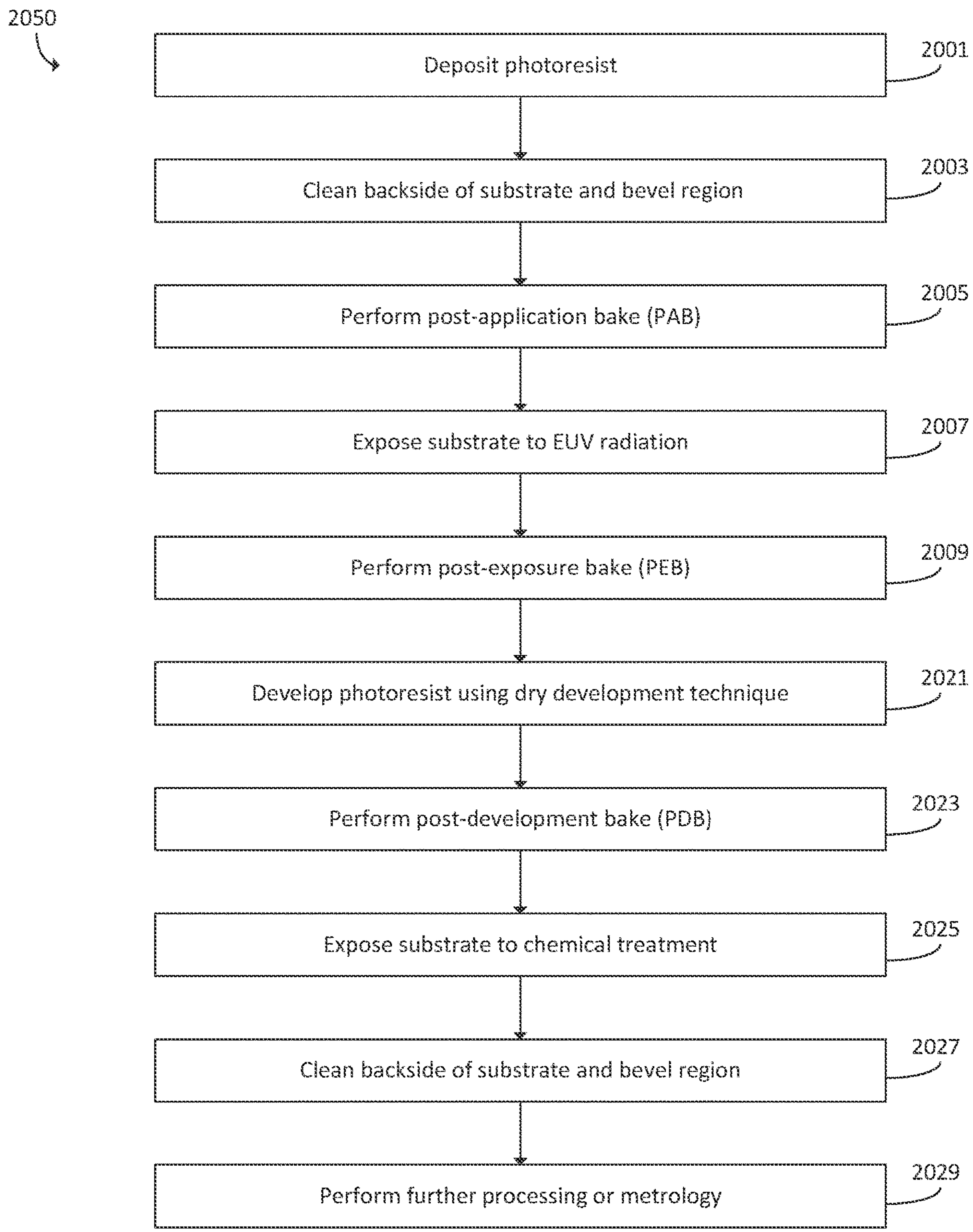

FIGS. 20 and 21 illustrate example process flows according to various embodiments. In the example of FIG. 20, the substrate is processed using wet development techniques. In the example of FIG. 21, the substrate is processed using dry development techniques. The steps described in FIGS. 20 and 21 may be combined with any one or more of the techniques described herein. Further, any details provided herein with respect to particular steps may also apply when practicing the corresponding steps in FIGS. 20 and 21. For the sake of brevity, such details will not be repeated.

The wet development method 2000 of FIG. 20 begins with operation 2001, where photoresist is deposited on a substrate. The photoresist may be a metal-containing photoresist as described herein. At operation 2003, the substrate is cleaned using a wet cleaning technique, particularly targeting the backside and bevel edge region of the substrate. At operation 2005, the substrate is exposed to a post-application bake. At operation 2007, the substrate is exposed to EUV radiation to begin patterning the photoresist. At operation 2009, the substrate is exposed to a post exposure bake. At operation 2011, the photoresist is developed using a wet development technique. At operation 2013, the substrate may be exposed to metrology or further processing. The further processing may involve one or more of the techniques described herein The dry development method 2050 of FIG. 21 begins in a manner similar to the method of FIG. 20. For example, operations 2001, 2003, 2005, 2007, and 2009 are the same as those in FIG. 20. After operation 2009, the method of FIG. 21 continues with operation 2021, where the photoresist is developed using a dry development technique. Next, at operation 2023, the substrate is exposed to a post development bake. At operation 2025, the substrate is exposed to a chemical treatment. In various examples, the chemical treatment in operation 2025 may coincide with the photoresist dry development at operation 2021 and/or with the post development bake at operation 2023. In other examples, the chemical treatment in operation 2025 may occur separately, for example between operations 2021 and 2023, or between operations 2023 and 2027. At operation 2027, the substrate is exposed to a wet clean operation to clean the backside of the substrate. At operation 2029, the substrate may be exposed to metrology or further processing.

While FIGS. 20 and 21 lay out a number of specific operations, it is understood that one or more of these steps may be omitted in various embodiments. Any subset of the steps shown in FIG. 20 or 21 may be used in various embodiments.

Conclusion

Processes and apparatuses for controlling metallic contamination on a semiconductor substrate is disclosed. In many embodiments, the processes and apparatuses may be used in connection with deposition, development, and/or treatment of a metal-containing photoresist such as an EUV photoresist. Other applications such as in-situ clean, mandrel pull, smoothing, and photoresist descum applications may also benefit from the disclosed embodiments.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the disclosure is not to be limited to the details given herein, but may be modified within the scope of the disclosure.

What is claimed is:

1. A method of controlling contamination on a substrate, the method comprising:

(a) either (i) processing a frontside of the substrate, thereby causing formation of contamination on a backside of the substrate, or (ii) receiving the substrate with contamination on the backside of the substrate, the contamination comprising a metal, wherein the operations of (i) and (ii) are performed after exposing a layer of photoresist to an EUV and after or during at least a portion of the layer of the photoresist being removed by a development chemistry to form a pattern; and (b) after (a), heating the substrate in a post-processing bake process, wherein the post-processing bake process of (b) is a post-development bake process that occurs after exposing the layer of photoresist to the EUV and at least a portion of the layer of photoresist is removed by the development chemistry to form the pattern, and wherein the post-development bake process of (b), the substrate is baked at a temperature between about 160-250° C. for a duration between about 1-10 minutes.

2. The method of claim 1, wherein processing the frontside of the substrate comprises at least one process selected from the group consisting of: developing the layer of photoresist; in-situ cleaning the substrate; pulling a mandrel in a patterning application; smoothing a feature on the substrate; and descumming the layer of photoresist.

3. The method of claim 2, wherein (a) comprises either (i) developing the layer of photoresist on the substrate, or (ii) receiving the substrate with the layer of photoresist developed on the frontside of the substrate and contamination on the backside of the substrate, and wherein the metal in the contamination originates from the layer of photoresist on the frontside of the substrate.

4. The method of claim 1, further comprising exposing the substrate to a processing gas, the processing gas comprising at least one gas selected from the group consisting of $N_2$, $H_2$, Ar, He, Xe, and combinations thereof.

5. The method of claim 3, further comprising exposing the substrate to a reactive processing gas to increase a volatility of a metal-containing material on the substrate, the metal containing material comprising the metal.

6. The method of claim 3, further comprising exposing the substrate to a reactive processing gas to increase a stability of a metal-containing material on the substrate, the metal containing material comprising the metal.

7. The method of claim 3, further comprising exposing the substrate to a reactive processing gas selected from the group consisting of a chlorine-containing gas, an oxygen-containing gas, a fluorine-containing gas, ammonia ($NH_3$), hydrogen iodide (HI), diatomic iodine ($I_2$), and combinations thereof.

8. The method of claim 7, wherein the substrate is exposed to the chlorine-containing gas and the chlorine-containing gas comprises at least one gas selected from the group consisting of $BCl_3$, $Cl_2$, HCl, $SiCl_4$, $SOCl_2$, $PCl_3$, and combinations thereof.

9. The method of claim 7, wherein the substrate is exposed to the oxygen-containing gas and the oxygen-containing gas comprises at least one gas selected from the group consisting of $O_2$, $O_3$, $H_2O$, $SO_2$, $CO_2$, CO, COS, $H_2O_2$, $NO_x$, and combinations thereof.

10. The method of claim 7, wherein the substrate is exposed to the fluorine-containing gas, the fluorine-containing gas comprising at least one gas selected from the group consisting of HF, $C_xF_yH_z$, $NF_3$, $SF_6$, $F_2$, and combinations thereof.

11. The method of claim 1, further comprising exposing the substrate to plasma to increase a volatility of a metal-containing material on the substrate, the metal containing material comprising the metal.

12. The method of claim 3, further comprising exposing the substrate to plasma to increase a stability of a metal-containing material on the substrate, the metal containing material comprising the metal.

13. The method of claim 3, further comprising exposing the substrate to plasma generated from a plasma generation gas comprising at least one gas selected from the group consisting of diatomic hydrogen ($H_2$), diatomic nitrogen ($N_2$), argon, helium, krypton, methane ($CH_4$), an oxygen-containing gas, a fluorine-containing gas, a chlorine-containing gas, a hydrogen halide, and combinations thereof.

14. The method of claim 13, wherein the plasma generation gas comprises the oxygen-containing gas, the oxygen-containing gas comprising at least one gas selected from the group consisting of $O_2$, $O_3$, CO, $CO_2$, COS, $SO_2$, $NO_x$, $H_2O$, and combinations thereof.

15. The method of claim 13, wherein the plasma generation gas comprises the fluorine-containing gas, the fluorine-containing gas comprising at least one gas selected from the group consisting of $NF_3$, $CF_4$, $CH_3F_3$, $CH_2F_2$, $CHF_3$, $F_2$, $SF_6$, and combinations thereof.

16. The method of claim 13, wherein the plasma generation gas comprises the chlorine-containing gas, the chlorine-containing gas comprising at least one gas selected from the group consisting of $BCl_3$, $Cl_2$, HCl, $SiCl_4$, $SOCl_2$, $PCl_3$, and combinations thereof.

17. The method of claim 13, wherein the plasma generation gas comprises (i) the diatomic hydrogen ($H_2$), and (ii) at least one of diatomic nitrogen ($N_2$) or a noble gas.

18. The method of claim 1, wherein heating the substrate in the post-development bake process reduces the concentration of the metal on the backside of the substrate by at least an order of magnitude.

19. The method of claim 1, further comprising exposing the substrate to plasma, wherein heating the substrate in the post-development bake process and exposing the substrate to plasma reduces the concentration of the metal on the backside of the substrate by at least two orders of magnitude.

20. The method of claim 1, further comprising exposing the substrate to light to reduce a concentration of the metal on the backside of the substrate.

21. The method of claim 20, wherein the light comprises at least one of UV wavelengths, visible wavelengths, or IR wavelengths.

22. The method of claim 21, wherein the light is provided via an IR lamp or a plurality of LEDs, wherein the substrate is heated to a temperature between about 250-400° C. for a duration of about 60 seconds or less while the substrate is exposed to the light.

23. The method of claim 1, wherein heating the substrate in the post-development bake process begins while the layer of photoresist is still being developed on the substrate.

24. The method of claim 1, further comprising transferring the substrate from a first processing chamber to a second processing chamber after (a), such that (a) occurs in the first processing chamber and (b) occurs in the second processing chamber.

25. The method of claim 1, wherein (a) occurs in a processing chamber, the method further comprising heating the processing chamber to a temperature of about 40° C. or greater while the layer of photoresist is developed in (a).

26. The method of claim 1, wherein (a) occurs in a processing chamber, the method further comprising purging the processing chamber while maintaining the processing chamber at a temperature of about 100° C. or greater, the purge occurring after (a).

27. The method of claim 26, the method further comprising sweeping the processing chamber with inert gas, wherein the purge and the sweeping are part of a pump purge sequence.

28. The method of claim 1, further comprising performing a wet clean on the backside of the substrate after (a) and (b).

29. The method of claim 28, wherein performing the wet clean on the backside of the substrate further reduces the concentration of the metal on the backside of the substrate by at least an order of magnitude.

30. The method of claim 28, wherein the wet clean also cleans a bevel edge region on the frontside of the substrate.

31. The method of claim 28, wherein performing the wet clean on the backside of the substrate comprises exposing the backside of the substrate to dilute HF.

32. The method of claim 31, wherein performing the wet clean on the backside of the substrate further comprises exposing the backside of the substrate to dilute HCl or to a standard clean 1 solution comprising $NH_4OH$, $H_2O_2$, and $H_2O$.

33. The method of claim 3, wherein the layer of photoresist is formed using dry deposition.

34. The method of claim 1, wherein the layer of photoresist is formed using wet deposition.

35. The method of claim 1, wherein the layer of photoresist is developed using dry processing.

36. The method of claim 35, wherein the layer of photoresist is developed using halogen-containing chemistry.

37. The method of claim 3, wherein the layer of photoresist is developed using wet processing.

38. The method of claim 3, wherein the post-development bake process of (b) occurs in a processing chamber, and wherein the following conditions are used during the post-development bake process of (b):

(i) a pressure in the processing chamber is maintained between about 0.01-1 Torr, (ii) a chlorine-containing gas is provided to the processing chamber at a rate of about 200-10,000 sccm for a duration between about 1-10 minutes, (iii) a temperature of one or more components of the processing chamber are maintained between about 20-150° C., and (iv) the substrate is not exposed to plasma during (b).

39. The method of claim 3, wherein the layer of photoresist is developed in (a) in a processing chamber, wherein (b) occurs in the same processing chamber as (a), the method further comprising purging the processing chamber using the following conditions:

(i) a pressure in the processing chamber is between about 0.01-1 Torr, (ii) a flow of purge gas is provided to the processing chamber at a rate between about 200-10,000 sccm, the purge gas comprising at least one gas selected from the group consisting of diatomic nitrogen ($N_2$), a noble gas, and combinations thereof, the purge gas being provided to the processing chamber for a duration between about 1-10 minutes, and (iii) one or more components of the processing chamber are maintained between about 100-300° C., and a substrate support within the processing chamber is maintained between about 120-300° C.

40. The method of claim 3, wherein (a) occurs in a first processing chamber and (b) occurs in a second processing chamber, wherein the following conditions are used during the post-development bake process of (b):

(i) a pressure in the second processing chamber is between about 0.1-760 Torr, (ii) a flow of gas is provided to the second processing chamber at a rate of about 200-10,000 sccm for a duration between about 1-10 minutes, wherein the substrate is exposed to the flow of gas, the flow of gas comprising at least one of air, diatomic nitrogen ($N_2$), diatomic oxygen ($O_2$), water ($H_2O$), a noble gas, or a combination thereof, and (iii) the substrate is baked at a temperature between about 140-300° C.

41. The method of claim 3, further comprising exposing the substrate to plasma in a processing chamber under the following conditions:

(i) a pressure in the processing chamber is between about 0.1-1 Torr, (ii) a plasma generation gas is provided at a rate between about 50-5,000 sccm for a duration between about 3-30 seconds, the plasma generation gas comprising at least one gas or gas mixture selected from the group consisting of (a) $H_2$, (b) $H_2$ and $N_2$, (c) $H_2$ and a noble gas, (d) $N_2$, without $H_2$, (e) a noble gas, without $H_2$, (f) an oxygen-containing gas, (g) a fluorine-containing gas, and (h) combinations thereof, and (iii) plasma is generated from the plasma generation gas and the substrate is exposed to the plasma.

42. The method of claim 3, wherein at least one of (a) and (b) occurs in a processing chamber, the method further comprising cleaning the processing chamber to remove the metal from interior surfaces of the processing chamber.

43. The method of claim 42, wherein the processing chamber is cleaned using the following conditions:

(i) a pressure in the processing chamber is between about 0.1-10 Torr, (ii) a plasma comprising H radicals is exposed to the processing chamber, wherein the H radicals react with the metal on the interior surfaces of the processing chamber to form a metal hydride, (iii) the plasma is generated using an RF power between about 300-4,000 Watts, and (iv) the processing chamber is maintained between about 25-250° C.

44. The method of claim 42, wherein the processing chamber is cleaned using the following conditions:

(i) a pressure in the processing chamber is between about 0.1-10 Torr, and is cycled between a lower pressure and a higher pressure as part of a pumping and purging process, (ii) the processing chamber is not exposed to plasma during cleaning, (iii) a gas flow is provided to the processing chamber during cleaning, the gas flow comprising at least one gas selected from the group consisting of diatomic nitrogen ($N_2$), diatomic oxygen ($O_2$), a noble gas, and combinations thereof, and (iv) the processing chamber is maintained between about 25-250° C.

45. The method of claim 1, further comprising performing a wet clean on the backside of the substrate using the following conditions:

(i) in a first step, the substrate is exposed to a first cleaning solution provided at a rate of about 1-3 L/min, the first cleaning solution comprising dilute HF, (ii) in a second step, the substrate is exposed to a second cleaning solution provided at a rate of about 1-3 L/min, wherein the second cleaning solution comprises a solution selected from the group consisting of dilute HCl, standard clean 1, and combinations thereof, (iii) the first step and second step together have a duration between about 20-300 seconds, and (iv) the substrate is maintained between about 15-60° C.

46. The method of claim 1, wherein the concentration of the metal on at least one of the backside or bevel edge region of the substrate is reduced by at least an order of magnitude to about 1E11 atoms/$cm^2$ or less.

47. The method of claim 46, wherein the concentration of the metal on at least one of the backside or bevel edge region of the substrate is reduced by at least an order of magnitude to about 1E10 atoms/$cm^2$ or less.

48. The method of claim 1, wherein the metal is tin.

49. A method of controlling contamination on a substrate, the method comprising:

(a) either (i) processing a frontside of the substrate, thereby causing formation of contamination on a backside of the substrate, or (ii) receiving the substrate with contamination on the backside of the substrate, the contamination comprising a metal, wherein the operations of (i) and (ii) are performed after exposing a layer of photoresist to an EUV and after or during at least a portion of the layer of the photoresist being removed by a development chemistry to form a pattern; and (b) after (a), heating the substrate and exposing the substrate to plasma in a post-processing bake process, wherein the post-processing bake process of (b) is a post-development bake process that occurs after exposing the layer of photoresist to the EUV and at least a portion of the layer of photoresist is removed by the development chemistry to form the pattern, wherein the post-development bake process of (b), the substrate is baked at a temperature between about 160-250° C. for a duration between about 1-10 minutes, and wherein heating the substrate in the post-development bake process and exposing the substrate to plasma reduces the concentration of the metal on the backside of the substrate by at least an order of magnitude.

* * * * *